(12) United States Patent
Zhang et al.

(10) Patent No.: US 7,959,769 B2
(45) Date of Patent: Jun. 14, 2011

(54) DEPOSITION OF LICOO$_2$

(75) Inventors: Hongmei Zhang, San Jose, CA (US); Richard E. Demaray, Portola Valley, CA (US); Bernd J. Neudecker, Littleton, CO (US)

(73) Assignee: Infinite Power Solutions, Inc., Littleton, CO (US)

( * ) Notice: Subject to any disclaimer, the term of this patent is extended or adjusted under 35 U.S.C. 154(b) by 947 days.

(21) Appl. No.: 11/557,383

(22) Filed: Nov. 7, 2006

(65) Prior Publication Data

US 2007/0125638 A1    Jun. 7, 2007

Related U.S. Application Data

(63) Continuation of application No. 11/297,057, filed on Dec. 7, 2005.

(60) Provisional application No. 60/651,363, filed on Feb. 8, 2005, provisional application No. 60/634,818, filed on Dec. 8, 2004.

(51) Int. Cl.
*C23C 14/34* (2006.01)

(52) U.S. Cl. .......... 204/192.15; 204/192.12; 204/192.22

(58) Field of Classification Search ............. 204/192.12, 204/192.15, 192.22
See application file for complete search history.

(56) References Cited

U.S. PATENT DOCUMENTS

| | | | |
|---|---|---|---|
| 712,316 A | 10/1902 | Loppe et al. |
| 2,970,180 A | 1/1961 | Urry |
| 3,309,302 A | 3/1967 | Heil |
| 3,616,403 A | 10/1971 | Collins et al. |
| 3,790,432 A | 2/1974 | Fletcher et al. |
| 3,797,091 A | 3/1974 | Gavin |
| 3,850,604 A | 11/1974 | Klein |
| 3,939,008 A | 2/1976 | Longo et al. |
| 4,006,070 A | 2/1977 | King et al. |
| 4,082,569 A | 4/1978 | Evans, Jr. |
| 4,099,091 A | 7/1978 | Yamazoe et al. |
| 4,111,523 A | 9/1978 | Kaminow et al. |
| 4,127,424 A | 11/1978 | Ullery, Jr. |
| 4,226,924 A | 10/1980 | Kimura et al. |

(Continued)

FOREIGN PATENT DOCUMENTS

CN    1415124    4/2003

(Continued)

OTHER PUBLICATIONS

International Search Report issued Feb. 14, 2008 in International Application No. PCT/US06/46370.

(Continued)

*Primary Examiner* — Rodney G McDonald
(74) *Attorney, Agent, or Firm* — Dewey & LeBoeuf LLP; Jeff E. Schwartz

(57) ABSTRACT

In accordance with the present invention, deposition of LiCoO$_2$ layers in a pulsed-dc physical vapor deposition process is presented. Such a deposition can provide a low-temperature, high deposition rate deposition of a crystalline layer of LiCoO$_2$ with a desired (101) or (003) orientation. Some embodiments of the deposition addresses the need for high rate deposition of LiCoO$_2$ films, which can be utilized as the cathode layer in a solid state rechargeable Li battery. Embodiments of the process according to the present invention can eliminate the high temperature (>700° C.) anneal step that is conventionally needed to crystallize the LiCoO$_2$ layer. Some embodiments of the process can improve a battery utilizing the LiCoO$_2$ layer by utilizing a rapid thermal anneal process with short ramp rates.

32 Claims, 27 Drawing Sheets

U.S. PATENT DOCUMENTS

| | | |
|---|---|---|
| 4,283,216 A | 8/1981 | Brereton |
| 4,318,938 A | 3/1982 | Barnett et al. |
| 4,437,966 A | 3/1984 | Hope et al. |
| 4,442,144 A | 4/1984 | Pipkin |
| 4,481,265 A | 11/1984 | Ezawa et al. |
| 4,518,661 A | 5/1985 | Rippere |
| 4,555,456 A | 11/1985 | Kanehori et al. |
| 4,572,873 A | 2/1986 | Kanehori et al. |
| 4,587,225 A | 5/1986 | Tsukuma et al. |
| 4,619,680 A | 10/1986 | Nourshargh et al. |
| 4,645,726 A | 2/1987 | Hiratani et al. |
| 4,664,993 A | 5/1987 | Sturgis et al. |
| 4,668,593 A | 5/1987 | Sammells |
| RE32,449 E | 6/1987 | Claussen |
| 4,672,586 A | 6/1987 | Shimohigashi et al. |
| 4,710,940 A | 12/1987 | Sipes, Jr. |
| 4,728,588 A | 3/1988 | Noding et al. |
| 4,740,431 A | 4/1988 | Little |
| 4,756,717 A | 7/1988 | Sturgis et al. |
| 4,785,459 A | 11/1988 | Baer |
| 4,826,743 A | 5/1989 | Nazri |
| 4,865,428 A | 9/1989 | Corrigan |
| 4,878,094 A | 10/1989 | Balkanski |
| 4,903,326 A | 2/1990 | Zakman et al. |
| 4,915,810 A | 4/1990 | Kestigian et al. |
| 4,964,877 A | 10/1990 | Keister et al. |
| 4,977,007 A | 12/1990 | Kondo et al. |
| 4,978,437 A | 12/1990 | Wirz |
| 5,006,737 A | 4/1991 | Fay |
| 5,019,467 A | 5/1991 | Fujiwara |
| 5,030,331 A | 7/1991 | Sato |
| 5,035,965 A | 7/1991 | Sangyoji et al. |
| 5,055,704 A | 10/1991 | Link et al. |
| 5,057,385 A | 10/1991 | Hope et al. |
| 5,085,904 A | 2/1992 | Deak et al. |
| 5,096,852 A | 3/1992 | Hobson |
| 5,100,821 A | 3/1992 | Fay |
| 5,107,538 A | 4/1992 | Benton et al. |
| 5,110,694 A | 5/1992 | Nagasubramanian et al. |
| 5,110,696 A | 5/1992 | Shokoohi et al. |
| 5,119,269 A | 6/1992 | Nakayama |
| 5,119,460 A | 6/1992 | Bruce et al. |
| 5,124,782 A | 6/1992 | Hundt et al. |
| 5,147,985 A | 9/1992 | DuBrucq |
| 5,153,710 A | 10/1992 | McCain |
| 5,169,408 A | 12/1992 | Biggerstaff et al. |
| 5,171,413 A | 12/1992 | Arntz et al. |
| 5,173,271 A | 12/1992 | Chen et al. |
| 5,174,876 A | 12/1992 | Buchal et al. |
| 5,180,645 A | 1/1993 | Moré |
| 5,187,564 A | 2/1993 | McCain |
| 5,196,041 A | 3/1993 | Tumminelli et al. |
| 5,196,374 A | 3/1993 | Hundt et al. |
| 5,200,029 A | 4/1993 | Bruce et al. |
| 5,202,201 A | 4/1993 | Meunier et al. |
| 5,206,925 A | 4/1993 | Nakazawa et al. |
| 5,208,121 A | 5/1993 | Yahnke et al. |
| 5,217,828 A | 6/1993 | Sangyoji et al. |
| 5,221,891 A | 6/1993 | Janda et al. |
| 5,225,288 A | 7/1993 | Beeson et al. |
| 5,227,264 A | 7/1993 | Duval et al. |
| 5,237,439 A | 8/1993 | Misono et al. |
| 5,252,194 A | 10/1993 | Demaray et al. |
| 5,273,608 A | 12/1993 | Nath |
| 5,287,427 A | 2/1994 | Atkins et al. |
| 5,296,089 A | 3/1994 | Chen et al. |
| 5,300,461 A | 4/1994 | Ting |
| 5,303,319 A | 4/1994 | Ford et al. |
| 5,306,569 A | 4/1994 | Hiraki |
| 5,307,240 A | 4/1994 | McMahon |
| 5,309,302 A | 5/1994 | Vollmann |
| 5,314,765 A | 5/1994 | Bates |
| 5,326,652 A | 7/1994 | Lake |
| 5,326,653 A | 7/1994 | Chang |
| 5,338,624 A | 8/1994 | Gruenstern et al. |
| 5,338,625 A | 8/1994 | Bates et al. |
| 5,342,709 A | 8/1994 | Yahnke et al. |
| 5,355,089 A | 10/1994 | Treger |
| 5,360,686 A | 11/1994 | Peled et al. |
| 5,362,579 A | 11/1994 | Rossoll et al. |
| 5,362,672 A | 11/1994 | Ohmi et al. |
| 5,381,262 A | 1/1995 | Arima et al. |
| 5,387,482 A | 2/1995 | Anani |
| 5,401,595 A | 3/1995 | Kagawa et al. |
| 5,403,680 A | 4/1995 | Otagawa et al. |
| 5,411,537 A | 5/1995 | Munshi et al. |
| 5,411,592 A | 5/1995 | Ovshinsky et al. |
| 5,419,982 A | 5/1995 | Tura et al. |
| 5,427,669 A | 6/1995 | Drummond |
| 5,435,826 A | 7/1995 | Sakakibara et al. |
| 5,437,692 A | 8/1995 | Dasgupta et al. |
| 5,445,856 A | 8/1995 | Chaloner-Gill |
| 5,445,906 A | 8/1995 | Hobson et al. |
| 5,448,110 A | 9/1995 | Tuttle et al. |
| 5,449,576 A | 9/1995 | Anani |
| 5,455,126 A | 10/1995 | Bates et al. |
| 5,457,569 A | 10/1995 | Liou et al. |
| 5,458,995 A | 10/1995 | Behl et al. |
| 5,464,706 A | 11/1995 | Dasgupta et al. |
| 5,470,396 A | 11/1995 | Mongon et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,493,177 A | 2/1996 | Muller et al. |
| 5,498,489 A | 3/1996 | Dasgupta et al. |
| 5,499,207 A | 3/1996 | Miki et al. |
| 5,501,918 A | 3/1996 | Gruenstern et al. |
| 5,504,041 A | 4/1996 | Summerfelt |
| 5,507,930 A | 4/1996 | Yamashita et al. |
| 5,512,147 A | 4/1996 | Bates et al. |
| 5,512,387 A | 4/1996 | Ovshinsky |
| 5,512,389 A | 4/1996 | Dasgupta et al. |
| 5,538,796 A | 7/1996 | Schaffer et al. |
| 5,540,742 A | 7/1996 | Sangyoji et al. |
| 5,547,780 A | 8/1996 | Kagawa et al. |
| 5,547,782 A | 8/1996 | Dasgupta et al. |
| 5,552,242 A | 9/1996 | Ovshinsky et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,567,210 A | 10/1996 | Bates et al. |
| 5,569,520 A | 10/1996 | Bates |
| 5,582,935 A | 12/1996 | Dasgupta et al. |
| 5,591,520 A | 1/1997 | Migliorini et al. |
| 5,597,660 A | 1/1997 | Bates et al. |
| 5,597,661 A | 1/1997 | Takeuchi et al. |
| 5,599,355 A | 2/1997 | Nagasubramanian et al. |
| 5,601,952 A | 2/1997 | Dasgupta et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates et al. |
| 5,612,153 A | 3/1997 | Moulton et al. |
| 5,613,995 A | 3/1997 | Bhandarkar et al. |
| 5,616,933 A | 4/1997 | Li |
| 5,637,418 A | 6/1997 | Brown et al. |
| 5,643,480 A | 7/1997 | Gustavsson et al. |
| 5,644,207 A | 7/1997 | Lew et al. |
| 5,645,626 A | 7/1997 | Edlund et al. |
| 5,645,960 A | 7/1997 | Scrosati et al. |
| 5,654,054 A | 8/1997 | Tropsha et al. |
| 5,654,984 A | 8/1997 | Hershbarger et al. |
| 5,658,652 A | 8/1997 | Sellergren |
| 5,660,700 A * | 8/1997 | Shimizu et al. .......... 204/298.08 |
| 5,665,490 A | 9/1997 | Takeuchi et al. |
| 5,667,538 A | 9/1997 | Bailey |
| 5,677,784 A | 10/1997 | Harris |
| 5,679,980 A | 10/1997 | Summerfelt |
| 5,681,666 A | 10/1997 | Treger et al. |
| 5,681,671 A | 10/1997 | Orita et al. |
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,705,293 A | 1/1998 | Hobson |

| | | | | | | |
|---|---|---|---|---|---|---|
| 5,718,813 | A | 2/1998 | Drummond | 6,051,114 A | 4/2000 | Yao et al. |
| 5,719,976 | A | 2/1998 | Henry et al. | 6,051,296 A | 4/2000 | McCaulley et al. |
| 5,721,067 | A | 2/1998 | Jacobs et al. | 6,052,397 A | 4/2000 | Jeon et al. |
| RE35,746 | E | 3/1998 | Lake | 6,057,557 A | 5/2000 | Ichikawa |
| 5,731,661 | A | 3/1998 | So et al. | 6,058,233 A | 5/2000 | Dragone |
| 5,738,731 | A | 4/1998 | Shindo et al. | 6,071,323 A | 6/2000 | Kawaguchi |
| 5,742,094 | A | 4/1998 | Ting | 6,075,973 A | 6/2000 | Greeff et al. |
| 5,755,938 | A | 5/1998 | Fukui et al. | 6,077,106 A | 6/2000 | Mish |
| 5,755,940 | A | 5/1998 | Shindo | 6,077,642 A | 6/2000 | Ogata et al. |
| 5,757,126 | A | 5/1998 | Harvey, III et al. | 6,078,791 A | 6/2000 | Tuttle et al. |
| 5,762,768 | A | 6/1998 | Goy et al. | 6,080,508 A | 6/2000 | Dasgupta et al. |
| 5,763,058 | A | 6/1998 | Isen et al. | 6,080,643 A | 6/2000 | Noguchi et al. |
| 5,771,562 | A | 6/1998 | Harvey, III et al. | 6,093,944 A | 7/2000 | VanDover |
| 5,776,278 | A | 7/1998 | Tuttle et al. | 6,094,292 A | 7/2000 | Goldner et al. |
| 5,779,839 | A | 7/1998 | Tuttle et al. | 6,096,569 A | 8/2000 | Matsuno et al. |
| 5,789,071 | A | 8/1998 | Sproul et al. | 6,100,108 A | 8/2000 | Mizuno et al. |
| 5,790,489 | A | 8/1998 | O'Connor | 6,106,933 A | 8/2000 | Nagai et al. |
| 5,792,550 | A | 8/1998 | Phillips et al. | 6,110,531 A | 8/2000 | Paz De Araujo |
| 5,805,223 | A | 9/1998 | Shikakura et al. | 6,115,616 A | 9/2000 | Halperin et al. |
| 5,811,177 | A | 9/1998 | Shi et al. | 6,117,279 A | 9/2000 | Smolanoff et al. |
| 5,814,195 | A | 9/1998 | Lehan et al. | 6,118,426 A | 9/2000 | Albert et al. |
| 5,830,330 | A | 11/1998 | Lantsman | 6,120,890 A | 9/2000 | Chen et al. |
| 5,831,262 | A | 11/1998 | Greywall et al. | 6,129,277 A | 10/2000 | Grant et al. |
| 5,834,137 | A | 11/1998 | Zhang et al. | 6,133,670 A | 10/2000 | Rodgers et al. |
| 5,841,931 | A | 11/1998 | Foresi et al. | 6,137,671 A | 10/2000 | Staffiere |
| 5,842,118 | A | 11/1998 | Wood, Jr. | 6,144,916 A | 11/2000 | Wood, Jr. et al. |
| 5,845,990 | A | 12/1998 | Hymer | 6,146,225 A | 11/2000 | Sheats et al. |
| 5,847,865 | A | 12/1998 | Gopinath et al. | 6,148,503 A | 11/2000 | Delnick et al. |
| 5,849,163 | A | 12/1998 | Ichikawa et al. | 6,157,765 A | 12/2000 | Bruce et al. |
| 5,851,896 | A | 12/1998 | Summerfelt | 6,159,635 A | 12/2000 | Dasgupta et al. |
| 5,853,830 | A | 12/1998 | McCaulley et al. | 6,160,373 A | 12/2000 | Dunn et al. |
| 5,855,744 | A | 1/1999 | Halsey et al. | 6,162,709 A | 12/2000 | Raoux et al. |
| 5,856,705 | A | 1/1999 | Ting | 6,165,566 A | 12/2000 | Tropsha |
| 5,864,182 | A | 1/1999 | Matsuzaki | 6,168,884 B1 | 1/2001 | Neudecker et al. |
| 5,865,860 | A | 2/1999 | Delnick | 6,169,474 B1 | 1/2001 | Greeff et al. |
| 5,870,273 | A | 2/1999 | Sogabe et al. | 6,175,075 B1 | 1/2001 | Shiotsuka et al. |
| 5,874,184 | A | 2/1999 | Takeuchi et al. | 6,176,986 B1 | 1/2001 | Watanabe et al. |
| 5,882,721 | A | 3/1999 | Delnick | 6,181,283 B1 | 1/2001 | Johnson et al. |
| 5,882,946 | A | 3/1999 | Otani | 6,192,222 B1 | 2/2001 | Greeff et al. |
| 5,889,383 | A | 3/1999 | Teich | 6,197,167 B1 | 3/2001 | Tanaka |
| 5,895,731 | A | 4/1999 | Clingempeel | 6,198,217 B1 | 3/2001 | Suzuki et al. |
| 5,897,522 | A | 4/1999 | Nitzan | 6,204,111 B1 | 3/2001 | Uemoto et al. |
| 5,900,057 | A | 5/1999 | Buchal et al. | 6,210,544 B1 | 4/2001 | Sasaki |
| 5,909,346 | A | 6/1999 | Malhotra et al. | 6,210,832 B1 | 4/2001 | Visco et al. |
| 5,916,704 | A | 6/1999 | Lewin et al. | 6,214,061 B1 | 4/2001 | Visco et al. |
| 5,923,964 | A | 7/1999 | Li | 6,214,660 B1 | 4/2001 | Uemoto et al. |
| 5,930,046 | A | 7/1999 | Solberg et al. | 6,218,049 B1 | 4/2001 | Bates et al. |
| 5,930,584 | A | 7/1999 | Sun et al. | 6,220,516 B1 | 4/2001 | Tuttle et al. |
| 5,942,089 | A | 8/1999 | Sproul et al. | 6,223,317 B1 | 4/2001 | Pax et al. |
| 5,948,215 | A | 9/1999 | Lantsman | 6,228,532 B1 | 5/2001 | Tsuji et al. |
| 5,948,464 | A | 9/1999 | Delnick | 6,229,987 B1 | 5/2001 | Greeff et al. |
| 5,948,562 | A | 9/1999 | Fulcher et al. | 6,232,242 B1 | 5/2001 | Hata et al. |
| 5,952,778 | A | 9/1999 | Haskal et al. | 6,235,432 B1 | 5/2001 | Kono et al. |
| 5,955,217 | A | 9/1999 | Lerberghe | 6,236,793 B1 | 5/2001 | Lawrence et al. |
| 5,961,672 | A | 10/1999 | Skotheim et al. | 6,242,129 B1 | 6/2001 | Johnson |
| 5,961,682 | A | 10/1999 | Lee et al. | 6,242,132 B1 | 6/2001 | Neudecker et al. |
| 5,966,491 | A | 10/1999 | DiGiovanni | 6,248,291 B1 | 6/2001 | Nakagama et al. |
| 5,970,393 | A | 10/1999 | Khorrami et al. | 6,248,481 B1 | 6/2001 | Visco et al. |
| 5,973,913 | A | 10/1999 | McEwen et al. | 6,248,640 B1 | 6/2001 | Nam |
| 5,977,582 | A | 11/1999 | Fleming et al. | 6,249,222 B1 | 6/2001 | Gehlot |
| 5,982,144 | A | 11/1999 | Johnson et al. | 6,252,564 B1 | 6/2001 | Albert et al. |
| 5,985,485 | A | 11/1999 | Ovshinsky et al. | 6,258,252 B1 | 7/2001 | Miyasaka et al. |
| 6,000,603 | A | 12/1999 | Koskenmaki et al. | 6,261,917 B1 | 7/2001 | Quek et al. |
| 6,001,224 | A | 12/1999 | Drummond et al. | 6,264,709 B1 | 7/2001 | Yoon et al. |
| 6,004,660 | A | 12/1999 | Topolski et al. | 6,265,652 B1 | 7/2001 | Kurata et al. |
| 6,007,945 | A | 12/1999 | Jacobs et al. | 6,268,695 B1 | 7/2001 | Affinito |
| 6,013,949 | A | 1/2000 | Tuttle | 6,271,053 B1 | 8/2001 | Kondo |
| 6,019,284 | A | 2/2000 | Freeman et al. | 6,271,793 B1 | 8/2001 | Brady et al. |
| 6,023,610 | A | 2/2000 | Wood, Jr. | 6,271,801 B2 | 8/2001 | Tuttle et al. |
| 6,024,844 | A | 2/2000 | Drummond et al. | 6,280,585 B1 | 8/2001 | Obinata et al. |
| 6,025,094 | A | 2/2000 | Visco et al. | 6,280,875 B1 | 8/2001 | Kwak et al. |
| 6,028,990 | A | 2/2000 | Shahani et al. | 6,281,142 B1 | 8/2001 | Basceri et al. |
| 6,030,421 | A | 2/2000 | Gauthier et al. | 6,284,406 B1 | 9/2001 | Xing et al. |
| 6,042,965 | A | 3/2000 | Nestler et al. | 6,287,986 B1 | 9/2001 | Mihara |
| 6,045,626 | A | 4/2000 | Yano et al. | 6,289,209 B1 | 9/2001 | Wood, Jr. |
| 6,045,652 | A | 4/2000 | Tuttle et al. | 6,290,821 B1 | 9/2001 | McLeod |
| 6,045,942 | A | 4/2000 | Miekka et al. | 6,290,822 B1 | 9/2001 | Fleming et al. |
| 6,046,081 | A | 4/2000 | Kuo | 6,291,098 B1 | 9/2001 | Shibuya et al. |
| 6,048,372 | A | 4/2000 | Mangahara et al. | 6,294,722 B1 | 9/2001 | Kondo et al. |

| | | | | | | |
|---|---|---|---|---|---|---|
| 6,296,949 B1 | 10/2001 | Bergstresser et al. | | 6,497,598 B2 | 12/2002 | Affinito |
| 6,296,967 B1 | 10/2001 | Jacobs et al. | | 6,500,287 B2 | 12/2002 | Azens et al. |
| 6,296,971 B1 | 10/2001 | Hara | | 6,503,661 B1 | 1/2003 | Park et al. |
| 6,300,215 B1 | 10/2001 | Shin | | 6,503,831 B2 | 1/2003 | Speakman |
| 6,302,939 B1 | 10/2001 | Rabin et al. | | 6,506,289 B2 | 1/2003 | Demaray et al. |
| 6,306,265 B1 | 10/2001 | Fu et al. | | 6,511,516 B1 | 1/2003 | Johnson et al. |
| 6,316,563 B2 | 11/2001 | Naijo et al. | | 6,511,615 B1 | 1/2003 | Dawes et al. |
| 6,323,416 B1 | 11/2001 | Komori et al. | | 6,517,968 B2 | 2/2003 | Johnson et al. |
| 6,324,211 B1 | 11/2001 | Ovard et al. | | 6,522,067 B1 | 2/2003 | Graff et al. |
| 6,325,294 B2 | 12/2001 | Tuttle et al. | | 6,524,466 B1 | 2/2003 | Bonaventura et al. |
| 6,329,213 B1 | 12/2001 | Tuttle et al. | | 6,524,750 B1 | 2/2003 | Mansuetto |
| 6,339,236 B1 | 1/2002 | Tomii et al. | | 6,525,976 B1 | 2/2003 | Johnson |
| 6,344,366 B1 | 2/2002 | Bates | | 6,528,212 B1 | 3/2003 | Kusumoto et al. |
| 6,344,419 B1 | 2/2002 | Forster et al. | | 6,533,907 B2 | 3/2003 | Demaray et al. |
| 6,344,795 B1 | 2/2002 | Gehlot | | 6,537,428 B1 | 3/2003 | Xiong et al. |
| 6,350,353 B2 | 2/2002 | Gopalraja et al. | | 6,538,211 B1 | 3/2003 | St. Lawrence et al. |
| 6,351,630 B2 | 2/2002 | Wood, Jr. | | 6,541,147 B1 | 4/2003 | McLean et al. |
| 6,356,230 B1 | 3/2002 | Greef et al. | | 6,548,912 B1 | 4/2003 | Graff et al. |
| 6,356,694 B1 | 3/2002 | Weber | | 6,551,745 B2 | 4/2003 | Moutsios et al. |
| 6,356,764 B1 | 3/2002 | Ovard et al. | | 6,558,836 B1 | 5/2003 | Whitacre et al. |
| 6,358,810 B1 | 3/2002 | Dornfest et al. | | 6,562,513 B1 | 5/2003 | Takeuchi et al. |
| 6,360,954 B1 | 3/2002 | Barnardo | | 6,563,998 B1 | 5/2003 | Farah et al. |
| 6,361,662 B1 | 3/2002 | Chiba et al. | | 6,569,564 B1 | 5/2003 | Lane |
| 6,365,300 B1 | 4/2002 | Ota et al. | | 6,570,325 B2 | 5/2003 | Graff et al. |
| 6,365,319 B1 | 4/2002 | Heath et al. | | 6,572,173 B2 | 6/2003 | Muller |
| 6,368,275 B1 | 4/2002 | Sliwa et al. | | 6,573,652 B1 | 6/2003 | Graff et al. |
| 6,369,316 B1 | 4/2002 | Plessing et al. | | 6,576,546 B2 | 6/2003 | Gilbert et al. |
| 6,372,098 B1 | 4/2002 | Newcomb et al. | | 6,579,728 B2 | 6/2003 | Grant et al. |
| 6,372,383 B1 | 4/2002 | Lee et al. | | 6,582,480 B2 | 6/2003 | Pasquier et al. |
| 6,372,386 B1 | 4/2002 | Cho et al. | | 6,582,481 B2 | 6/2003 | Erbil |
| 6,373,224 B1 | 4/2002 | Goto et al. | | 6,582,852 B1 | 6/2003 | Gao et al. |
| 6,375,780 B1 | 4/2002 | Tuttle et al. | | 6,589,299 B2 | 7/2003 | Missling et al. |
| 6,376,027 B1 | 4/2002 | Lee et al. | | 6,593,150 B2 | 7/2003 | Ramberg et al. |
| 6,379,835 B1 | 4/2002 | Kucherovsky et al. | | 6,599,662 B1 | 7/2003 | Chiang et al. |
| 6,379,842 B1 | 4/2002 | Mayer | | 6,600,905 B2 | 7/2003 | Greeff et al. |
| 6,380,477 B1 | 4/2002 | Curtin | | 6,602,338 B2 | 8/2003 | Chen et al. |
| 6,384,573 B1 | 5/2002 | Dunn | | 6,603,139 B1 | 8/2003 | Tessler et al. |
| 6,387,563 B1 | 5/2002 | Bates | | 6,603,391 B1 | 8/2003 | Greeff et al. |
| 6,391,166 B1 | 5/2002 | Wang | | 6,605,228 B1 | 8/2003 | Kawaguchi et al. |
| 6,392,565 B1 | 5/2002 | Brown | | 6,608,464 B1 | 8/2003 | Lew et al. |
| 6,394,598 B1 | 5/2002 | Kaiser | | 6,610,440 B1 | 8/2003 | LaFollette et al. |
| 6,395,430 B1 | 5/2002 | Cho et al. | | 6,615,614 B1 | 9/2003 | Makikawa et al. |
| 6,396,001 B1 | 5/2002 | Nakamura | | 6,616,035 B2 | 9/2003 | Ehrensvard et al. |
| 6,398,824 B1 | 6/2002 | Johnson | | 6,618,829 B2 | 9/2003 | Pax et al. |
| 6,399,241 B1 | 6/2002 | Hara et al. | | 6,620,545 B2 | 9/2003 | Goenka et al. |
| 6,402,039 B1 | 6/2002 | Freeman et al. | | 6,622,049 B2 | 9/2003 | Penner et al. |
| 6,402,795 B1 | 6/2002 | Chu et al. | | 6,632,563 B1 | 10/2003 | Krasnov et al. |
| 6,402,796 B1 | 6/2002 | Johnson | | 6,637,906 B2 | 10/2003 | Knoerzer et al. |
| 6,409,965 B1 | 6/2002 | Nagata et al. | | 6,637,916 B2 | 10/2003 | Mullner |
| 6,413,284 B1 | 7/2002 | Chu et al. | | 6,639,578 B1 | 10/2003 | Comiskey et al. |
| 6,413,285 B1 | 7/2002 | Chu et al. | | 6,641,704 B2 | 11/2003 | Someno |
| 6,413,382 B1 | 7/2002 | Wang et al. | | 6,645,675 B1 | 11/2003 | Munshi |
| 6,413,645 B1 | 7/2002 | Graff et al. | | 6,650,000 B2 | 11/2003 | Ballantine et al. |
| 6,413,676 B1 | 7/2002 | Munshi | | 6,650,942 B2 | 11/2003 | Howard et al. |
| 6,414,626 B1 | 7/2002 | Greef et al. | | 6,662,430 B2 | 12/2003 | Brady et al. |
| 6,416,598 B1 | 7/2002 | Sircar | | 6,664,006 B1 | 12/2003 | Munshi |
| 6,420,961 B1 | 7/2002 | Bates et al. | | 6,673,484 B2 | 1/2004 | Matsuura |
| 6,422,698 B2 | 7/2002 | Kaiser | | 6,673,716 B1 | 1/2004 | D'Couto et al. |
| 6,423,106 B1 | 7/2002 | Bates | | 6,674,159 B1 | 1/2004 | Peterson et al. |
| 6,423,776 B1 | 7/2002 | Akkapeddi et al. | | 6,677,070 B2 | 1/2004 | Kearl |
| 6,426,163 B1 | 7/2002 | Pasquier et al. | | 6,683,244 B2 | 1/2004 | Fujimori et al. |
| 6,432,577 B1 | 8/2002 | Shul et al. | | 6,683,749 B2 | 1/2004 | Daby et al. |
| 6,432,584 B1 | 8/2002 | Visco et al. | | 6,686,096 B1 | 2/2004 | Chung |
| 6,433,380 B2 | 8/2002 | Shin | | 6,693,840 B2 | 2/2004 | Shimada et al. |
| 6,433,465 B1 | 8/2002 | McKnight et al. | | 6,700,491 B2 | 3/2004 | Shafer |
| 6,436,156 B1 | 8/2002 | Wandeloski et al. | | 6,706,449 B2 | 3/2004 | Mikhaylik et al. |
| 6,437,231 B2 | 8/2002 | Kurata et al. | | 6,709,778 B2 | 3/2004 | Johnson |
| 6,444,336 B1 | 9/2002 | Jia et al. | | 6,713,216 B2 | 3/2004 | Kugai et al. |
| 6,444,355 B1 | 9/2002 | Murai et al. | | 6,713,389 B2 | 3/2004 | Speakman |
| 6,444,368 B1 | 9/2002 | Hikmet et al. | | 6,713,987 B2 | 3/2004 | Krasnov et al. |
| 6,444,750 B1 | 9/2002 | Touhsaent | | 6,723,140 B2 | 4/2004 | Chu et al. |
| 6,459,418 B1 | 10/2002 | Comiskey et al. | | 6,730,423 B2 | 5/2004 | Einhart et al. |
| 6,459,726 B1 | 10/2002 | Ovard et al. | | 6,733,924 B1 | 5/2004 | Skotheim et al. |
| 6,466,771 B2 | 10/2002 | Wood, Jr. | | 6,737,197 B2 | 5/2004 | Chu et al. |
| 6,475,668 B1 | 11/2002 | Hosokawa et al. | | 6,737,789 B2 | 5/2004 | Radziemski et al. |
| 6,481,623 B1 | 11/2002 | Grant et al. | | 6,741,178 B1 | 5/2004 | Tuttle |
| 6,488,822 B1 | 12/2002 | Moslehi | | 6,750,156 B2 | 6/2004 | Le et al. |
| 6,494,999 B1 | 12/2002 | Herrera et al. | | 6,752,842 B2 | 6/2004 | Luski et al. |
| 6,495,283 B1 | 12/2002 | Yoon et al. | | 6,753,108 B1 | 6/2004 | Hampden-Smith et al. |

| Patent Number | Date | Inventor(s) |
|---|---|---|
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jensen et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,849,165 B2 | 2/2005 | Kloppel et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jensen |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,220,517 B2 | 5/2007 | Park et al. |
| 7,230,321 B2 | 6/2007 | McCain |
| 7,247,408 B2 | 7/2007 | Skotheim et al. |
| 7,253,494 B2 | 8/2007 | Mino et al. |
| 7,262,131 B2 | 8/2007 | Narasimhan et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,345,647 B1 | 3/2008 | Rodenbeck |
| 7,348,099 B2 | 3/2008 | Mukai et al. |
| 7,378,356 B2 | 5/2008 | Zhang et al. |
| 7,381,657 B2 | 6/2008 | Zhang et al. |
| 7,389,580 B2 | 6/2008 | Jenson et al. |
| 7,400,253 B2 | 7/2008 | Cohen |
| 7,404,877 B2 | 7/2008 | Demaray et al. |
| 7,410,730 B2 | 8/2008 | Bates |
| 7,413,998 B2 | 8/2008 | Zhang et al. |
| RE40,531 E | 10/2008 | Graff et al. |
| 7,468,221 B2 | 12/2008 | LaFollette et al. |
| 7,494,742 B2 | 2/2009 | Tarnowski et al. |
| 7,544,276 B2 | 6/2009 | Zhang et al. |
| 7,670,724 B1 | 3/2010 | Chan et al. |
| 2001/0027159 A1 | 10/2001 | Kaneyoshi |
| 2001/0031122 A1 | 10/2001 | Lackritz et al. |
| 2001/0032666 A1 | 10/2001 | Jensen et al. |
| 2001/0033952 A1 | 10/2001 | Jensen et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0050223 A1 | 12/2001 | Gopalraja et al. |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jensen |
| 2002/0001747 A1 | 1/2002 | Jensen et al. |
| 2002/0004167 A1 | 1/2002 | Jensen et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0033330 A1 | 3/2002 | Demaray et al. |
| 2002/0037756 A1 | 3/2002 | Jacobs et al. |
| 2002/0066539 A1 | 6/2002 | Muller |
| 2002/0067615 A1 | 6/2002 | Muller |
| 2002/0076133 A1 | 6/2002 | Li et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0115252 A1 | 8/2002 | Haukka et al. |
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |

| | | |
|---|---|---|
| 2003/0141186 A1 | 7/2003 | Wang et al. |
| 2003/0143853 A1 | 7/2003 | Celii et al. |
| 2003/0152829 A1 | 8/2003 | Zhang et al. |
| 2003/0162094 A1 | 8/2003 | Lee et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. |
| 2003/0185266 A1 | 10/2003 | Henrichs |
| 2003/0231106 A1 | 12/2003 | Shafer |
| 2003/0232248 A1 | 12/2003 | Iwamoto et al. |
| 2003/0234835 A1 | 12/2003 | Torii et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043557 A1 | 3/2004 | Haukka et al. |
| 2004/0048157 A1 | 3/2004 | Neudecker et al. |
| 2004/0058237 A1 | 3/2004 | Higuchi et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106046 A1 | 6/2004 | Inda |
| 2004/0118700 A1 | 6/2004 | Schierle-Arndt et al. |
| 2004/0126305 A1 | 7/2004 | Chen et al. |
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0209159 A1 | 10/2004 | Lee et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |
| 2005/0110457 A1 | 5/2005 | LaFollette et al. |
| 2005/0112461 A1 | 5/2005 | Amine et al. |
| 2005/0118464 A1 | 6/2005 | Levanon |
| 2005/0130032 A1 | 6/2005 | Krasnov et al. |
| 2005/0133361 A1 | 6/2005 | Ding et al. |
| 2005/0141170 A1 | 6/2005 | Honda et al. |
| 2005/0142447 A1 | 6/2005 | Nakai et al. |
| 2005/0147877 A1 | 7/2005 | Tarnowski et al. |
| 2005/0158622 A1 | 7/2005 | Mizuta et al. |
| 2005/0175891 A1 | 8/2005 | Kameyama et al. |
| 2005/0176181 A1 | 8/2005 | Burrows et al. |
| 2005/0181280 A1 | 8/2005 | Ceder et al. |
| 2005/0183946 A1 | 8/2005 | Pan et al. |
| 2005/0189139 A1 | 9/2005 | Stole |
| 2005/0208371 A1 | 9/2005 | Kim et al. |
| 2005/0239917 A1 | 10/2005 | Nelson et al. |
| 2005/0266161 A1 | 12/2005 | Medeiros et al. |
| 2006/0019504 A1 | 1/2006 | Taussig |
| 2006/0021214 A1 | 2/2006 | Jenson et al. |
| 2006/0040177 A1 | 2/2006 | Onodera et al. |
| 2006/0046907 A1 | 3/2006 | Rastegar et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0063074 A1 | 3/2006 | Jenson et al. |
| 2006/0071592 A1 | 4/2006 | Narasimhan et al. |
| 2006/0155545 A1 | 7/2006 | Jayne |
| 2006/0201583 A1 | 9/2006 | Michaluk et al. |
| 2006/0210779 A1 | 9/2006 | Weir et al. |
| 2006/0222954 A1 | 10/2006 | Skotheim et al. |
| 2006/0234130 A1 | 10/2006 | Inda |
| 2006/0237543 A1 | 10/2006 | Goto et al. |
| 2006/0255435 A1 | 11/2006 | Fuergut et al. |
| 2006/0286448 A1 | 12/2006 | Snyder et al. |
| 2007/0009802 A1 | 1/2007 | Lee et al. |
| 2007/0023275 A1 | 2/2007 | Tanase et al. |
| 2007/0037058 A1 | 2/2007 | Visco et al. |
| 2007/0053139 A1 | 3/2007 | Zhang et al. |
| 2007/0087230 A1 | 4/2007 | Jenson et al. |
| 2007/0091543 A1 | 4/2007 | Gasse et al. |
| 2007/0141468 A1 | 6/2007 | Barker |
| 2007/0148065 A1 | 6/2007 | Weir et al. |
| 2007/0148553 A1 | 6/2007 | Weppner |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0172681 A1 | 7/2007 | Demaray et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0224951 A1 | 9/2007 | Gilb et al. |
| 2007/0264564 A1 | 11/2007 | Johnson et al. |
| 2007/0278653 A1 | 12/2007 | Brunnbauer et al. |
| 2007/0298326 A1 | 12/2007 | Angell et al. |
| 2008/0003496 A1 | 1/2008 | Neudecker et al. |
| 2008/0008936 A1 | 1/2008 | Mizuta et al. |
| 2008/0014501 A1 | 1/2008 | Skotheim et al. |
| 2008/0057397 A1 | 3/2008 | Skotheim et al. |
| 2008/0213672 A1 | 9/2008 | Skotheim et al. |
| 2008/0233708 A1 | 9/2008 | Hisamatsu |
| 2008/0254575 A1 | 10/2008 | Fuergut et al. |
| 2008/0261107 A1 | 10/2008 | Snyder et al. |
| 2008/0286651 A1 | 11/2008 | Neudecker et al. |
| 2009/0181303 A1 | 7/2009 | Neudecker et al. |
| 2010/0032001 A1 | 2/2010 | Brantner |
| 2010/0086853 A1 | 4/2010 | Venkatachalam et al. |

FOREIGN PATENT DOCUMENTS

| | | |
|---|---|---|
| CN | 1532984 | 9/2004 |
| DE | 10 2005 014 427 | 9/2006 |
| DE | 10 2006 054 309 | 11/2006 |
| DE | 10 2008 016 665 | 10/2008 |
| DE | 102007030604 | 1/2009 |
| EP | 0 510 883 A2 | 10/1992 |
| EP | 0 639 655 A1 | 2/1995 |
| EP | 0 652 308 A2 | 5/1995 |
| EP | 0 820 088 A2 | 1/1998 |
| EP | 1 068 899 A1 | 1/2001 |
| EP | 0 0867 985 B1 | 2/2001 |
| EP | 1 092 689 A1 | 4/2001 |
| EP | 1 189 080 A2 | 3/2002 |
| EP | 1 713 024 | 10/2006 |
| FR | 2 861 218 | 4/2005 |
| JP | 55-009305 | 1/1980 |
| JP | 56-156675 | 12/1981 |
| JP | 60-068558 | 4/1985 |
| JP | 61-60803 | 3/1986 |
| JP | 62-267944 | 11/1987 |
| JP | 62-287071 | 12/1987 |
| JP | 2-054764 A2 | 2/1990 |
| JP | 2-230662 | 9/1990 |
| JP | 4-058456 | 2/1992 |
| JP | 4-072049 | 3/1992 |
| JP | 6-010127 A | 1/1994 |
| JP | 6-100333 A | 4/1994 |
| JP | 7-233469 A | 5/1995 |
| JP | 7-224379 A | 8/1995 |
| JP | 9249962 | 9/1997 |
| JP | 11-204088 | 7/1999 |
| JP | 2000-144435 | 5/2000 |
| JP | 2000-188099 | 7/2000 |
| JP | 2000-268867 | 9/2000 |

| | | |
|---|---|---|
| JP | 2001-259494 | 9/2001 |
| JP | 2001-297764 | 10/2001 |
| JP | 2001-328198 | 11/2001 |
| JP | 2002-344115 | 11/2002 |
| JP | 2003-17040 | 1/2003 |
| JP | 2003-347045 | 12/2003 |
| JP | 2004-071305 | 3/2004 |
| JP | 2004-149849 | 5/2004 |
| JP | 2004-158268 | 6/2004 |
| JP | 2004-273436 | 9/2004 |
| JP | 2005-256101 | 9/2005 |
| KR | 20020007881 | 1/2002 |
| KR | 20020017790 | 3/2002 |
| KR | 20020029813 | 4/2002 |
| KR | 20020038917 | 5/2002 |
| KR | 20030033913 | 5/2003 |
| KR | 20030042288 | 5/2003 |
| KR | 20030085252 | 11/2003 |
| RU | 2241281 | 11/2004 |
| WO | WO 9513629 | 5/1995 |
| WO | WO 9623085 A1 | 8/1996 |
| WO | WO 9623217 | 8/1996 |
| WO | WO 97027344 | 7/1997 |
| WO | WO 9735044 A1 | 9/1997 |
| WO | WO 9847196 | 10/1998 |
| WO | WO 9943034 | 8/1999 |
| WO | WO 9957770 | 11/1999 |
| WO | WO 0021898 A1 | 4/2000 |
| WO | WO 0022742 A2 | 4/2000 |
| WO | WO 0028607 | 5/2000 |
| WO | WO 0036665 A1 | 6/2000 |
| WO | WO 0060682 | 10/2000 |
| WO | WO 0060689 | 10/2000 |
| WO | WO 0062365 | 10/2000 |
| WO | WO 0101507 | 1/2001 |
| WO | WO 0117052 | 3/2001 |
| WO | WO 0124303 | 4/2001 |
| WO | WO 0133651 | 5/2001 |
| WO | WO 0139305 | 5/2001 |
| WO | WO 0173864 | 10/2001 |
| WO | WO 0173865 | 10/2001 |
| WO | WO 0173866 | 10/2001 |
| WO | WO 0173868 | 10/2001 |
| WO | WO 0173870 | 10/2001 |
| WO | WO 0173883 | 10/2001 |
| WO | WO 0173957 | 10/2001 |
| WO | WO 01/86731 | 11/2001 |
| WO | WO 0182390 | 11/2001 |
| WO | WO 0212932 A2 | 2/2002 |
| WO | WO 0242516 | 5/2002 |
| WO | WO 0247187 | 6/2002 |
| WO | WO 02071506 | 9/2002 |
| WO | WO 02101857 | 12/2002 |
| WO | WO 03003485 | 1/2003 |
| WO | WO 03005477 | 1/2003 |
| WO | WO 03026039 | 3/2003 |
| WO | WO 03036670 | 5/2003 |
| WO | WO 03069714 | 8/2003 |
| WO | WO 03080325 | 10/2003 |
| WO | WO 03083166 | 10/2003 |
| WO | WO 2004012283 | 2/2004 |
| WO | WO 2004021532 A1 | 3/2004 |
| WO | WO 2004061887 | 7/2004 |
| WO | WO 2004077519 A2 | 9/2004 |
| WO | WO 2004086550 | 10/2004 |
| WO | WO 2004106581 A2 | 12/2004 |
| WO | WO 2004106582 A2 | 12/2004 |
| WO | WO 2005008828 | 1/2005 |
| WO | WO 2005013394 | 2/2005 |
| WO | WO 2005038957 | 4/2005 |
| WO | WO 2005067645 | 7/2005 |
| WO | WO 2005085138 | 9/2005 |
| WO | WO 2005091405 | 9/2005 |
| WO | WO 2006063308 A2 | 6/2006 |
| WO | WO 2006/138362 | 12/2006 |
| WO | WO 2007016781 | 2/2007 |
| WO | WO 2007027535 | 3/2007 |
| WO | WO 2007095604 | 8/2007 |
| WO | WO 2008036731 | 3/2008 |

OTHER PUBLICATIONS

EPO Extended Search Report dated Feb. 11, 2008, for EP Application No. 07120523.1.

EPO Extended Search Report dated Feb. 26, 2008, for EP Application No. 05853649.1.

Bates et al., "Thin-Film Lithium Batteries" in New Trends in Electrochemical Technology: Energy Storage Systems for Electronics (T. Osaka & M. Datta eds. Gordon and Breach 2000).

Wang, B. et al., "Characterization of Thin-Film Rechargeable Lithium Batteries with Lithium Cobalt Oxide Cathodes," J. Electrochem. Soc. 143:3203-13 (1996).

Hwang et al, "Characterisation of Sputter-Deposited LiMnO4 Thin Films for Rechargeable Microbatteries," J. Electrochem Soc. 141(12): 3296-3299 (1994).

International Search Report issued on Feb. 11, 2008 in corresponding European Application No. 071205232.1.

Abraham, K.M. et al., "Inorganic-organic composite solid polymer electrolytes," 147(4) J. Electrochem. Soc. 1251-56 (2000).

Abrahams, I., "$Li_6Zr_2O_7$, a new anion vacancy ccp based structure, determined by ab initio powder diffraction methods," 104 J. Solid State Chem. 397-403 (1993).

Amatucci, G. et al., "Lithium scandium phosphate-based electrolytes for solid state lithium rechargeable microbatteries," 60 Solid State Ionics 357-65 (1993).

Appetecchi, G.B. et al., "Composite polymer electrolytes with improved lithium metal electrode interfacial properties," 145(12) J. Electrochem. Soc. 4126-32 (1998).

Bates, J.B. et al., "Electrical properties of amorphous lithium electrolyte thin films," 53-56 Solid State Ionics 647-54 (1992).

Delmas, C. et al., "Des conducteurs ioniques pseudo-bidimensionnels $Li_8MO_6$ (M=Zr, Sn), $Li_7LO_6$ (L=Nb, Ta) et $Li_6In_2O_6$," 14 Mat. Res. Bull. 619-25 (1979).

Hu, Y-W. et al., "Ionic conductivity of lithium phosphate-doped lithium orthosilicate," 11 Mat. Res. Bull. 1227-30 (1976).

Neudecker, B. et al., "$Li_9SiAlO_8$: a lithium ion electrolyte for voltages above 5.4 V," 143(7) J. Electrochem. Soc. 2198-203 (1996).

Ohno, H. et al., "Electrical conductivity of a sintered pellet of octalithium zirconate," 132 J. Nucl. Mat. 222-30 (1985).

Scholder, V. et al., "Über Zirkonate, Hafnate und Thorate von Barium, Strontium, Lithium und Natrium," Zeitschrift für Anorganische und Allgemeine Chemie, Band 362, pp. 149-168 (1968).

Yu, X. et al., "A stable thin-film lithium electrolyte: lithium phosphorus oxynitride," 144(2) J. Electrochem. Soc. 524-532 (1997).

Sarro, P., "Silicon Carbide as a New MEMS Technology," Sensors and Actuators 82, 210-218 (2000).

Final Office Action dated Apr. 27, 2010, in U.S. Appl. No. 11/191,643.

Amendment with RCE filed Jul. 26, 2010, in U.S. Appl. No. 11/191,643.

Office Action and IPO Search Report dated May 31, 2010, in U.S. Appl. No. 93/114,493.

Response to Office Action filed Aug. 30, 2010, in U.S. Appl. No. 93/114,493.

Amendment and Response to Office Action filed Jun. 2, 2010, in U.S. Appl. No. 11/726,972.

Final Office Action mailed Aug. 26, 2010, in U.S. Appl. No. 11/726,972.

Amendment After Final filed Jul. 9, 2010, in U.S. Appl. No. 10/850,968.

Advisory Action mailed Jul. 29, 2010, in U.S. Appl. No. 10/850,968.

Supplemental Amendment After Final filed Aug. 23, 2010, in U.S. Appl. No. 10/850,968.

Office Action and IPO Search Report dated Aug. 10, 2010, in TW Appl. No. 93114518.

Response to Third Office Action filed Apr. 9, 2010, in Appl. No. 200580042305.8.

Office Action dated Apr. 22, 2010, in Korean Appl. No. 10-2007-7014536.

Response to Office Action filed Aug. 23, 2010, in Korean Appl. No. 10-2007-7014536.

Statement of Reasons for Re-Examination filed Jun. 29, 2010, in U.S. Appl. No. 94/143,175.
Notice of Allowance mailed Jul. 22, 2010, in U.S. Appl. No. 11/218,652.
Final Examination Report dated Mar. 25, 2010, in SG Appl. No. 200801749-3.
Certificate of Grant of Patent dated Aug. 31, 2010, in SG Appl. No. 200801749-3.
Lee et al., "Optimizing indium tin oxide thin films with bipolar d.c.-pulsed magnetron sputtering for electrochromic device applications", J. Mater. Sci: Mat in Elec. 13:751-756 (2002).
Mientus et al., "Reactive magnetron sputtering of tin-doped indium oxide (ITO): influence of argon pressure and plasma excitation mode", Surface and Coatings Tech. 142-144:748-754 (2001).
Response to Office Action dated Nov. 21, 2007, in U.S. Appl. No. 10/291,179.
Notice of Allowance dated Mar. 4, 2008, in U.S. Appl. No. 10/291,179.
Response to Final Office Action filed Oct. 2, 2007, in U.S. Appl. No. 10/101,863.
Office Action dated Nov. 15, 2007, in U.S. Appl. No. 10/101,863.
Response to Office Action dated Dec. 18, 2007, in U.S. Appl. No. 10/101,863.
Notice of Allowance dated Jan. 25, 2008, in U.S. Appl. No. 10/101,863.
Final Office Action dated Jul. 24, 2007, in U.S. Appl. No. 10/954,182.
Amendment/RCE filed Oct. 24, 2007, in U.S. Appl. No. 10/954,182.
Office Action dated Nov. 15, 2007, in U.S. Appl. No. 10/954,182.
Response to Office Action dated Dec. 18, 2007, in U.S. Appl. No. 10/954,182.
Notice of Allowance dated Feb. 1, 2008, in U.S. Appl. No. 10/954,182.
Office Action dated May 29, 2008, in U.S. Appl. No. 11/228,834.
Response to Office Action filed Sep. 29, 2008, in U.S. Appl. No. 11/228,834.
Notice of Allowance dated Dec. 30, 2008, in U.S. Appl. No. 11/228,834.
Supplemental Notice of Allowance dated Apr. 23, 2009, in U.S. Appl. No. 11/228,834.
Preliminary Amendment dated Mar. 11, 2008, in U.S. Appl. No. 11/228,717.
Notice of Allowance dated Apr. 2, 2008, in U.S. Appl. No. 11/228,717.
Supplemental Notice of Allowance dated Jul. 17, 2008, in U.S. Appl. No. 11/228,717.
Office Action dated Mar. 30, 2009, in U.S. Appl. No. 11/191,643.
Amendment and Response to Office Action filed Sep. 30, 2009, in U.S. Appl. No. 11/191,643.
Notice of Non-Compliant Amendment mailed Nov. 9, 2009, in U.S. Appl. No. 11/191,643.
Response to Notice of Non-Compliant Amendment filed Dec. 9, 2009, in U.S. Appl. No. 11/191,643.
Notice of Non-Compliant Amendment mailed Jan. 25, 2010, in U.S. Appl. No. 11/191,643.
Response to Notice of Non-Compliant Amendment filed Feb. 24, 2010, in U.S. Appl. No. 11/191,643.
Supplemental Notice of Allowance dated Jul. 5, 2007, in U.S. Appl. No. 11/228,805.
First Office Action dated Jul. 25, 2008, from the State Intellectual Property Office of People's Republic of China in Appl. No. 200480005515.5.
Response to First Office Action filed Feb. 9, 2009 with the State Intellectual Property Office of People's Republic of China in Appl. No. 200480005515.5.
Decision for Allowance for Registration dated Feb. 1, 2007, in Application No. 10-2005-7016055.
Certificate of Grant of Patent dated Sep. 28, 2007, in Application No. 200505388-9.
International Preliminary Report on Patentability dated Sep. 15, 2005, in PCT/US2004/005531.
Office Action mailed Mar. 2, 2010, in U.S. Appl. No. 11/726,972.

First Office Action dated Dec. 5, 2008, from the State Intellectual Property Office of People's Republic of China in Appl. No. 200480021078.6.
Response to first Office Action filed Jun. 18, 2009, with the State Intellectual Property Office of P.R.C., in Appl. No. CN200480021078.6.
Second Office Action dated Aug. 14, 2009, from the State Intellectual Property Office of P.R.C., in Appl. No. CN200480021078.6.
Response to second Office Action filed Dec. 29, 2009, with the State Intellectual Property Office of People's Republic of China in Appl. No. 200480021078.6.
Rejection Decision mailed Feb. 5, 2010, from the State Intellectual Property Office of P.R.C., in Appl. No. 200480021078.6.
Office Action dated Feb. 15, 2008, in U.S. Appl. No. 10/850,968.
Response to Office Action filed Jun. 16, 2008, in U.S. Appl. No. 10/850,968.
Supplemental Amendment filed Jun. 27, 2008, in U.S. Appl. No. 10/850,968.
Final Office Action dated Oct. 15, 2008, in U.S. Appl. No. 10/850,968.
Supplemental Final Office Action dated Dec. 5, 2008, in U.S. Appl. No. 10/850,968.
Amendment After Final filed Apr. 15, 2009, in U.S. Appl. No. 10/850,968.
Office Action mailed Apr. 30, 2009, in U.S. Appl. No. 10/850,968.
Amendment in Response to Office Action filed Oct. 28, 2009, in U.S. Appl. No. 10/850,968.
Final Office Action mailed Feb. 26, 2010, in U.S. Appl. No. 10/850,968.
Supplemental Final Office Action mailed Apr. 21, 2010, in U.S. Appl. No. 10/850,968.
First Office Action dated Jun. 27, 2008 from the State Intellectual Property Office of People's Republic of China in Appl. No. 200480020874.8.
Response to First Office Action filed Jan. 12, 2009, with the State Intellectual Property Office of People's Republic of China in Appl. No. 200480020874.8.
Second Office Action dated Aug. 14, 2009, from the State Intellectual Property Office of P.R.C. in Appl. No. 200480020874.8.
Response to second Office Action filed Dec. 29, 2009, with the State Intellectual Property Office of People's Republic of China in Appl. No. 200480020874.8.
First Office Action dated Jul. 18, 2008 from the State Intellectual property Office of People's Republic of China in Appl. No. 200580042305.8.
Response to First Office Action filed Feb. 2, 2009, with the State Intellectual Property Office of People's Republic of China in Appl. No. 200580042305.8>.
Second Office Action dated May 8, 2009, from the State Intellectual Property Office of People's Republic of China in Appl. No. 200580042305.8.
Response to Second Office Action filed Sep. 22, 2009, with the State Intellectual Property Office of P.R.C. in Appl. No. 200580042305.8.
Third Office Action dated Jan. 29, 2010, from the State Intellectual Property Office of People's Republic of China in Appl. No. 200580042305.8.
Examination Report dated Jul. 24, 2008, for EP Application No. 05853649.1.
Response to Examination Report filed Feb. 3, 2009, for EP Application No. 05853649.1.
Communication Under Rule 71(3) EPC—Intent to Grant dated May 27, 2009, in EP Appl. No. 05853649.1.
Office Action dated Nov. 5, 2008 from the Intellectual Property Office (IPO) in U.S. Appl. No. 94/143,175.
Response to Office Action filed May 5, 2009, with the Intellectual Property Office (IPO) in U.S. Appl. No. 94/143,175.
Written Primary Decision of Rejection dated Jan. 6, 2010, from the Intellectual Property Office (IPO) in U.S. Appl. No. 94/143,175.
International Preliminary Report on Patentability dated Jun. 21, 2007, in PCT/US05/044781.
Office Action dated Feb. 26, 2008, in U.S. Appl. No. 11/218,652.
Response to Office Action filed Jun. 30, 2008, in U.S. Appl. No. 11/218,652.

Final Office Action dated Oct. 30, 2008, in U.S. Appl. No. 11/218,652.
Amendment/RCE filed Apr. 30, 2009, in U.S. Appl. No. 11/218,652.
Office Action mailed Jul. 9, 2009, in U.S. Appl. No. 11/218,652.
Amendment in Response to Office Action filed Dec. 8, 2009, in U.S. Appl. No. 11/218,652.
Notice of Allowance mailed Feb. 23, 2010, in U.S. Appl. No. 11/218,652.
Written Opinion mailed Apr. 3, 2009, from the Australian Patent Office in SG Appl. No. 200801749-3.
Response to Written Opinion filed Dec. 11, 2009, with the Intellectual Property Office of Singapore, in SG Appl. No. 200801749-3.
PCT International Search Report and Written Opinion for Application No. PCT/US06/33315 mailed Feb. 28, 2008.
PCT International Preliminary Report on Patentability for Application No. PCT/US06/33315 mailed Mar. 19, 2009.
Affinito, J.D. et al., "PML/oxide/PML barrier layer performance differences arising from use of UV or electron beam polymerization of the PML layers," Thin Solid Films 308-309: 19-25 (1997).
Affinito, J.D. et al., "Polymer-oxide transparent barrier layers," Society of Vacuum Coaters, 39$^{th}$ Ann. Technical Conference Proceedings, May 5-10, 1996, Philadelphia, PA, 392-397 (1996).
Alder, T. et al., "High-efficiency fiber-to-chip coupling using low-loss tapered single-mode fiber," IEEE Photonics Tech. Lett. 12(8): 1016-1018 (2000).
Almeida, V.R. et al., "Nanotaper for compact mode conversion," Optics Letters 28(15): 1302-1304 (2003).
Anh et al., "Significant Suppression of Leakage Current in (Ba,Sr)TiO$_3$ Thin Films by Ni or Mn Doping," J. Appl. Phys.,92(5): 2651-2654 (Sep. 2002).
Asghari, M. and Dawnay, E., "ASOC™—a manufacturing integrated optics technology," SPIE 3620: 252-262 (Jan. 1999).
Barbier, D. et al., "Amplifying four-wavelength combiner, based on erbium/ytterbium-doped waveguide amplifiers and integrated splitters," IEEE Photonics Tech. Lett. 9:315-317 (1997).
Barbier, D., "Performances and potential applications of erbium doped planar waveguide amplifiers and lasers," Proc. OAA, Victoria, BC, Canada, pp. 58-63 (Jul. 21-23, 1997).
Beach R.J., "Theory and optimization of lens ducts," Applied Optics 35(12): 2005-2015 (1996).
Belkind, A. et al., "Pulsed-DC Reactive Sputtering of Dielectrics: Pulsing Parameter Effects," 43$^{rd}$ Annual Technical Conference Proceedings, Apr. 15-20, 2000.
Belkind, A. et al., "Using pulsed direct current power for reactive sputtering of Al$_2$O$_3$," J. Vac. Sci. Technol. A 17(4): 1934-1940 (1999).
Bestwick, T., "ASOC™ silicon integrated optics technology," SPIE 3631: 182-190 (1999).
Borsella, E. et al., "Structural incorporation of silver in soda-lime glass by the ion-exchange process: a photoluminescence spectroscopy study," Applied Physics A 71: 125-132 (2000).
Byer, R.L., "Nonlinear optics and solid-state lasers: 2000," IEEE J. Selected Topics in Quantum Electronics 6(6): 911-930 (2000).
Campbell, S.A. et al., "Titanium dioxide (TiO2)-based gate insulators," IBM J. Res. Develop. 43(3): 383-392 (1999).
Chang, C.Y. and Sze, S.M. (eds.), in ULSI Technology, The McGraw-Hill Companies, Inc., Nyew York, Chapter 4, pp. 169-170 and 226-231 (1996).
Chen, G. et al., "Development of supported bifunctional electrocatalysts for unitized regenerative fuel cells," J. Electrochemical Society 149(8): A1092-A1099 (2002).
Choi,Y.B. et al., "Er-Al-codoped silicate planar light waveguide-type amplifier fabricated by radio-frequency sputtering," Optics Letters 25(4): 263-265 (2000).
Choy et al., "En-Doped Y2O3 Phosphor Films Produced by Electrostatic-Assisted Chemical Vapor Deposition," J. Mater. Res. 14(7): 3111-3114 (Jul. 1999).
Cocorullo, G. et al., "Amorphous silicon waveguides and light modulators for integrated photonics realized by low-temperature plasma-enhanced chemical-vapor deposition," Optics Lett. 21(24): 2002-2004 (1996).
Cooksey, K. et al., "Predicting permeability & Transmission rate for multilayer materials," Food Technology 53(9): 60-63 (1999).

Crowder, M.A. et al., "Low-temperature single-crystal Si TFT's fabricated on Si films processed via sequential lateral solidification," IEEE Electron Device Lett. 19(8): 306-308 (1998).
Delavaux, J-M. et al., "Integrated optics erbium ytterbium amplifier system in 10Gb/s fiber transmission experiment," 22$^{nd}$ European Conference on Optical Communication, Osla, I.123-I.126 (1996).
Distributed Energy Resources: Fuel Cells, Projects, 4 pages http://www.eere.energy.gov/der/fuel_cells/projects.html (2003).
Dorey, R.A., "Low temperature micromoulding of functional ceramic devices," Grant summary for GR/S84156/01 for the UK Engineering and Physical Sciences Research Council, 2 pages (2004).
DuPont Teijin Films, Mylar 200 SBL 300, Product Information, 4 pages (2000).
Electrometals Technologies Limited, Financial Report for 2002, Corporate Directory, Chairman's review, Review of Operations, 10 pages (2002).
E-Tek website: FAQ, Inside E-Tek, E-TEk News, Products; http://www.etek-inc.com/, 10 pages (2003).
Flytzanis, C. et al., "Nonlinear optics in composite materials," in Progress in Optics XXIX, Elsevier Science Publishers B.V., pp. 323-425 (1991).
Frazao, O. et al., "EDFA gain flattening using long-period fibre gratings based on the electric arc technique," Proc. London Comm. Symp. 2001, London, England, 3 pages (2001).
Fujii, M. et al., "1.54 μm photoluminescence of Er$^{3+}$ doped into SiO$_2$ films containing Si nanocrystals: evidence for energy transfer from Si nanocrystals for Er$^{3+}$," Appl. Phys. Lett. 71(9): 1198-1200 (1997).
Garcia, C. et al., "Size dependence of lifetime and absorption cross section of Si nanocrystals embedded in SiO$_2$," Appl. Phys. Left. 82(10): 1595-1597 (2003).
Goossens, A. et al., "Sensitization of TiO$_2$ with p-type semiconductor polymers," Chem. Phys. Lett. 287: 148 (1998).
Greene, J.E. et al., "Morphological and electrical properties of rf sputtered Y$_2$O$_3$-doped ZrO$_2$ thin films," J. Vac. Sci. Tech. 13(1): 72-75 (1976).
Han, H.-S. et al., "Optical gain at 1.54 μm in Erbium-doped Silicon nanocluster sensitized waveguide," Appl. Phys. Lett. 79(27): 4568-4570 (2001).
Hayakawa, T. et al., "Enhanced fluorescence from Eu$^{3+}$ owing to surface plasma oscillation of silver particles in glass," J. Non-Crystalline Solids 259: 16-22 (1999).
Hayakawa, T. et al., "Field enhancement effect of small Ag particles on the fluorescence from Eu$^{3+}$-doped SiO$_2$ glass," Appl. Phys. Lett. 74(11): 1513-1515 (1999).
Hayfield, P.C.S., I Development of a New Material-Monolithic Ti$_4$O$_7$ Ebonix® Ceramic, Royal Society of Chemistry, Cambridge, Table of Contents, 4 pages (2002).
Hehlen, M.P. et al., "Spectroscopic properties of Er$^{3+}$- and Yb$^{3+}$-doped soda-lime silicate and aluminosilicate glasses," Physical Review B 56(15): 9302-9318 (1997).
Hehlen, M.P. et al., "Uniform upconversion in high-concentration Er$^{3+}$-doped soda lime silicate and aluminosilicate glasses," Optics Letters 22(11); 772-774 (1997).
Horst, F. et al., "Compact, tunable optical devices in silicon-oxynitride waveguide technology," Top. Meeting Integrated Photonics Res. '00, Quebec, Canada, p. IThF1, 3 pages (2000).
Howson, R.P., "The reactive sputtering of oxides and nitrides," Pure & Appl. Chem. 66(6): 1311-1318 (1994).
Hubner, J. and Guldberg-Kjaer, S., "Planar Er- and Yb-doped amplifiers and lasers," COM Technical University of Denmark, 10$^{th}$ European Conf. on Integrated Optics, Session WeB2, pp. 71-74 (2001).
Hwang, M-S. et al., "The effect of pulsed magnetron sputtering on the properties of iridium tin oxide thin films," Surface and Coatings Tech. 171: 29-33 (2003).
Im, J.S. and Sposili, R.S., "Crystalline Si films for integrated active-matrix liquid crystal displays," MRS Bulletin, pp. 39-48 (1996).
Im, J.S. et al., "Controlled super-lateral growth of Si-films for microstructural manipulation and optimization," Physics Status Solidi (A) 166(2): 603-617 (1998).
Im, J.S. et al., "Single-crystal Si films for thin-film transistor devices," Appl. Physics Lett. 70(25): 3434-3436 (1997).

Itoh, M. et al., "Large reduction of singlemode-fibre coupling loss in 1.5% Δ planar lightwave circuits using spot-size converters," Electronics Letters 38(2): 72-74 (2002).

Jackson, M.K. and Movassaghi, M., "An accurate compact EFA model," Eur. Conf. Optical Comm., Munich, Germany, 2 pages (2000).

Janssen, R. et al., "Photoinduced electron transfer from conjugated polymers onto nanocrystalline $TiO_2$," Synthet. Metal, 1 page (1999).

Johnson, J.E. et al., "Monolithically integrated semiconductor optical amplifier and electroabsorption modulator with dual-waveguide spot-size converter input," IEEE J. Selected topics in Quantum Electronics 6(1): 19-25 (2000).

Jonsson, L.B. et al., "Frequency response in pulsed DC reactive sputtering processes," Thin Solid Films 365: 43-48 (2000).

Kato, K. and Inoue, Y., "Recent progress on PLC hybrid integration," SPIE 3631: 28-36 (1999).

Kato, K. and Tohmori, Y., "PLC hybrid integration technology and its application to photonic components," IEEE J. Selected Topics in Quantum Electronics 6(1): 4-13 (2000).

Kelly, P.J. and Arnell, R.D., "Control of the structure and properties of aluminum oxide coatings deposited by pulsed magnetron sputtering," J. Vac. Sci. Technol. A 17(3): 945-953 (1999).

Kelly, P.J. et al., "A novel technique for the deposition of aluminum-doped zinc oxide films," Thin Solid Films 426(1-2): 111-116 (2003).

Kelly, P.J. et al., "Reactive pulsed magnetron sputtering process for alumina films," J. Vac. Sci. Technol. A. 18(6): 2890-2896 (2000).

Kik, P.G. and Polman, A., "Gain limiting processes in Er-doped Si nanocrystal waveguides in $SiO_2$," J. Appl. Phys. 91(1): 536-536 (2002).

Kim et al., "Correlation Between the Microstructures and the Cycling Performance of $RuO_2$ Electrodes for Thin-Film Microsupercapacitros," J. Vac. Sci. Technol. B20(5): 1827-1832 (Sep. 2002).

Kim, D-W. et al. "Mixture Behavior and Microwave Dielectric Properties in the Low-fired $TiO_2$-CuO System," Jpn. J. Appl. Phys. 39:2696-2700 (2000).

Kim, H-K. et al., "Characteristics of rapid-thermal-annealed LiCoO2 cathode film for an all-solid-state thin film microbattery," J. Vac. Technol. A 22(4): 1182-1187 (2004).

Kim, J-Y. et al. "Frequency-dependent pulsed direct current magnetron sputtering of titanium oxide films," J. Vac. Sci. Technol. A 19(2):429-434 (2001).

Ladouceur, F. and Love, J.D., in: Silica-based Buried Channel Waveguides and Devices, Chapman & Hall, London, Table of Contents, 6 pages (1996).

Ladouceur, F. et al., "Effect of side wall roughness in buried channel waveguides," IEEE Proc. Optoelectron. 141(4):242-248 (1994).

Lamb, W. and Zeiler, R., Designing Non-Foil Containing Skins for Vacuum Insulation Panel (VIP) Application, Vuoto XXVIII(1-2):55-58 (1999).

Lamb, W.B., "Designing Nonfoil Containing Skins for VIP Applications," DuPont VIA Symposium Presentation, 35 Pages (1999).

Lange, M.R. et al, "High Gain Ultra-Short Length Phosphate glass Erbium-Doped Fiber Amplifier Material," OSA Optical Fiber Communications (OFC), 3 Pages (2002).

Laporta, P. et al, "Diode-pumped cw bulk Er: Yb: glass laser," Optics Letters 16(24):1952-1954 (1991).

Laurent-Lund, C. et al., "PECVD Grown Mulitple Core Planar Wageguides with Extremely Low Interface Reflections and Losses," IEEE Photonics Tech. Lett. 10(10):1431-1433 (1998).

Lee, B.H. et al., "Effects of interfacial layer growth on the electrical characteristics of thin titanium oxide films on silion," Appl. Phys. Lett. 74(21):3143-3145 (1999).

Lee, K.K. et al., "Effect of size and roughness on light transmission in a $Si/SiO_2$ waveguide: Experiments and model," Appl. Phys. Lett. 77(11):1617-1619 (2000).

Love, J.D. et al., "Quantifying Loss Minimisation in Single-Mode Fibre Tapers," Electronics Letters 22(17):912-914 (1986).

Mardare, D. and Rusu, G.I., "On the structure of Titanium Oxide Thin Films," Andalele Stiintifice Ale Universitatii IASI, Romania, pp. 201-208 (1999).

Marques, P.V.S. et al., "Planar Silica-on-Silicon Waveguide Lasers Based in Two Layers Core Devices," 10th European Conference on Integrated Optics, Session WeB2, pp. 79-82 (2001).

Meijerink, A. et al, "Luminescence of $Ag^+$ in Crystalline and Glassy $Srb_4O_7$," J. Physics Chem. Solids 54(8):901-906 (1993).

Mesnaoui, M. et al, "Spectroscopic properties of $Ag^+$ ions in phosphate glasses of $NaPO_3$-$AgPO_3$ system," Eur. J. Solid State Inorg. Chem. 29:1001-1013 (1992).

Mitomi, O. et al., "Design of a Single-Mode Tapered Waveguide for Low-Loss Chip-to-Fiber Coupling," IEEE J. Quantum Electronics 30(8): 1787-1793 (1994).

Mizuno, Y. et al "Temperature dependence of oxide decomposition on titanium surfaces in UHV," J. Vac. Sci & Tech. A. 20(5): 1716-1721 (2002).

Ohkubo, H. et al., Polarization-Insensitive Arrayed-Waveguide Grating Using Pure $SiO_2$ Cladding, Fifth Optoelectronics and Communication Conference (OECC 2000) Technical Digest, pp. 366-367 (2000).

Ohmi, S. et al., "Rare earth mental oxides for high-K fate insulator," VLSI Design 2004, 1 Page (2004).

Ohtsuki, T., et al., "Gain Characteristics of high concentration $Er^{3+}$-doped phosphate glass waveguide," J. Appl. Phys. 78(6):3617-3621 (1996).

Ono, H. et al., "Design of a Low-loss Y-branch Optical Waveguide," Fifth Optoelectronic and Communications Conference (OECC 2000) Technical Digest, pp. 502-503 (2000).

Padmini, P. et al. "Realization of High Tunability Barium Strontium Titanate Thin Films by rf Megnetron Sputtering," Appl. Phys. Lett. 75(20):3186-3188 (1999).

Pan, T. et al., "Planar $Er^{3+}$-doped aluminosilicate waveguide amplifier with more than 10 dB gain across C-band," Optical Society of America, 3 pages (2000).

Park et al., "Characteristics of Pt Thin Film on the Conducting Ceramics TiO and Ebonex ($Ti_4O_7$) as Electrode Materials," Thin Solid Films 258: 5-9 (1995).

Peters, D.P. et al., "Formation mechanism of silver nanocrystals made by ion irradiation of $Na^+$—$Ag^+$ ion-exchanged sodalime silicate glass," Nuclear Instruments and Methods in Physics Research B 168:237-244 (2000).

Rajarajan, M. et al., "Numerical Study of Spot-Size Expanders fro an Efficient OEIC to SMF Coupling," IEEE Photonics Technology Letters 10(8): 1082-1084 (1998).

Ramaswamy, R.V. et al., "Ion-Exchange Glass Waveguides: A Review," J. Lightwave Technology 6(6): 984-1002 (1988).

Roberts, S.W. et al., "The Photoluminescence of Erbium-doped Silicon Monoxide," University of Southampton, Department of Electronics and Computer Science Research Journal, 7 pages (1996).

Saha et al., "Large Reduction of Leakage Current by Graded-Layer La Doping in (Ba0.5,Sr0.5)TiO3 Thin Films," Appl. Phys. Lett. 79(1): 111-113 (Jul. 2001).

Sanyo Vacuum Industries Co., Ltd. Products Infor, $TiO_2$, (2003), 1 page http://www.sanyovac.co.jp/Englishweb/products?ETiO2.htm.

Schermer, R. et al., "Investigation of Mesa Dielectric Waveguides," Proceedings of the OSA Integrated Photonics Research Topical Meeting and Exhibit, Paper No. IWB3, 3 pages (2001).

Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).

Scholl, R., "Power Supplies for Pulsed Plasma Technologies: State-of-the-Art and Outlook," Advances Energy Industries, Inc. 1-8 (1999).

Scholl, R., "Power Systems for Reactive Sputtering of Insulating Films," Advances Energy Industries, Inc., 1-8 (Aug. 2001).

Second International Symposium of Polymer Surface Modification: Relevance to Adhesion, Preliminary Program, 13 pages (1999).

Seventh International Conferene on $TiO_2$ Photocatalysts: Fundamentals & Applications, Toronto, Ontario, Canada, Final Program, 7 pages (Nov. 17-21, 2002).

Shaw, D.G. et al., "Use of Vapor Deposited Acrylate Coatings to Improve the Barrier Properties of Metallized Film," Society of Vacuum Coaters, 37th Annual Technical Conference Proceedings, pp. 240-244 (1994).

Shin, J.C. et al. "Dielectric and Electrical Properties of Sputter Grown (Ba,Se)TiO$_3$ Thin Films," J. Appl. Phys. 86(1):506-513 (1999).

Shmulovich, J. et al., "Recent progress in Erbium-doped waveguide amplifiers," Bell Laboratories, pp. 35-37 (1999).

Slooff, L.H. et al., "Optical properties of Erbium-doped organic polydentate cage complexes," J. Appl. Phys. 83(1):497-503 (1998).

Smith, R.E. et al., "Reduced Coupling Loss Using a Tapered-Rib Adiabatic-Following Fiber Coupler," IEEE Photonics Technology Lett. 8(8):1052-1054 (1996).

Snoeks, E. et al., "Cooperative upconversion in erbium-implanted soda-lime silicate glass optical waveguides," J. Opt. Soc. Am. B 12(8): 1468-1474 (1995).

Strohhofer, C. and Polman, A. "Energy transfer to Er$^{3+}$ in Ag ion-exchanged glass," FOM Institute for Atomic and Molecular Physics, 10 pages (2001).

Sugiyama, A. et al., "Gas Permeation Through the Pinholes of Plastic Film Laminated with Aluminum Foil," Vuoto XXVIII(1-2):51-54 (1999).

Swell, P. et al "Rib Waveguide Spot-Size Transformers: Modal Properties," J Lightwave Technology 17(5):848-856 (1999).

Tervonen, A. "Challenges and opportunities for integrated optics in optical networks," SPIE 3620:2-11(1999).

Ting, C.Y. et al., "Study of planarized sputter-deposited SiO$_2$," J. Vac. Sci Technol, 15(3):1105-1112 (1078), May/Jun. 1978.

Tomaszewski, H. et al., "Yttria-stabilized zirconia thin films grown by reactive r.f. magnetron sputtering," Thin Solid Films 287: 104-109 (1996).

Triechel, O. and Kirchhoff, V., "The influences of pulsed magnetron sputtering on topography and crystallinity of TiO$_2$ films on glass," Surface and Coating Technology 123:268-272 (2000).

Tukamoto, H. and West, A.R., "Electronic Conductivity of LiCoO$_8$ and Its Enhancement by Magnesium Doping," J. Electrochem. Soc 144(9):3164-3168 (1997).

Van Dover, R.B., "Amorphous Lanthanide-Doped TiO$_x$ Dielectric Films," Appl. Phys. Lett. 74(20):3041-3043 (1999).

Viljanen, J. and Leppihalme, M., "Planner Optical Coupling Elements for Multimode Fibers with Two-Step Ion Migration Process," Applied Physics 24(1):61-63 (1981).

Villegas, M.A. et al., "Optical spectroscopy of a soda lime glass exchanged with silver," Phys. Chem. Glasses 37(6):248-253 (1996).

Von Rottkay, K. et al., "Influences of stoichiometry on electrochromic cerium-titanium oxide compounds," Presented at the 11$^{th}$ Int'l Conference of Solid State Ionics, Honolulu, Hawaii, Nov. 19, 1997, Published in Solid State Ionics 113-115:425-430. (1998).

Westlinder, J. et al., "Simulations and Dielectric Characterization of Reactive dc Magnetron Cosputtered (Ta$_2$O$_5$)$_{1-x}$(TiO$_2$)$_x$ Thin Films," J Vac. Sci. Technol. B 20(3):855-861 (May/Jun. 2002).

Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).

Yanagawa, H. et al., "Index-and-Dimensional Taper and Its Application to Photonic Devices," J. Lightwave Technology 10(5):587-591 (1992).

Yoshikawa, K. et al., "Spray formed aluminum alloys for sputtering targets," Powder Metallurgy 43(3): 198-199 (2000).

Zhang, H. et al., "High Dielectric Strength, High κ TiO$_2$ Films by Pulsed DC, Reactive Sputter Deposition," 5 pages (2001).

Preliminary Amendment filed Jul. 27, 2005, in U.S. Appl. No. 11/191,643.

Preliminary Amendment filed Sep. 16, 2005, in U.S. Appl. No. 11/228,834.

Response to Office Action filed Oct. 17, 2005, in U.S. Appl. No. 10/291,179.

Final Office Action issued on Dec. 14, 2005, in U.S. Appl. No. 10/291,179.

Response to Final Office Action filed Apr. 14, 2006, in U.S. Appl. No. 10/291,179.

Office Action mailed Apr. 27, 2006, in U.S. Appl. No. 10/291,179.

Response to Office Action filed Jul. 27, 2006, in U.S. Appl. No. 10/291,179.

Final Office Action dated Oct. 12, 2006, in U.S. Appl. No. 10/291,179.

Notice of Allowance issued on Oct. 8, 2002, n U.S. Patent No. 6,533,908.

Response to Office Action filed Feb. 24, 2006, in U.S. Appl. No. 10/101,863.

Office Action mailed Mar. 22, 2006, in U.S. Appl. No. 10/101,863.

Response to Office Action filed Jun. 12, 2006, in U.S. Appl. No. 10/101,863.

Office Action mailed Sep. 6, 2006, in U.S. Appl. No. 10/101,863.

Office Action issued on Sep. 27, 2004, in U.S. Appl. No. 10/291,179.

Corrected Preliminary Amendment filed Sep. 19, 2005, in U.S. Appl. No. 11/191,643.

Response to Final Office Action filed Aug. 3, 2006, in U.S. Appl. No. 10/789,953.

Notice of Allowance dated Oct. 23, 2006, in U.S. Appl. No. 10/789,953.

Final Office Action dated Oct. 26, 2006, in U.S. Appl. No. 10/851,542.

Office Action dated Oct. 31, 2006, in U.S. Appl. No. 10/954,182.

Response to Final Office Action filed Nov. 3, 2006, in U.S. Appl. No. 10/291,179.

Response to Office Action dated Nov. 8, 2006, to the Korean Patent Office in Application No. 10.20057016055.

Office Action dated Dec. 1, 2006, in U.S. Appl. No. 10/291,179.

Response to Office Action filed Dec. 6, 2006, in U.S. Appl. No. 10/954,182.

Continuation Application and Preliminary Amendment filed Dec. 13, 2006, in U.S. Appl. No. 11/638,680.

Response to Office Action dated Dec. 21, 2006, in U.S. Appl. No. 11/228,805.

International Search Report dated Dec. 21, 2006, for PCT Application No. PCT/US06/23143.

Response to Office Action filed Jan. 26, 2007, in U.S. Appl. No. 10/851,542.

Response to Office Action filed Feb. 6, 2007, in U.S. Appl. No. 10/101,863.

Supplementary Preliminary Amendment filed Feb. 6, 2007, in U.S. Appl. No. 11/228,834.

Supplementary Preliminary Amendment filed Feb. 6, 2007, in U.S. Appl. No. 11/191,643.

Notice of Allowance dated Feb. 21, 2007, in U.S. Appl. No. 10/789,953.

Notice of Allowance dated Feb. 22, 2007, in U.S. Appl. No. 10/851,542.

Response to Office Action and Terminal Disclaimer filed Mar. 1, 2007, in U.S. Appl. No. 10/291,179.

Voluntary Amendment dated Mar. 8, 2007, in TW Appl. No. 93114518.

Office Action dated Mar. 14, 2007, in U.S. Appl. No. 10/954,182.

Supplemental Notice of Allowance dated Mar. 15, 2007, in U.S. Appl. No. 10/851,542.

Application and Preliminary Amendment filed Mar. 22, 2007, in U.S. Appl. No. 11/726,972.

Notice of Allowance dated Mar. 26, 2007, in U.S. Appl. No. 11/228,805.

Response to Office Action filed Mar. 30, 2007, in U.S. Appl. No. 10/954,182.

Notice of Non-Compliant Amendment dated Apr. 12, 2007, in U.S. Appl. No. 10/954,182.

Response to Notice of Non-Compliant Amendment filed Apr. 23, 2007, in U.S. Appl. No. 10/954,182.

Final Office Action dated May 2, 2007, in U.S. Appl. No. 10/101,863.

Office Action dated May 21, 2007, in U.S. Appl. No. 10/291,179.

Office Communication with Corrected Notice of Allowance dated Jun. 7, 2007, in U.S. Appl. No. 11/228,805.

Issue Notification dated Jun. 13, 2007, in U.S. Appl. No. 10/851,542.

Response to Office Action filed on Dec. 21, 2005, in U.S. Appl. No. 10/954,182.

Office Action issued on Mar. 9, 2006, in U.S. Appl. No. 10/954,182.

Response to Office Action filed on Aug. 9, 2006, in U.S. Appl. No. 10/954,182.

Response to Office Action filed Mar. 2, 2006, in U.S. Appl. No. 10/789,953.
Final Office Action issued on May 19, 2006, in U.S. Appl. No. 10/789,953.
Office Action dated Sep. 22, 2006, from Korean Patent Office in Application No. 10-2005-7016055.
Office Action from Singapore Patent Office in Application No. 200505388-9, dated Mar. 20, 2006.
Response to Office Action from Singapore Patent Office in Application No. 200505388-9, dated Aug. 11, 2006.
Office Action dated Oct. 12, 2006, for U.S. Appl. No. 11/228,805.
Office Action mailed Apr. 19, 2006, in U.S. Appl. No. 10/851,542.
Response to Office Action filed Jul. 26, 2006, in U.S. Appl. No. 10/851,542.
Voluntary Amendment filed Aug. 15, 2006, in TW Application No. 94143175.
PCT International Search Report and Written Opinion for Application No. PCT/US05/44781 dated Oct. 3, 2006.
Specification as filed Sep. 2, 2005, for U.S. Appl. No. 11/218,652.
Final Office Action issued on Dec. 14, 2005 in U.S. Appl. No. 10/291,179.
Response to Final Office Action filed Apr. 14, 2006, in U.S. Appl. No. 10/291,179.
Office Action issued Nov. 28, 2001, for US Patent No, 6,506,289.
Response to Office Action filed Feb. 20, 2002, for US Patent No. 6,506,289.
Office Action issued Apr. 17, 2002, for US Patent No. 6,506,289.
Response to Office Action filed Jul. 17, 2002, for US Patent No, 6,506,289.
Notice of Allowance mailed Aug. 6, 2002, for US Patent No. 6,506,289.
Notice of Allowance mailed Nov. 10, 2003 for US Patent No. 6,827,826.
Response to Office Action filed Feb. 28, 2006 in U.S. Appl. No. 09/903,081.
Final Office Action mailed May 8, 2006 in U.S. Appl. No. 09/903,081.
Response to Office Action filed Feb. 17, 2006 in U.S. Appl. No. 11/100,856.
Final Office Action mailed Jun. 9, 2006 in U.S. Appl. No. 11/100,856.
Response to Office Action filed on Dec. 21, 2005 in U.S. Appl. No. 10/954,182.
Response to Office Action filed on May 15, 2006, in U.S. Appl. No. 10/101,341.
Office Action issued on Mar. 23, 2006, in U.S. Appl. No. 10/650,461.
Response to Office Action filed Mar. 2, 2006 in U.S. Appl. No. 10/789,953.
Final Office Action issued on May 19, 2006 in U.S. Appl. No. 10/789,953.
Office Action from Singapore Patent Office in Appl. No. 200505388-9, dated Mar. 20, 2006.
Office Action mailed Apr. 19, 2006 in U.S. Appl. No. 10/851,542.
PCT Invitation to Pay Additional Fees for PCT/US01/22750, dated Mar. 13, 2002.
PCT International Search Report for PCT/US01/22750, dated Jul. 19, 2002.
PCT Written Opinion for PCT/US01/22750, dated Jul. 23, 2002.
PCT International Preliminary Examination Report for PCTIUSOI/22750, dated Oct. 8, 2002.
Final Office Action issued on Feb. 14, 2006, in U.S. Appl. No. 10/101,863.
Office Action issued on Feb. 13, 2006, in U.S. Appl. No. 10/101,341.
Response to Office Action filed on Jan. 3, 2006 in U.S. Appl. No. 10/650,461.
International Search Report mailed on Dec. 12, 2003 in PCT/US03/24809.
PCT International Preliminary Examination Report mailed Apr. 15, 2004 in PCT/US03/24809.
Specification and Preliminary Amendment as filed for U.S. Appl. No. 11/297,057, Dec. 7, 2005.
International Search Report issued on Oct. 25, 2004 in PCT/US2004/005531.
Written Opinion issued on Oct. 25, 2004 in PCT/US2004/005531.
Response to Office Action filed Jan. 19, 2006 in U.S. Appl. No. 10/851,542.
PCT International Search Report of Application No. PCT/US2004/014524 dated Mar. 2, 2005.
PCT Written Opinion for Application No. PCT/US2004/014524, dated Mar. 2, 2005.
PCT International Preliminary Report on Patentability for Application No. PCT/US2004/014524, dated Dec. 8, 2005.
PCT International Search Report for Application No. PCT/US2004/014523 dated Jan. 17, 2005.
PCT Written Opinion for Application No. PCT/US2004/014523 dated Jan. 17, 2005.
PCT International Preliminary Report on Patentability for Application No. PCT/US2004/014523, dated Dec. 8, 2005.
Response to Office Action filed on Mar. 14, 2005 in U.S. Appl. No. 10/291,179.
Office Action issued on Jun. 15, 2005 in U.S. Appl. No. 10/291,179.
Response to Office Action filed on Oct. 17, 2005 in U.S. Appl. No. 10/291,179.
Office Action issued on May 2, 2002 in U.S. Patent No. 6,533,907.
Response to Office Action filed on Sep. 3, 2002 in U.S. Patent No. 6,533,907.
Office Action issued on Feb. 12, 2004 in U.S. Appl. No. 09/903,081.
Response to Office Action filed on Aug. 10, 2004 in U.S. Appl. No. 09/903,081.
Office Action issued on Sep. 10, 2004 in U.S. Appl. No. 09/903,081.
Amendment/RCE filed on Mar. 10, 2005 in U.S. Appl. No. 09/903,081.
Office Action issued on Mar. 17, 2005 in U.S. Appl. No. 09/903,081.
Response to Office Action filed on Jun. 17, 2005 in U.S. Appl. No. 09/903,081.
Office Action issued on Jul. 8, 2005 in U.S. Appl. No. 09/903,081.
Office Action issued on Nov. 28, 2005 in U.S. Appl. No. 09/903,081.
Office Action issued on May 14, 2003 in U.S. Appl. No. 10/101,492.
Response to Office Action filed on Aug. 14, 2003 in U.S. Appl. No. 10/101,492.
Office Action issued on Sep. 3, 2003 in U.S. Appl. No. 10/101,492.
Response to Office Action filed on Mar. 3, 2004 in U.S. Appl. No. 10/101,492.
Office Action issued Sep. 21, 2005 in U.S. Appl. No. 11/100,856.
Office Action issued on Feb. 24, 2004 in U.S. Appl. No. 10/101,863.
Response to Office Action filed on Jul. 23, 2004 in U.S. Appl. No. 10/101,863.
Office Action issued on Oct. 6, 2004 in U.S. Appl. No. 10/101,863.
Office Action dated Jan. 13, 2005, in U.S. Appl. No. 10/101,863.
Response to Office Action filed on Jun. 10, 2005 in U.S. Appl. No. 10/101,864.
Office Action issues on Aug. 4, 2005, in U.S. Appl. No. 10/101,863.
Response Office Action filed Dec. 5, 2005, in U.S. Appl. No. 10/101,863.
Office Action dated Mar. 25, 2005, in U.S. Appl. No. 10/954,182.
Response Office Action filed on Jul. 25, 2005 in U.S. Appl. No. 10/954,182.
Office Action issued on Oct. 25, 2005, in U.S. Appl. No. 10/954,182.
Office Action issued on Oct. 22, 2003, in U.S. Appl. No. 10/101,341.
Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
Office Action issued on Aug. 8, 2005 in U.S. Appl. No. 10/101,341.
Response to Office Action filed on Nov. 8, 2005, in U.S. Appl. No. 10/101,341.
Office Action issued on May 4, 2004 in U.S. Appl. No. 10/101,493.
Office Action issued on Oct. 3, 2005 in U.S. Appl. No. 10/650,461.
Office Action issued on Mar. 14, 2005 in U.S. Appl. No. 10/789,953.
Office Action issued on Dec. 2, 2005 in U.S. Appl. No. 10/789,953.
Office Action issued on Mar. 24, 2005 in U.S. Appl. No. 10/851,542.
Response to Office Action dated Jul. 25, 2005 in U.S. Appl. No. 10/851,542.
Office Action issued on Oct. 19, 2005 in U.S. Appl. No. 10/851,542.
Jones et al., "A Thin Film Solid State Microbattery" 53-56 Solid State Ionics 628 (1992).

Mattox "Handbook of Physical Vapor Deposition (PVD) Processing, Society of Vacuum Coaters," Albuquerque, New Mexico 660f and 692ff, Noyes Publications (1998).

Response to Rejection Decision dated Feb. 5, 2010, in Appln. No. 200480021078.6.

Notification of Grant of Invention Patent Right and Notification for Completion of Formalities for Registration Issued Jun. 11, 2010, in Appl. No. 200580042320 5.8.

* cited by examiner

| CURRENT COLLECTOR | |
|---|---|
| ⋮ | |
| CURRENT COLLECTOR | 603 |
| LiCoO₂ | 602 |
| LiPON | 901 |
| ANODE | 902 |
| CURRENT COLLECTOR | 903 |
| ANODE | 902 |
| LiPON | 901 |
| LiCoO₂ | 602 |
| CURRENT COLLECTOR | 603 |
| SUBSTRATE | 601 |

FIG. 9A

| CURRENT COLLECTOR | 603 |
|---|---|
| ⋮ | |
| CURRENT COLLECTOR | 903 |
| ANODE | 902 |
| LiPON | 607 |
| LiCoO₂ | 602 |
| CURRENT COLLECTOR | 903 |
| ANODE | 902 |
| LiPON | 901 |
| LiCoO₂ | 602 |
| CURRENT COLLECTOR | 603 |
| SUBSTRATE | 601 |

FIG. 9B

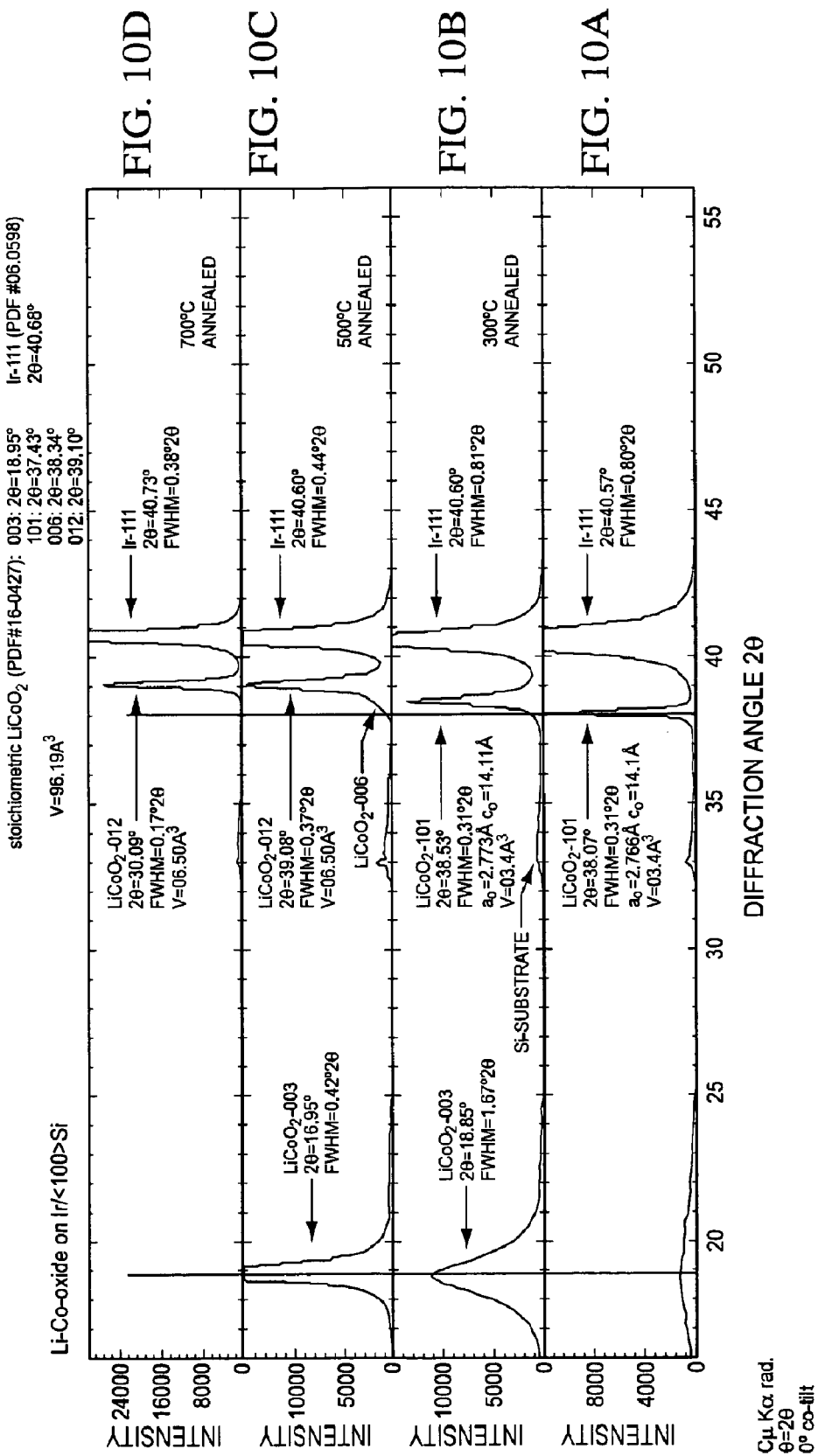

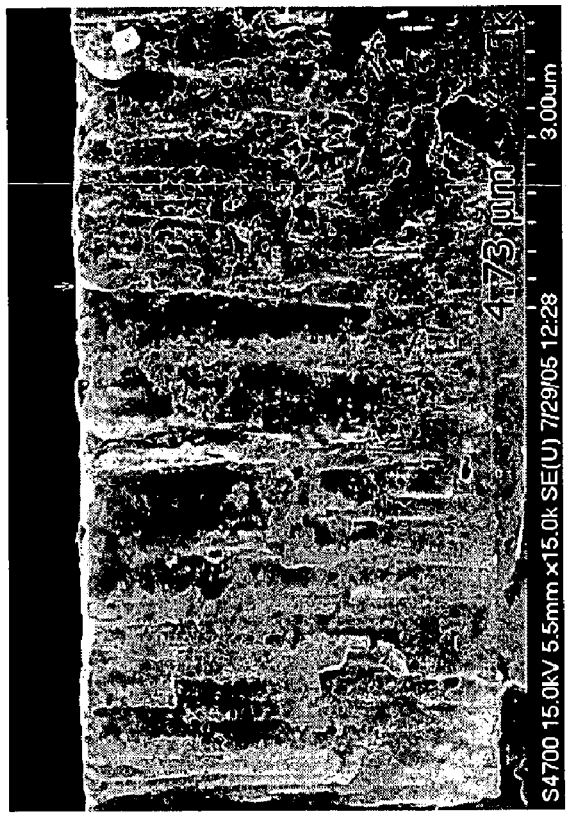
FIG. 12L  On alumina
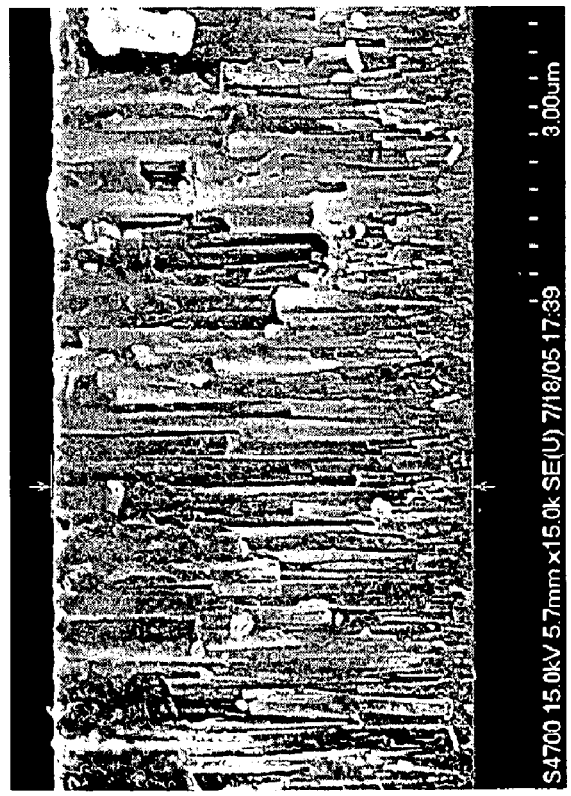
FIG. 12K  On Si

In Ar

In Ar/O$_2$ (3/1)

As deposited

700Cx2h

RTA-5m

RTA-700C15m

DEPOSITION OF LICOO$_2$

RELATED APPLICATIONS

The present application is a continuation and claims the benefit under 35 U.S.C. §120 of U.S. patent application Ser. No. 11/297,057, filed Dec. 7, 2005, which is related to and claims the benefit under 35 U.S.C. §119(e) of U.S. provisional patent application Ser. No. 60/651,363, filed Feb. 8, 2005, and U.S. provisional patent application Ser. No. 60/634,818, filed Dec. 8, 2004, which are expressly incorporated fully herein by reference.

BACKGROUND

1. Field of the Invention

The present invention is related to thin-film solid-state batteries and, in particular, the deposition of LiCoO$_2$ films and layers for battery manufacture.

2. Discussion of Related Art

Solid-state thin-film batteries are typically formed by stacking thin films on a substrate in such a way that the films cooperate to generate a voltage. The thin films typically include current collectors, a cathode, an anode, and an electrolyte. The thin films can be deposited utilizing a number of deposition processes, including sputtering and electroplating. Substrates suitable for this application have conventionally been high temperature materials capable of withstanding at least one high temperature anneal process to at least 700° C. for up to about 2 hours in air so as to crystallize the LiCoO$_2$ film. Such a substrate can be any suitable material with appropriate structural and material properties, for example a semiconductor wafer, metallic sheet (e.g., titanium or zirconium), ceramic such as alumina, or other material capable of withstanding subsequent high temperature processing in the presence of the LiCoO$_2$, which can experience significant interfacial reactions with most materials utilized in a battery during these temperature cycles.

Other lithium containing mixed metal oxides besides LiCoO$_2$, including Ni, Nb, Mn, V, and sometimes also Co, but including other transition metal oxides, have been evaluated as crystalline energy storage cathode materials. Typically, the cathode material is deposited in amorphous form and then the material is heated in an anneal process to form the crystalline material. In LiCoO$_2$, for example, an anneal at or above 700° C. transforms the deposited amorphous film to a crystalline form. Such a high temperature anneal, however, severely limits the materials that can be utilized as the substrate, induces destructive reaction with the lithium containing cathode material and often requires the use of expensive noble metals such as gold. Such high thermal budget processes (i.e., high temperatures for extended periods of time) are incompatible with semiconductor or MEM device processing and limit the choice of substrate materials, increases the cost, and decrease the yield of such batteries. The inventors are unaware of a process disclosed in the art that allows production of cathodic lithium films for a battery structure where a post-deposition anneal process has a low enough thermal budget to allow production of functional structures on low temperature materials such as stainless steel, aluminum, or copper foil.

It is known that crystallization of amorphous LiCoO$_2$ on precious metals can be achieved. An example of this crystallization is discussed in Kim et al., where an anneal at 700° C. for 20 minutes of an amorphous layer of LiCoO$_2$ provides for crystallization of the LiCoO2 material, as shown by x-ray diffraction data. Kim, Han-Ki and Yoon, Young Soo, "Characteristics of rapid-thermal-annealed LiCoO2, cathode film for an all-solid-state thin film microbattery," J. Vac. Sci. Techn. A 22(4), July/August 2004. In Kim et al., the LiCoO2 was deposited on a platinum film that was deposited on a high-temperature MgO/Si substrate. Id. In Kim et al, it was shown that such a crystalline film is capable of constituting the Li+ ion containing cathode layer of a functional all solid-state Li+ ion battery. However, it is of continuing interest for the manufacture of solid state Li+ ion batteries to further reduce the thermal budget of the post deposition anneal, both in time and in temperature, so as to enable the manufacture of such batteries without the need for expensive precious metal nucleation, barrier layers, or expensive high-temperature substrates.

There are many references that disclose an ion beam assisted process that can provide a LiCoO$_2$ film that demonstrates some observable crystalline composition by low angle x-ray diffraction (XRD). Some examples of these include U.S. patent applications Ser. No. 09/815,983 (Publication No. US 2002/001747), Ser. No. 09/815,621 (Publication No. US 2001/0032666), and Ser. No. 09/815,919 (Publication No. US 2002/0001746). These references disclose the use of a second front side ion beam or other ion source side-by-side with a deposition source so as to obtain a region of overlap of the flux of ions with the flux of LiCoO$_2$ vapor at the substrate surface. None of these references disclose film temperature data or other temperature data of the film during deposition to support an assertion of low temperature processing.

It is very difficult to form a uniform deposition either by sputtering a material layer or by bombardment with an ion flux. Utilization of two uniform simultaneous distributions from two sources that do not occupy the same position and extent with respect to the substrate enormously increases the difficulties involved in achieving a uniform material deposition. These references do not disclose a uniform materials deposition, which is required for reliable production of thin-film batteries. A well understood specification for material uniformity for useful battery products is that a 5% one-sigma material uniformity is standard in thin film manufacturing. With this uniformity, about 86% of the produced films will be found acceptable for battery production.

It is even more difficult to scale a substrate to manufacturing scale, such as 200 mm or 300 mm. Indeed, in the references discussed above that utilize both a sputtering deposition and an ion beam deposition, only small area targets and small area substrates are disclosed. These references disclose a single feasibility result. No method for achieving a uniform distribution from two separate front side sources has been disclosed in these references.

Further, conventional materials and production processes can limit the energy density capacity of the batteries produced, causing a need for more batteries occupying more volume. It is specifically desirable to produce batteries that have large amounts of stored energy per unit volume in order to provide batteries of low weight and low volume.

Therefore, there is a need for a low temperature process for depositing crystalline material, for example LiCoO$_2$ material, onto a substrate.

SUMMARY

In accordance with the present invention, deposition of LiCoO$_2$ layers in a pulsed-dc physical vapor deposition process is presented. Such a deposition can provide a low-temperature, high deposition rate deposition of a crystalline layer of LiCoO$_2$ with a desired (101) orientation. Some embodiments of the deposition address the need for high rate deposition of LiCoO$_2$ films, which can be utilized as the cathode layer in a solid state rechargeable Li battery. Embodiments of the process according to the present invention can eliminate the high temperature (>700° C.) anneal step that is conventionally needed to crystallize the LiCoO$_2$ layer.

A method of depositing a LiCoO$_2$ layer according to some embodiments of the present invention includes placing a substrate in a reactor; flowing a gaseous mixture including argon and oxygen through the reactor; and applying pulsed-DC power to a target formed of LiCoO$_2$ positioned opposite the substrate. A crystalline LiCoO$_2$ layer is formed on the substrate. Further, in some embodiments the LiCoO$_2$ layer is a crystalline layer of orientation (101).

In some embodiments, a stacked battery structure can be formed. The stacked battery structure includes one or more battery stacks deposited on a thin substrate, wherein each battery stack includes: a conducting layer, a crystalline LiCoO$_2$ layer deposited over the conducting layer, a LiPON layer deposited over the LiCoO$_2$ layer; and an anode deposited over the LiPON layer. A top conducting layer can be deposited over the one or more battery stacks.

In some embodiments, a battery structure can be formed in a cluster tool. A method of producing a battery in a cluster tool includes loading a substrate into a cluster tool; depositing a conducting layer over the substrate in a first chamber of the cluster tool; depositing a crystalline LiCoO$_2$ layer over the conducting layer in a second chamber of the cluster tool; depositing a LiPON layer over the LiCoO$_2$ layer in a third chamber of the cluster tool; depositing an anode layer over the LiCoO$_2$ layer in a fourth chamber; and depositing a second conducting layer over the LiPON layer in a fifth chamber of the cluster tool.

A fixture for holding a thin substrate can include a top portion; and a bottom portion, wherein the thin substrate is held when the top portion is attached to the bottom portion.

These and other embodiments of the invention are further discussed below with reference to the following figures. It is to be understood that both the foregoing general description and the following detailed description are exemplary and explanatory only and are not restrictive of the invention, as claimed. Further, specific explanations or theories regarding the deposition or performance of barrier layers or soft-metal breath treatments according to the present invention are presented for explanation only and are not to be considered limiting with respect to the scope of the present disclosure or the claims.

BRIEF DESCRIPTION OF THE DRAWINGS

FIGS. 9A and 9B illustrate examples of stacked batter structures with LiCoO$_2$ layers deposited according to some embodiments of the present invention.

FIGS. 10A through 10D illustrate deposition and anneal steps for LiCoO$_2$ deposited over an iridium layer on a silicon wafer.

FIGS. 12A through 12L illustrate deposition of a crystalline LiCoO2 layer on a silicon or alumina substrate.

In the figures, elements having the same designation have the same or similar functions.

DETAILED DESCRIPTION

In accordance with embodiments of the present invention, LiCoO$_2$ films are deposited on a substrate by a pulsed-dc physical vapor deposition (PVD) process. In contrast to, for example, Kim et al., LiCoO$_2$ films according to some embodiments of the present invention provide a crystalline LiCoO$_2$ film as deposited on a substrate at a substrate temperature as low as about 220° C. during deposition, without the use of a metallic nucleation or barrier underlying film. The as-deposited crystalline LiCoO$_2$ films can be easily ripened to very high crystalline condition by anneal at about 700° C. for as little as 5 minutes without the use of an underlying precious metal film. In addition, the as deposited crystalline films, when positioned on a noble metal film can be annealed at much further reduced temperatures, for example as low as 400 to 500° C., providing for deposition, annealing, and production of solid state batteries on lower temperature substrates.

In the present application, a single, extended source is described which has been scaled to 400 mm×500 mm for production achieving a LiCoO$_2$ uniformity of 3% one-sigma measured at 25 points at a deposition rate of 1.2 microns thickness an hour over an area of 2000 cm, without the need for secondary front side ion source or ion assistance.

Figure 16:
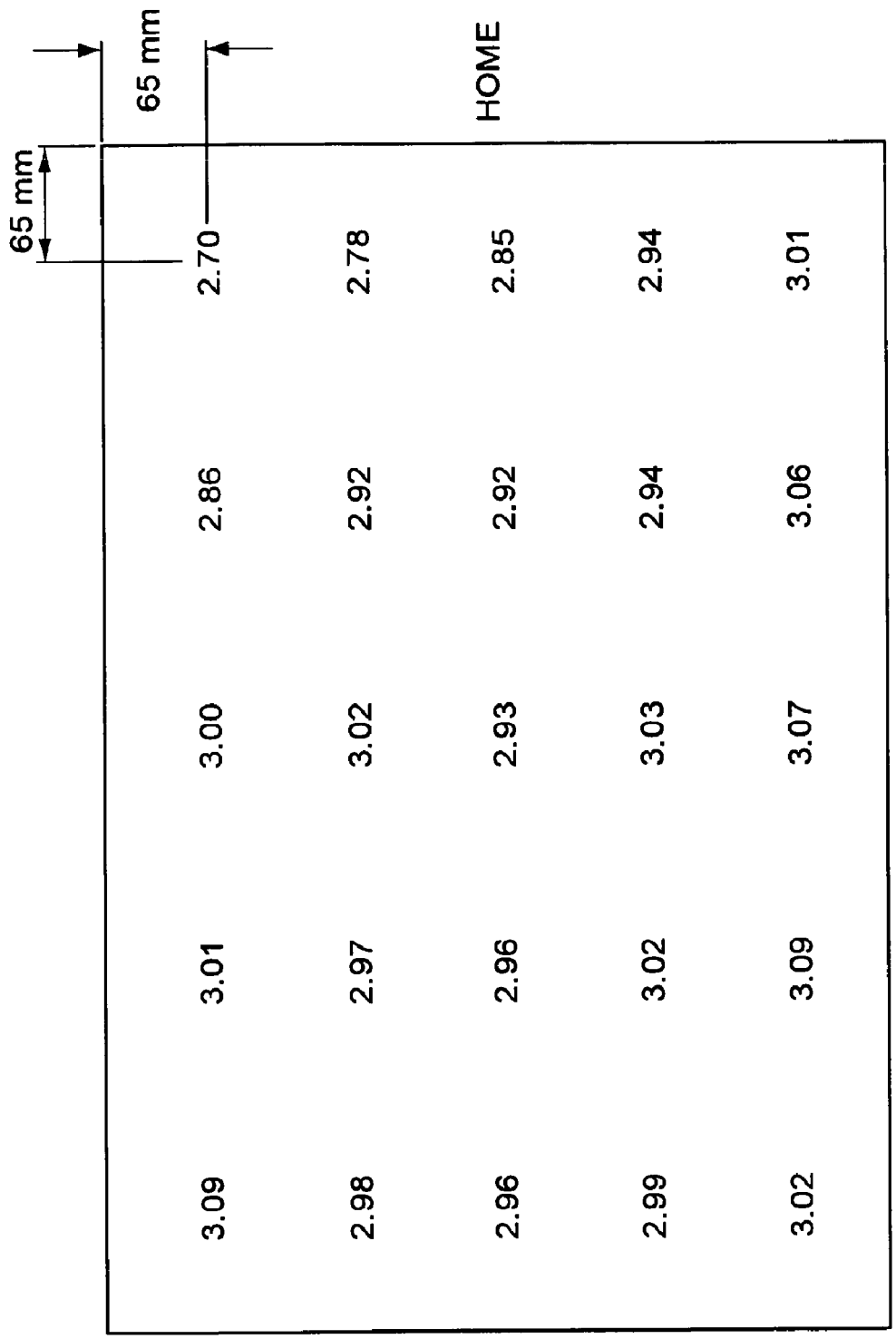
FIG. 16 illustrates thickness uniformity of a LiCoO2 film deposited according to some embodiments of the present invention.

In one example process, a LiCoO$_2$ film was deposited utilizing a conductive ceramic LiCoO$_2$ target as described herein, with pulsed-dc power of 4 kW, no bias, with 60 sccm Ar and 20 sccm $O_2$ gas flows. In 2 hours, a 7200 Angstrom layer of crystalline $LiCoO_2$ was deposited on a substrate area of 400×500 mm. As demonstrated in FIG. 16, film thickness uniformity was located at about 25 locations spaced uniformly across the substrate using a felt marker pen to lift off a portion of the film in each location. High precision white-light interferometry was utilized to measure the film thickness in each location by measuring the step height from the substrate to film surface. All 25 thickness measurement demonstrated a 3% one-sigma uniformity in the film thickness over 400×500 mm substrate area. As shown in FIG. 16, a film was deposited with average thickness of about 2.96 μm with a maximum of 3.09 μm and a minimum of 2.70 μm and standard deviation of 0.093. Thickness data was taken at points spaced 0.65 mm apart on the surface of the film. The film thickness therefore showed 3% one-sigma uniformity over the shown surface area.

On other depositions utilizing this process, a temperature measurement of the substrate during deposition showed that the substrate remained at less than 224° C. Temperature measurements were performed utilizing a temperature sticker purchased from Omega Engineering, Stamford, Conn. (Model no. TL-F-390, active from 199-224° C.).

Moreover, in some embodiments, films deposited according to the present invention can have a deposition rate of from about 10 to about 30 times higher than processes in conventional films. Furthermore, films according to the present invention can be deposited on wide area substrates having a surface area from 10 to 50 times the surface area of prior sputtering processes, resulting in much higher productivity and much lower cost of manufacture, thereby providing high-volume, low-cost valuable batteries.

Further, conventional deposition processes are capable of depositing amorphous $LiCoO_2$ layers, but do not deposit crystalline $LiCoO_2$ layers. Surprisingly, depositions according to some embodiment of the present invention, deposit a $LiCoO_2$ layer with substantial crystallinity readily measured by x-ray diffraction techniques. In some embodiments, the crystallinity of the as-deposited $LiCoO_2$ layers is sufficient to be utilized in a battery structure with no further thermal processing. In some embodiments, crystallinity of the as-deposited $LiCoO_2$ layers are improved by thermal processes with low thermal budgets, which can be compatible with films deposited on low-temperature substrates.

Further, as-deposited the stoichiometry of some $LiCoO_2$ layers deposited according to some embodiments of the present invention shows that this layer is sufficient for utilization in a battery. With the demonstrated ability to deposit a $LiCoO_2$ film with crystallinity and with sufficient stoichiometry, a battery utilizing as-deposited $LiCoO_2$ films can be produced. Heat treating the $LiCoO_2$ layers may improve the crystallinity and lower the impedance.

In some embodiments, a crystalline layer of $LiCoO_2$ with a (101) or a (003) crystalline orientation is deposited directly on the substrate. Deposition of crystalline material can eliminate or lessen the need of a subsequent high temperature anneal or precious-metal layers to crystallize and orient the film. Removing the high temperature anneal allows for formation of battery structures on light-weight and low temperature substrates such as stainless steel foil, copper foil, aluminum foil, and plastic sheet, reducing both the weight and the cost of batteries while retaining the energy density storage capabilities of Li-based batteries. In some embodiments, a crystalline $LiCoO_2$ layer can be deposited on a precious metal layer, such as platinum or iridium, resulting in a further significant lowering of the ripening thermal budget required to improve crystallinity.

Deposition of materials by pulsed-DC biased reactive ion deposition is described in U.S. patent application Ser. No. 10/101,863, entitled "Biased Pulse DC Reactive Sputtering of Oxide Films," to Hongmei Zhang, et al., filed on Mar. 16, 2002. Preparation of targets is described in U.S. patent application Ser. No. 10/101,341, entitled "Rare-Earth Pre-Alloyed PVD Targets for Dielectric Planar Applications," to Vassiliki Milonopoulou, et al., filed on Mar. 16, 2002. U.S. patent application Ser. No. 10/101,863 and U.S. patent application Ser. No. 10/101,341 are each incorporated herein in their entirety. Deposition of oxide materials has also been described in U.S. Pat. No. 6,506,289, which is also herein incorporated by reference in its entirety. Transparent oxide films can be deposited utilizing processes similar to those specifically described in U.S. Pat. No. 6,506,289 and U.S. application Ser. No. 10/101863.

Figure 1A:
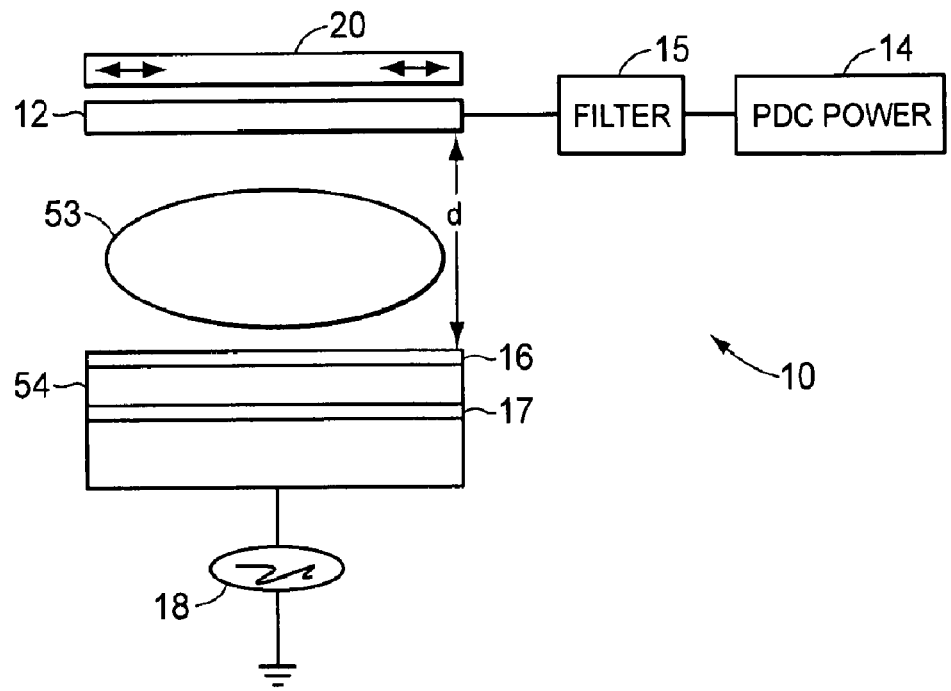
FIGS. 1A and 1B illustrate a pulsed-DC biased reactive deposition apparatus that can be utilized in the methods of depositing according to the present invention.

FIG. 1A shows a schematic of a reactor apparatus 10 for sputtering material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three deposition chambers connected by a vacuum transport chamber. These AKT reactors can be modified such that pulsed DC power is supplied to the target and RF power is supplied to the substrate during deposition of a material film. Apparatus 10 can also be a Phoenix Gen III PVD cluster tool made by Symmorphix, which is specifically designed for pulsed-dc processes such as is described herein.

Apparatus 10 includes target 12 which is electrically coupled through a filter 15 to a pulsed DC power supply 14. In some embodiments, target 12 is a wide area sputter source target, which provides material to be deposited on a substrate 16. Substrate 16 is positioned parallel to and opposite target 12. Target 12 functions as a cathode when power is applied to it from the pulsed DC power supply 14 and is equivalently termed a cathode. Application of power to target 12 creates a plasma 53. Substrate 16 is capacitively coupled to an electrode 17 through an insulator 54. Electrode 17 can be coupled to an RF power supply 18. A magnet 20 is scanned across the top of target 12.

For pulsed reactive dc magnetron sputtering, as performed by apparatus 10, the polarity of the power supplied to target 12 by power supply 14 oscillates between negative and positive potentials. During the positive period, the insulating layer on the surface of target 12 is discharged and arcing is prevented. To obtain arc free deposition, the pulsing frequency exceeds a critical frequency that can depend on target material, cathode current and reverse time. High quality oxide films can be made using reactive pulse DC magnetron sputtering as shown in apparatus 10.

Pulsed DC power supply 14 can be any pulsed DC power supply, for example an AE Pinnacle plus 10 K by Advanced Energy, Inc. With this DC power supply, up to 10 kW of pulsed DC power can be supplied at a frequency of between 0 and 350 kHz. The reverse voltage can be 10% of the negative target voltage. Utilization of other power supplies can lead to different power characteristics, frequency characteristics, and reverse voltage percentages. The reverse time on this embodiment of power supply 14 can be adjusted between 0 and 5 μs.

Filter 15 prevents the bias power from power supply 18 from coupling into pulsed DC power supply 14. In some embodiments, power supply 18 can be a 2 MHz RF power supply, for example a Nova-25 power supply made by ENI, Colorado Springs, Colo.

In some embodiments, filter 15 can be a 2 MHz sinusoidal band rejection filter. In some embodiments, the band width of the filter can be approximately 100 kHz. Filter 15, therefore, prevents the 2 MHz power from the bias to substrate 16 from damaging power supply 14 and allow passage of the pulsed-dc power and frequency.

Pulsed DC deposited films are not fully dense and may have columnar structures. Columnar structures can be detrimental to thin film applications such as barrier films and dielectric films, where high density is important, due to the boundaries between the columns. The columns act to lower the dielectric strength of the material, but may provide diffusion paths for transport or diffusion of electrical current, ionic current, gas, or other chemical agents such as water. In the case of a solid state battery, a columnar structure containing crystallinity as derived from processes according to the present invention is beneficial for battery performance because it allows better Li transport through the boundaries of the material.

In the Phoenix system, for example, target 12 can have an active size of about 800.00×920.00 mm by 4 to 8 mm in order to deposit films on substrate 16 that have dimension about 600×720 mm. The temperature of substrate 16 can be adjusted to between −50° C. and 500° C. The distance between target 12 and substrate 16 can be between about 3 and about 9 cm (in some embodiments, between 4.8 and 6 cm are used). Process gas can be inserted into the chamber of apparatus 10 at a rate up to about 200 sccm while the pressure in the chamber of apparatus 10 can be held at between about 0.7 and 6 milliTorr. Magnet 20 provides a magnetic field of strength between about 400 and about 600 Gauss directed in the plane of target 12 and is moved across target 12 at a rate of less than about 20-30 sec/scan. In some embodiments utilizing the Phoenix reactor, magnet 20 can be a race-track shaped magnet with dimensions about 150 mm by 800 mm.

Figure 1B:
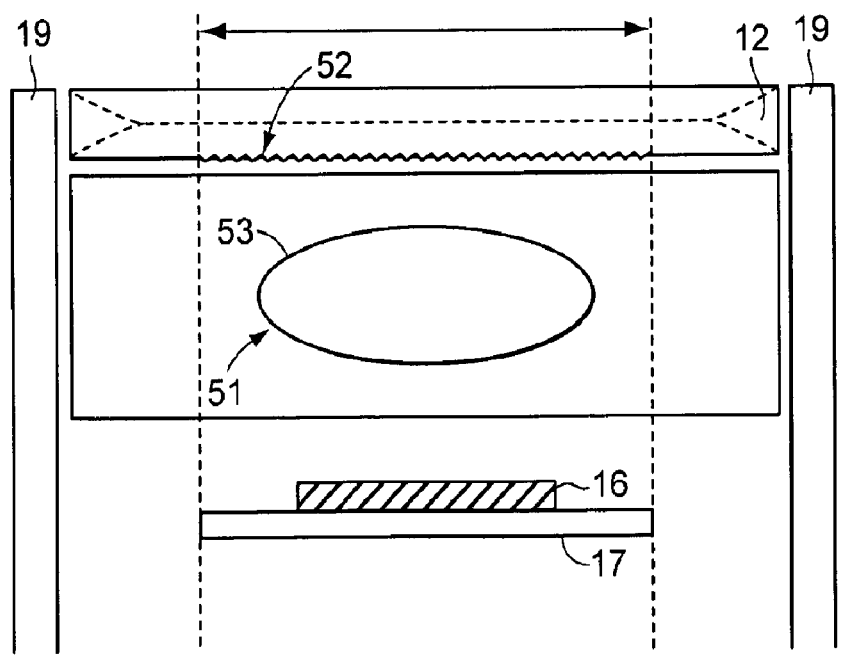
Figure 2:
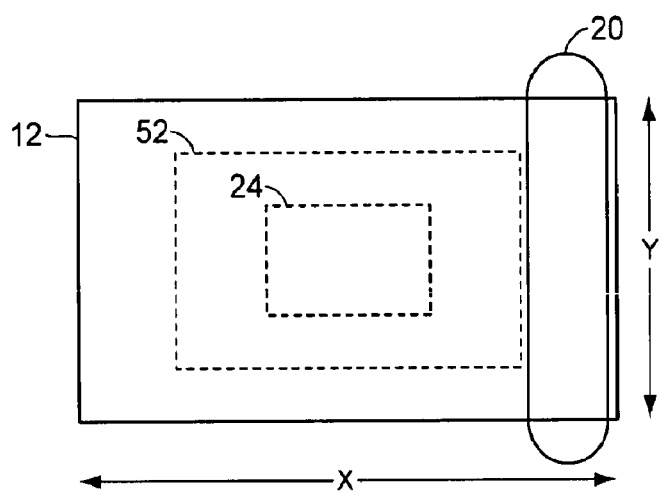
FIG. 2 shows an example of a target that can be utilized in the reactor illustrated in FIGS. 1A and 1B

FIG. 2 illustrates an example of target 12. A film deposited on a substrate positioned on carrier sheet 17 directly opposed to region 52 of target 12 has good thickness uniformity. Region 52 is the region shown in FIG. 1B that is exposed to a uniform plasma condition. In some implementations, carrier 17 can be coextensive with region 52. Region 24 shown in FIG. 2 indicates the area below which both physically and chemically uniform deposition can be achieved, for example where physical and chemical uniformity provide refractive index uniformity, oxide film uniformity, or metallic film uniformity. FIG. 2 indicates region 52 of target 12 that provides thickness uniformity, which is, in general, larger than region 24 of target 12 providing thickness and chemical uniformity to the deposited film. In optimized processes, however, regions 52 and 24 may be coextensive.

In some embodiments, magnet 20 extends beyond area 52 in one direction, for example the Y direction in FIG. 2, so that scanning is necessary in only one direction, for example the X direction, to provide a time averaged uniform magnetic field. As shown in FIG. 1A and 1B, magnet 20 can be scanned over the entire extent of target 12, which is larger than region 52 of uniform sputter erosion. Magnet 20 is moved in a plane parallel to the plane of target 12.

The combination of a uniform target 12 with a target area 52 larger than the area of substrate 16 can provide films of highly uniform thickness. Further, the material properties of the film deposited can be highly uniform. The conditions of sputtering at the target surface, such as the uniformity of erosion, the average temperature of the plasma at the target surface, and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform electrical, mechanical, or optical properties such as index of refraction, stoichiometry, density, transmission, or absorptivity.

Target 12 can be formed of any materials that provide the correct stoichiometry for $LiCoO_2$ deposition. Typical ceramic target materials include oxides of Li and Co as well as metallic Li and Co additions and dopants such as Ni, Si, Nb, or other suitable metal oxide additions. In the present disclosure, target 12 can be formed from $LiCoO_2$ for deposition of $LiCoO_2$ film.

In some embodiments of the invention, material tiles are formed. These tiles can be mounted on a backing plate to form a target for apparatus 10. A wide area sputter cathode target can be formed from a close packed array of smaller tiles. Target 12, therefore, may include any number of tiles, for example between 2 and 60 individual tiles. Tiles can be finished to a size so as to provide a margin of edge-wise non-contact, tile to tile, less than about 0.010" to about 0.020" or less than half a millimeter so as to eliminate plasma processes that may occur between adjacent ones of tiles 30. The distance between tiles of target 12 and the dark space anode or ground shield 19 in FIG. 1B can be somewhat larger so as to provide non contact assembly or to provide for thermal expansion tolerance during process chamber conditioning or operation.

As shown in FIG. 1B, a uniform plasma condition can be created in the region between target 12 and substrate 16 in a region overlying substrate 16. A plasma 53 can be created in region 51, which extends under the entire target 12. A central region 52 of target 12 can experience a condition of uniform sputter erosion. As discussed further herein, a layer deposited on a substrate placed anywhere below central region 52 can then be uniform in thickness and other properties (i.e., dielectric, optical index, or material concentrations). In some embodiments, target 12 is substantially planar in order to provide uniformity in the film deposited on substrate 16. In practice, planarity of target 12 can mean that all portions of the target surface in region 52 are within a few millimeters of a planar surface, and can be typically within 0.5 mm of a planar surface.

Figure 3:
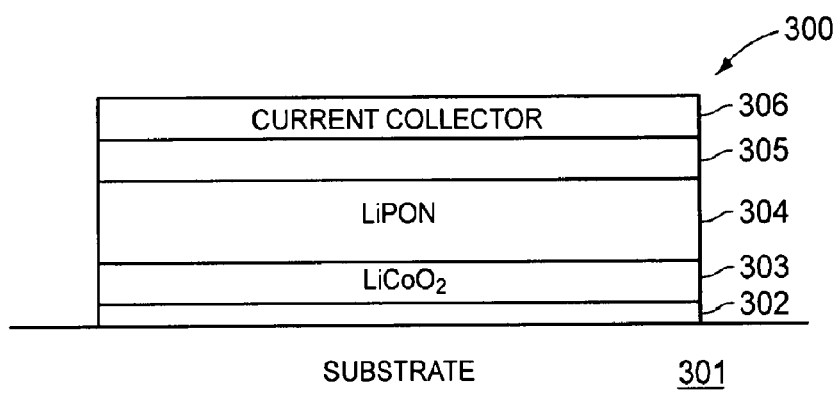
FIG. 3 illustrates a thin-film battery design according to some embodiments of the present invention.

FIG. 3 shows a battery structure with a $LiCoO_2$ layer deposited according to some embodiments of the present invention. As shown in FIG. 3, a metallic current collection layer 302 is deposited on a substrate 301. In some embodiments, current collection layer 302 can be patterned in various ways before deposition of a $LiCoO_2$ layer 303. Also according to some embodiments, $LiCoO_2$ layer 303 can be a deposited crystalline layer. In some embodiments of the invention, layer 303 is crystalline without the necessity of a crystallizing heat treatment. Therefore, substrate 301 can be a silicon wafer, titanium metal, alumina, or other conventional high temperature substrate, but may also be a low temperature material such as plastic, glass, or other material that may be susceptible to damage from the high temperature crystallizing heat treatment. This feature can have the great advantage of decreasing the expense and weight of battery structures formed by the present invention. The low temperature deposition of the $LiCoO_2$ allows for successive depositions of battery layers, one upon another. Such a process would have the advantage that successive layers of battery structure would be obtained in a stacked condition without the inclusion of a substrate layer. The stacked layered battery would provide higher specific energy density as well as low impedance operation for charging and discharging.

In some embodiments, an oxide layer can be deposited on substrate 301. For example, a silicon oxide layer can be deposited on a silicon wafer. Other layers can be formed between conducting layer 302 and substrate 301.

As further shown in FIG. 3, a LiPON layer 304 ($Li_xPO_yN_z$) is deposited over $LiCoO_2$ layer 303. LiPON layer 304 is the electrolyte for battery 300 while $LiCoO_2$ layer 303 acts as the cathode. A metallic conducting layer 305 can be deposited over the LiPON layer 304 in order to complete the battery. Metallic conducting layer 305 can include lithium adjacent to LiPON layer 304.

An anode 305 is deposited over LiPON layer 304. Anode 305 can be, for example an evaporated lithium metal. Other materials such as, for example, nickel can also be utilized. A current collector 306, which is a conducting material, is then deposited over at least a portion of anode 305.

A Li based thin film battery operates by transport of Li ions in the direction from current collector 306 to current collector 302 in order to hold the voltage between current collector 306 and current collector 302 at a constant voltage. The ability for battery structure 300 to supply steady current, then, depends on the ability of Li ions to diffuse through LiPON layer 304 and $LiCoO_2$ layer 303. Li transport through bulk cathode $LiCoO_2$ layer 303 in a thin film battery occurs by the way of grains or grain boundaries. Without being restricted in this disclosure to any particular theory of transport, it is believed that the grains with their planes parallel to substrate 302 will block the flow of Li ions while grains oriented with planes perpendicular to substrate 301 (i.e., oriented parallel to the direction of Li ion flow) facilitate the Li diffusion. Therefore, in order to provide a high-current battery structure, $LiCoO_2$ layer 303 should include crystals oriented in the (101) direction or (003) direction.

In accordance with the present invention, $LiCoO_2$ films can be deposited on substrate 302 with a pulsed-DC biased PVD system as was described above. In addition, an AKT 1600 PVD system can be modified to provide an RF bias, which is available in the Pheonix system, and an Advanced Energy Pinnacle plus 10K pulsed DC power supply can be utilized to provide power to a target. The pulsing frequency of the power supply can vary from about 0 to about 350 KHz. The power output of the power supply is between 0 and about 10 kW. A target of densified $LiCoO_2$ tiles having a resistivity in the range of about 3 to about 10 k$\Omega$ can be utilized with dc-sputtering.

In some embodiments, $LiCoO_2$ films are deposited on Si wafers. Gas flows containing Oxygen and Argon can be utilized. In some embodiments, the Oxygen to Argon ratio ranges from 0 to about 50% with a total gas flow of about 80 sccm. The pulsing frequency ranges from about 200 kHz to about 300 kHz during deposition. RF bias can also be applied to the substrate. In many trials, the deposition rates vary from about 2 Angstrom/(kW sec) to about 1 Angstrom/(kW sec) depending on the $O_2$/Ar ratio as well as substrate bias.

Table I illustrates some example depositions of $LiCoO_2$ according to the present invention. XRD (x-Ray Diffraction) results taken on the resulting thin films illustrate that films deposited according to the present invention are crystalline films, often with highly textured grain sizes as large as about 150 nm. The dominant crystal orientation appears to be sensitive to the $O_2$/Ar ratio. For certain $O_2$/Ar ratios (~10%), as-deposited films exhibit a preferred orientation in the (101) direction or the (003) direction with poorly developed (003) planes.

Figure 4A:
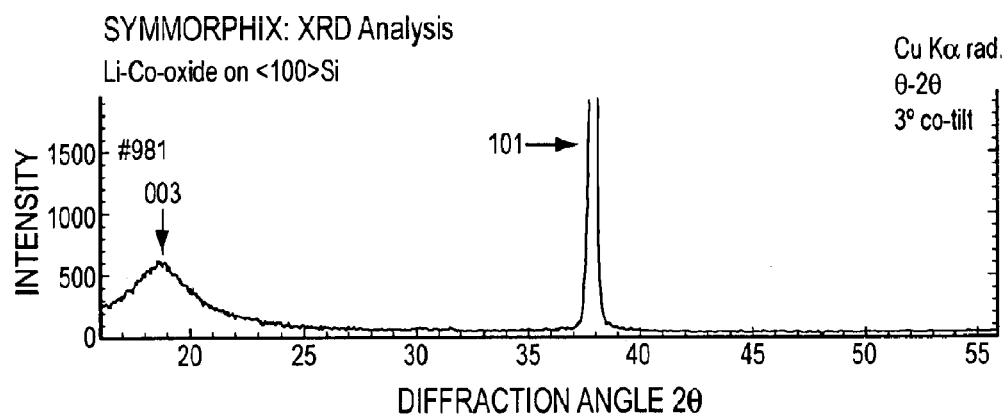
FIGS. 4A and 4B show an x-ray diffraction analysis of and an SEM photograph of a LiCoO$_2$ film deposited according to embodiments of the present invention.
Figure 4B:
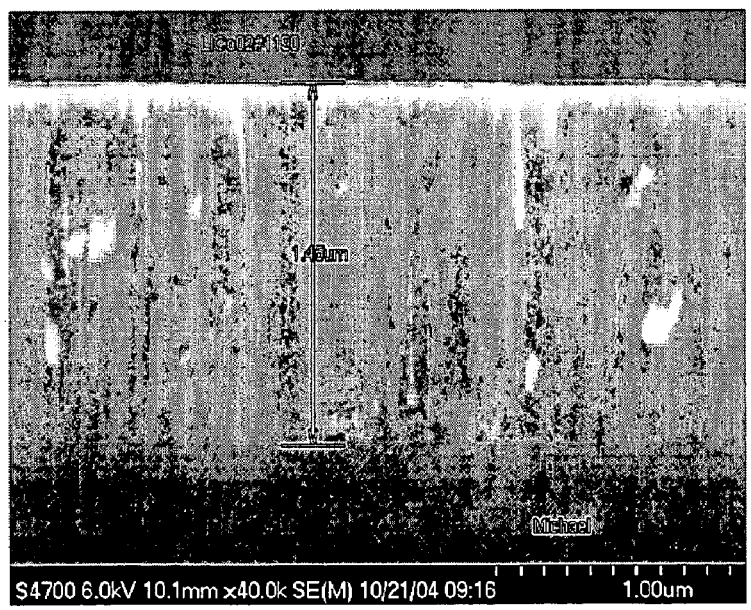

FIGS. 4A and 4B illustrate an XRD Analysis and SEM cross section, respectively, of the $LiCoO_2$ film deposited as Example 15 in Table I. Such a $LiCoO_2$ film was deposited on Si wafer with 2 kW of target power, a frequency of 300 kHz, with 60 sccm Ar and 20 sccm of $O_2$ for a substrate with an initial temperature of about 30° C. As shown in the XRD analysis of FIG. 4A, a strong (101) peak is indicated showing a strong orientation of $LiCoO_2$ crystals in the desired (101) crystallographic direction. The SEM cross section shown in FIG. 4B further shows the columnar structure of the film having the (101) direction and the grain boundaries of the resulting $LiCoO_2$ crystals.

FIGS. 5A through 5F show SEM cross sections of further example depositions of $LiCoO_2$ crystals according to the present invention. In each of the examples, deposition of the $LiCoO_2$ film was performed on a Si wafer with target power of about 2 kW and frequency of about 250 kHz. The $LiCoO_2$ film shown in FIG. 5A corresponds to the example deposition Example 1 in Table I. In the deposition of the $LiCoO_2$ film shown in FIG. 5A, no bias power was utilized with an argon flow rate of about 80 sccm and an oxygen flow rate of about 0 sccm. A deposition rate of about 1.45 µm/hr was achieved over the full substrate area of 400×500 mm. Further, as is indicated in the cross section shown in FIG. 5A, a (101) orientation of the $LiCoO_2$ was achieved.

Figure 5A:
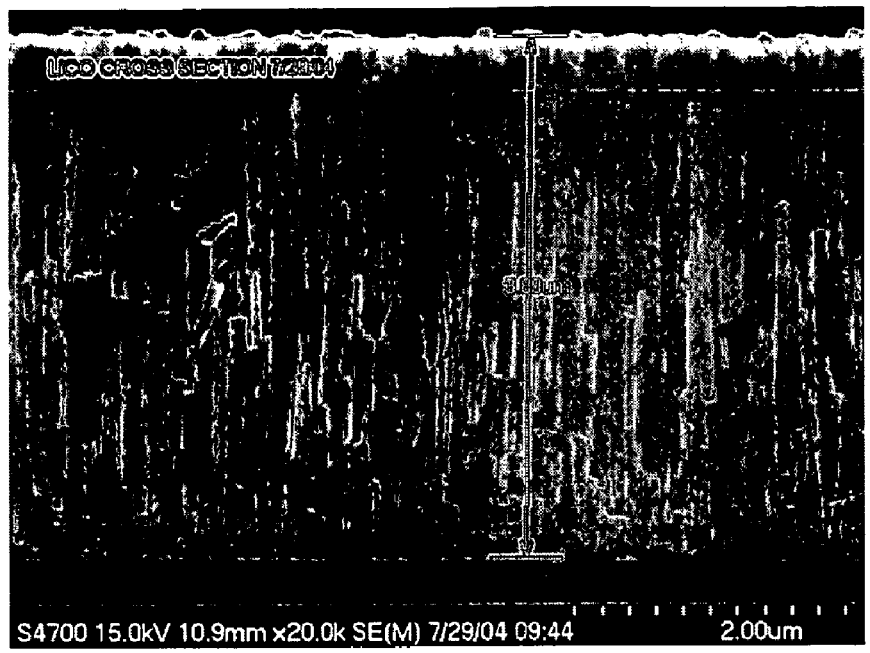
FIGS. 5A through 5F show SEM photographs of LiCoO$_2$ films according to some embodiments of the present invention.

The rate of deposition of the $LiCoO_2$ layer shown in FIG. 5A is very high, likely due to the relatively high conductivity or low resistivity of the ceramic $LiCoO_2$ oxide sputter target. A target resistance of 10 kOhms was measured by means of an Ohm meter over a distance of about 4 cm on the surface of target 12. This high rate allows the manufacture of the 3 micron or thicker $LiCoO_2$ layer required for the battery at high rate over a wide area in short times, resulting in very high productivity and very low cost. Target resistance on the order of about 500 k$\Omega$ over the same distance by the same measurement technique or higher would not allow for such a high sputter efficiency or high rate of deposition at such a low target power. The resistance of conventional target materials can be unmeasurably high. A resistance of 100 k$\Omega$ over about 4 cm of surface will result in high sputter efficiency and high rate of deposition. Further, because deposition rates typically scale nearly linearly with target power, a deposition at 6 kW will yield a deposition rate of approximately 3 µm/hr, which is a very desirable rate of deposition for manufacturability of Li-based thin-film solid-state batteries on a surface area of 400×500 mm².

Figure 5B:
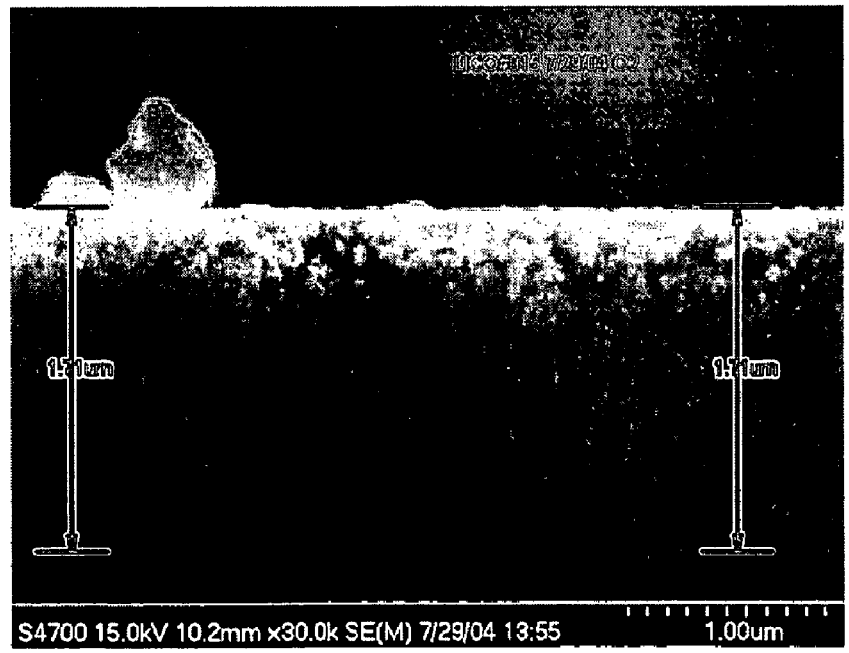

The $LiCoO_2$ layer shown in FIG. 5B is deposited under the conditions listed as Example 7 in Table I. Again, no bias was utilized in the deposition. An argon flow rate of about 72 sccm and an oxygen flow rate of about 8 sccm was utilized. The deposition rate was significantly reduced to about 0.85 µm/hr. Further, although a (101) crystallinity can be discerned, that (101) crystallinity is not as pronounced as that exhibited in the deposition of the film shown in FIG. 5A.

Figure 5C:
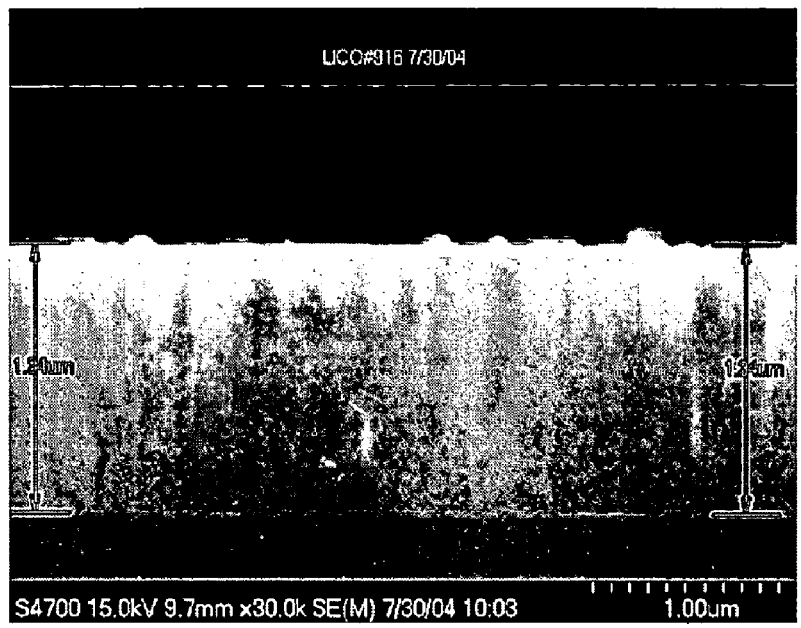

The $LiCoO_2$ film shown in FIG. 5C was deposited according to Example 3 in Table I. In this deposition, 100 W of bias power is applied to the substrate. Further, an argon flow rate of 72 sccm, and an oxygen flow rate of 8 sccm was utilized. The deposition rate was about 0.67 µm/hr. Therefore, the application of bias in comparison with the $LiCoO_2$ film shown in FIG. 5B further reduced the deposition rate (from 0.85 µm/hr of the example shown in FIG. 5B to 0.67 µm/hr of the example shown in FIG. 5C). Further, the desired (101) directionality of formed crystals appears to be further degraded.

Figure 5D:
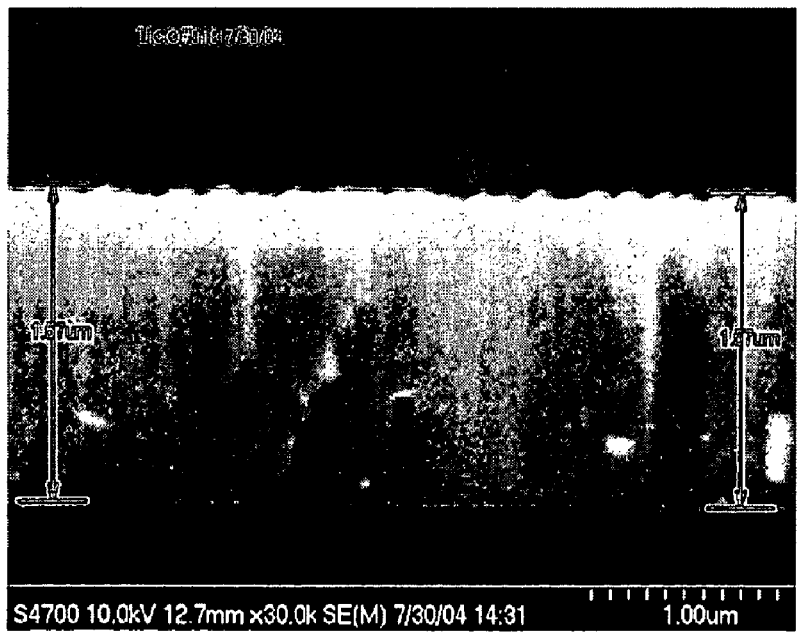

The $LiCoO_2$ film shown in FIG. 5D corresponds to Example 4 in Table I. In this deposition, the Ar/$O_2$ ratio was increased. As is shown in FIG. 5D, increasing the Ar/$O_2$ ratio improves crystallinity. With respect to the example illustrated in FIG. 5C, the deposition illustrated in FIG. 5D was performed with an argon flow of about 76 sccm and an oxygen flow of about 4 sccm as well as retaining the 100 W bias to the substrate. The LiCoO$_2$ deposition rate was improved to 0.79 µm/hr from a rate of 0.67 µm/hr illustrated in FIG. 5C.

Figure 5E:
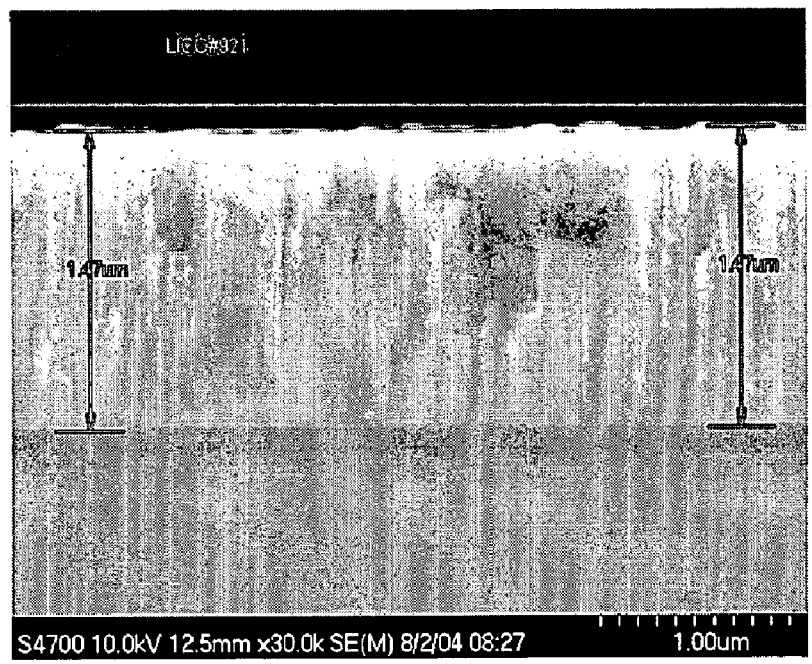

In the example deposition illustrated in FIG. 5E corresponding to Example 5 in Table I. The substrate temperature was set at about 200° C. while the bias power remained at about 100 W. The argon flow rate was set at about 76 sccm and the oxygen flow rate was set at about 4 sccm. The resulting deposition rate for the LiCoO$_2$ layer was about 0.74 µm/hr.

Figure 5F:
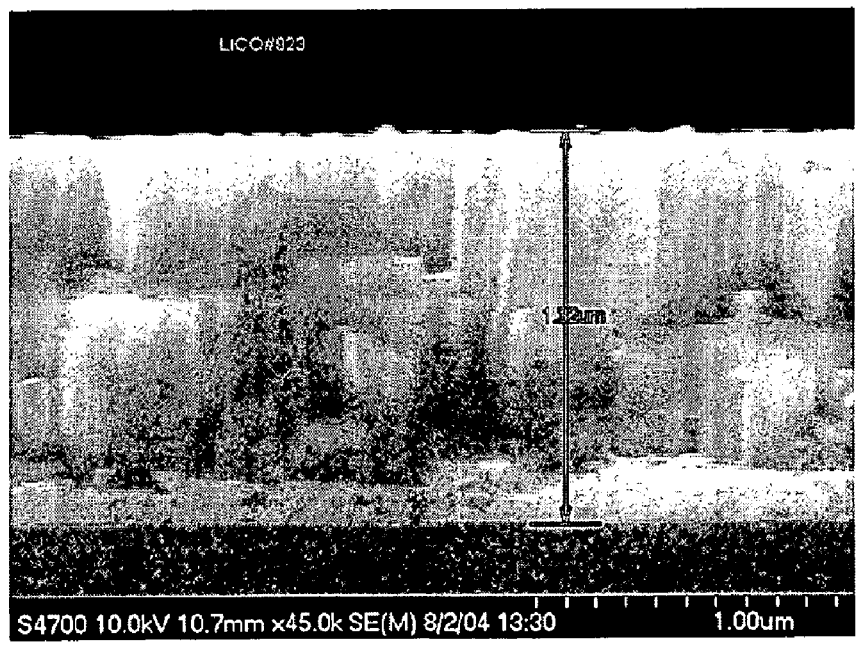

In the example deposition illustrated in FIG. 5F corresponds with example 6. The argon flow rate was set at about 74 sccm and the oxygen flow rate was set at about 6 sccm, resulting in a LiCoO$_2$ deposition rate of about 0.67 µm/hr. Therefore, increasing both argon and oxygen flow rate over the deposition illustrated in FIG. 5E resulted in a lower deposition rate.

Figure 5G:
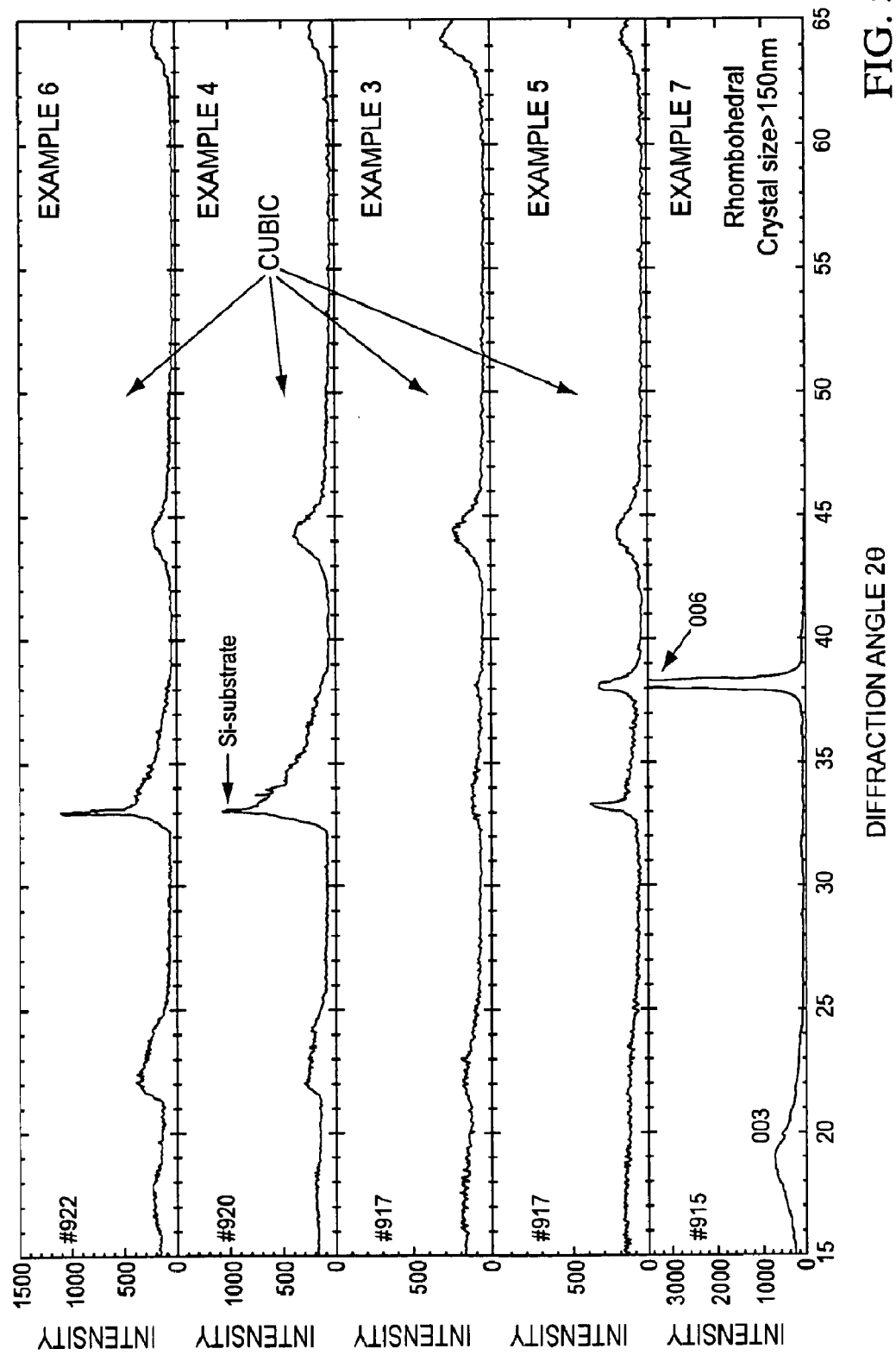
FIG. 5G shows x-ray diffraction data corresponding to the depositions shown in FIGS. 5B-F.

FIG. 5G illustrates XRD data corresponding to FIGS. 5F, 5D, 5C, 5E, and 5B, respectively. As illustrated in FIG. 5G, as-deposited crystalline LiCoO$_2$ is deposited in these processes.

The data show clearly that an as-deposited crystalline film of LiCoO$_2$ can be obtained under several of the process conditions, as shown in Table II. In particular, very high rates of deposition with low power are obtained along with the oriented crystalline structure for the process conditions according to embodiments of the present invention.

Figure 6A:
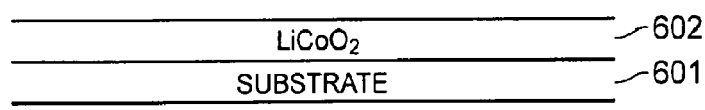
FIG. 6A illustrates a layer of LiCoO$_2$ deposited according to some embodiments of the present invention on a thin substrate.
Figure 6B:
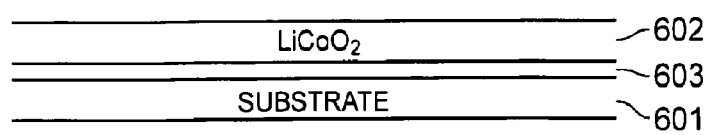
FIG. 6B illustrates a layer of LiCoO$_2$ deposited according to some embodiments of the present invention over a conducting layer on a thin substrate.

FIG. 6A illustrates a layer of LiCoO$_2$ 602 deposited on a thin substrate 601 according to some embodiments of the present invention. Higher lithium-ion mobilities can be achieved utilizing crystalline LiCoO$_2$ cathode films 602 deposited on a thin substrate 601 that has thickness comparable to that of the battery stack itself, rather than a thickness many or tens of times that of the battery stack. Such a film can lead to faster charging and discharging rates. Substrate 601 can be formed of a thin metallic sheet (e.g., aluminum, titanium, stainless steel, or other suitable thin metallic sheet), can be formed of a polymer or plastic material, or may be formed of a ceramic or glass material. As shown in FIG. 6B, if substrate 601 is an insulating material, a conducting layer 603 can be deposited between substrate 601 and LiCoO$_2$ layer 602.

Figure 7A:
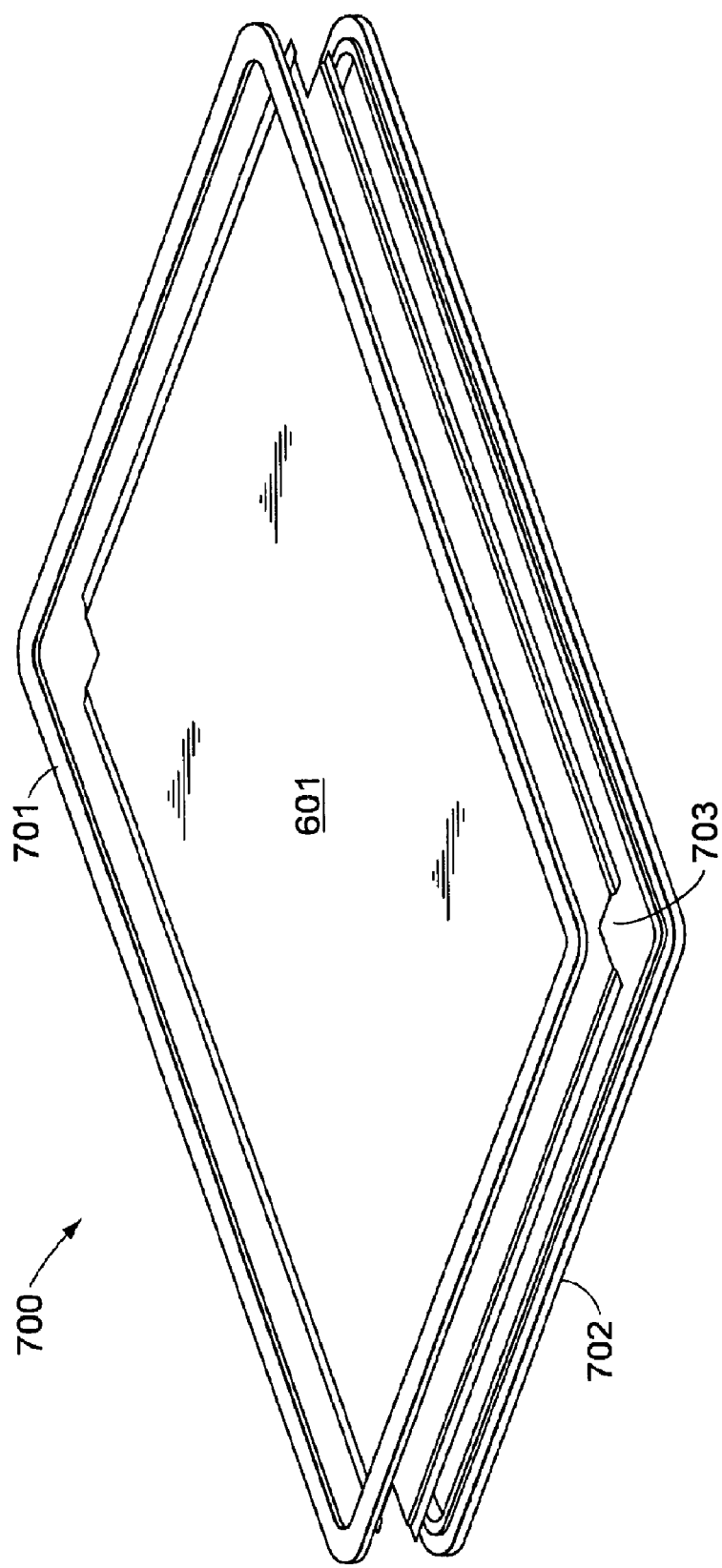
FIGS. 7A, 7B, 7C, and 7D illustrate a thin substrate mount and mask arrangement that can be utilized in the deposition of LiCoO$_2$ layers deposited according to some embodiments of the present invention.
Figure 7B:
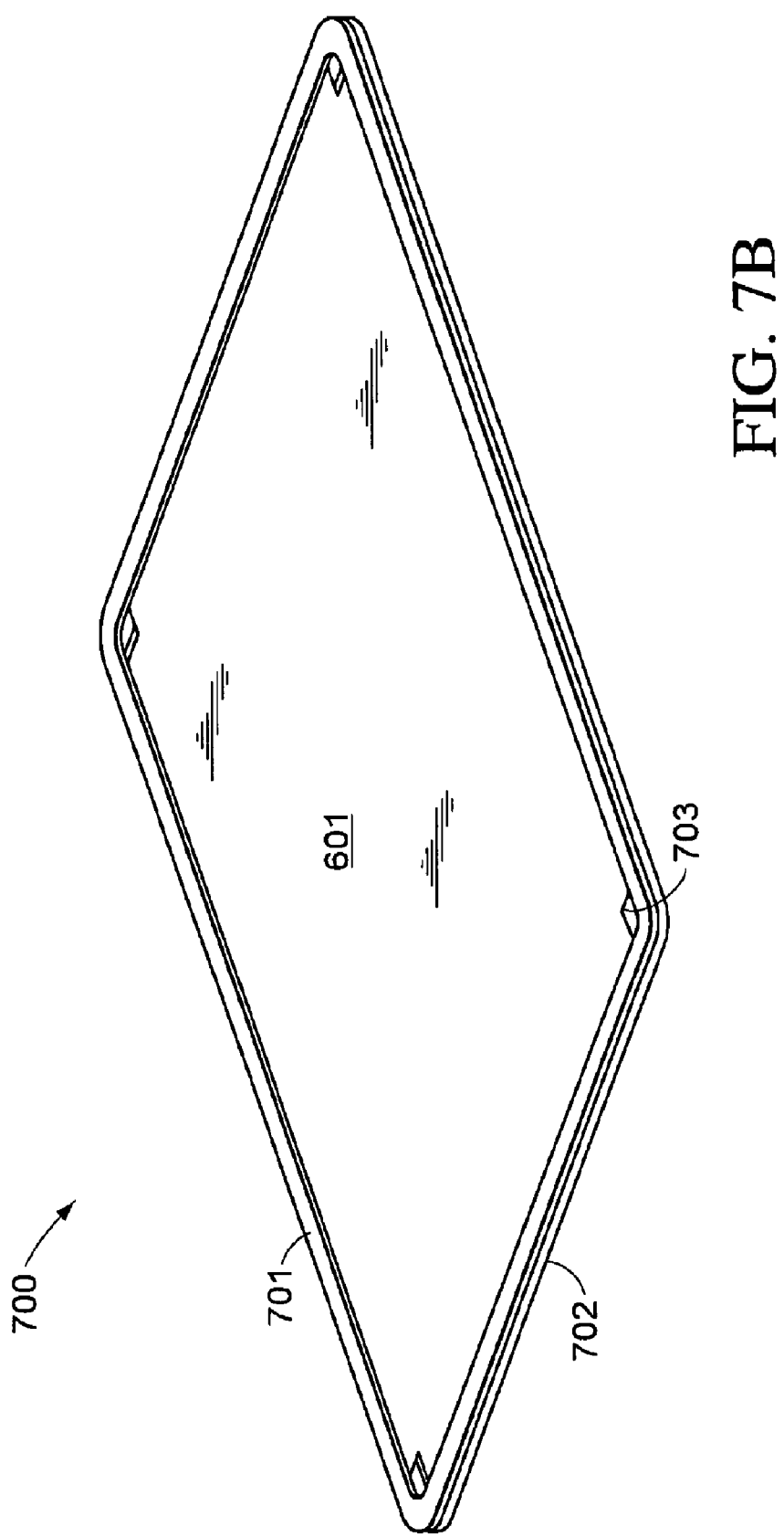

Depositing materials on a thin substrate involves holding and positioning the substrate during deposition. FIGS. 7A, 7B, 7C, and 7D illustrate a reusable fixture 700 for holding a thin film substrate. As shown in FIG. 7A, reusable fixture 700 includes a top portion 701 and a bottom portion 702 that snap together. Thin substrate 601 is positioned between top portion 701 and bottom portion 702. As shown in FIG. 7B, top portion 701 and bottom portion 702 are such that substrate 601 is brought into tension and subsequently clamped as top portion 701 is closed into bottom portion 702. Substrate 601 can be easily held by fixture 700 so that substrate 601 can be handled and positioned. In some embodiments, the corners of substrate 601, areas 703, are removed so that substrate 601 is more easily stretched by avoiding "wrap-around" corner clamping effects when top portion 701 is closed into bottom portion 702.

Figure 7C:
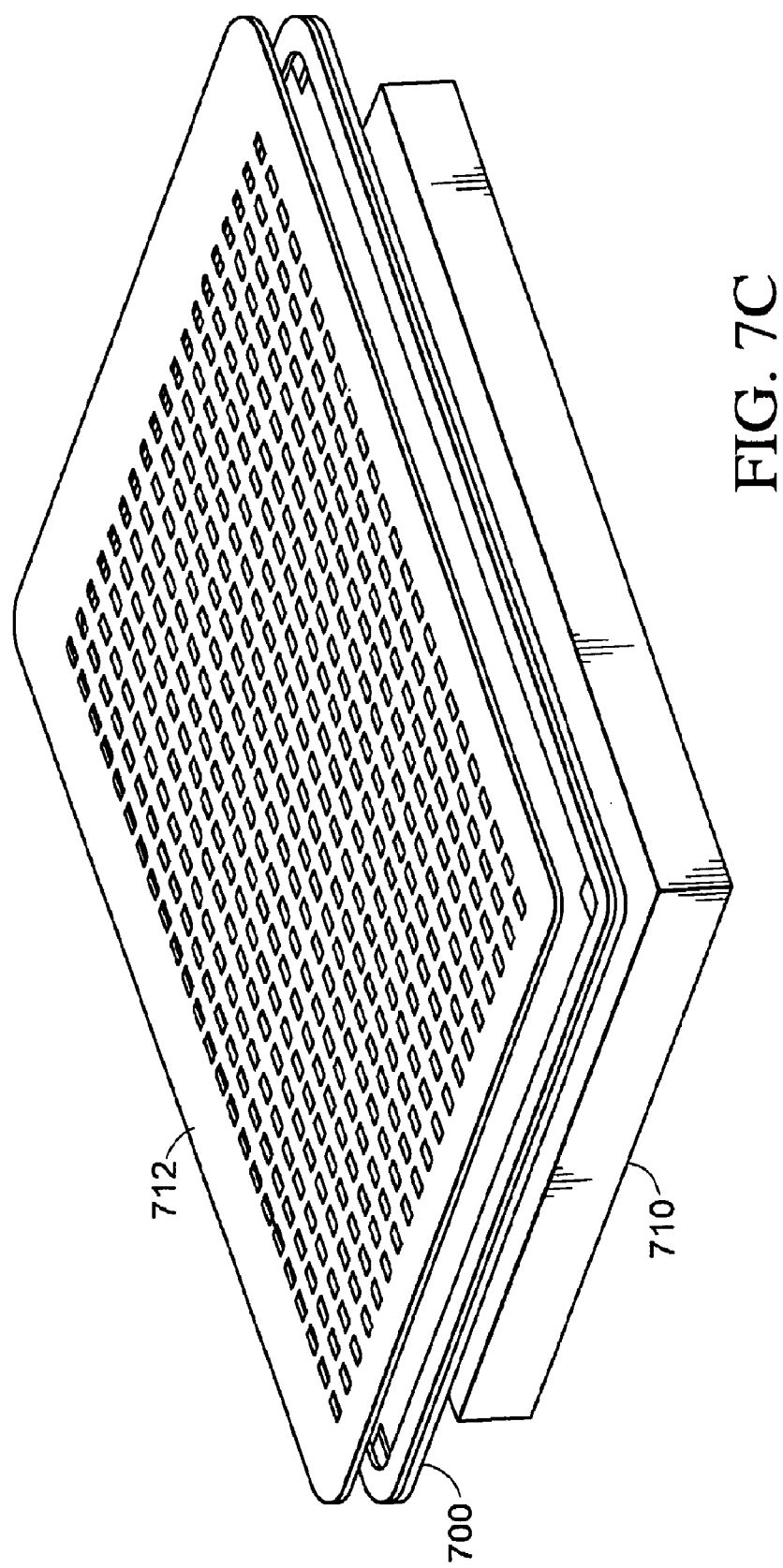

As shown in FIG. 7C, a mask 712 can be attached to fixture 700. In some embodiments, fixture 700 includes guides in order to align fixture 700 with respect to mask 712. In some embodiments, mask 712 may be attached to fixture 700 and travel with fixture 700. Mask 712 can be positioned at any desired height above substrate 601 in fixture 700. Therefore, mask 712 can function as either a contact or proximity mask. In some embodiments, mask 712 is formed of another thin substrate mounted in a fixture similar to fixture 700.

Figure 7D:
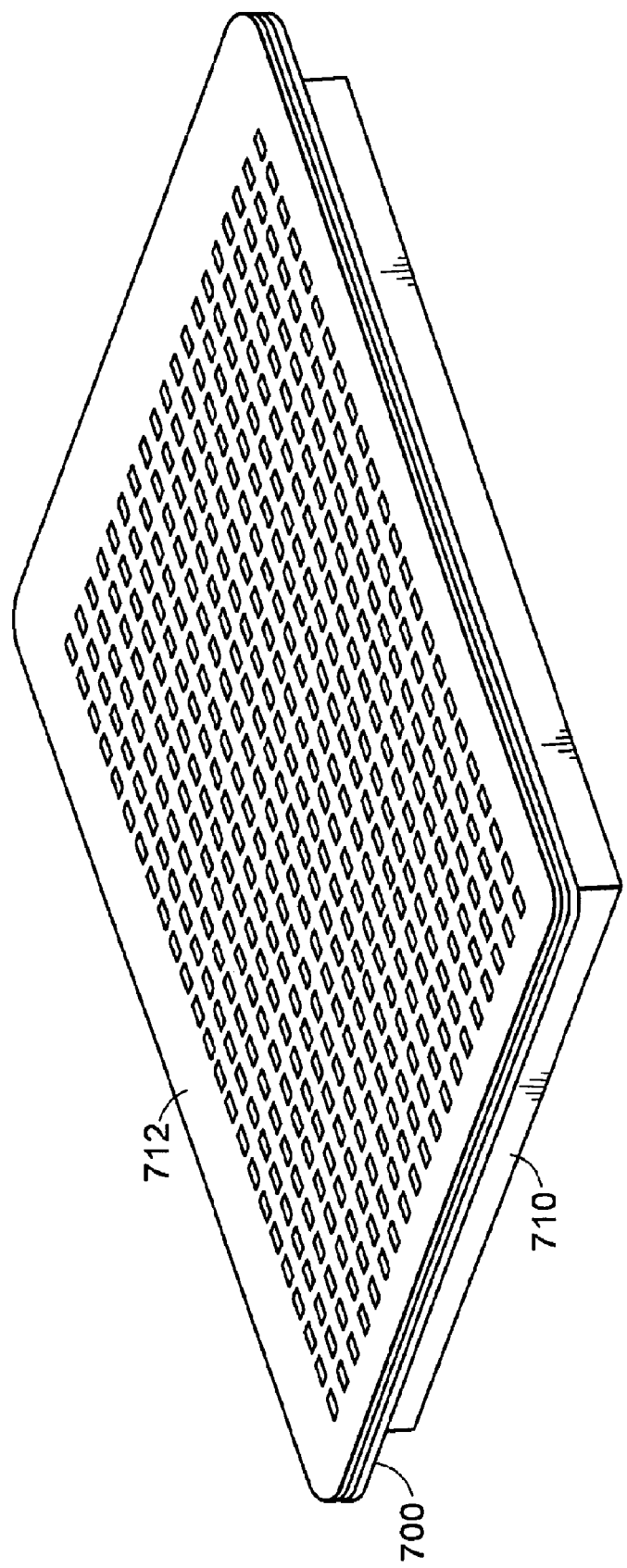

As shown in FIG. 7C and 7D, fixture 700 and mask 712 can be positioned relative to mount 710. Mount 710, for example, can be a susceptor, mount, or an electrostatic chuck of a processing chamber such as that shown in FIGS. 1A and 1B. Fixture 700 and mask 712 can have features that allow for ready alignment with respect to each other and with respect to mount 710. In some embodiments, mask 712 is resident in the processing chamber and aligned with fixture 700 during positioning of fixture 700 on mount 710, as shown in FIG. 7D.

Utilizing fixture 700 as shown in FIGS. 7A, 7B, 7C, and 7D allows processing of a thin film substrate in a processing chamber. In some embodiments, thin film substrates can be about 10 µm or more. Further, thin film substrate 601, once mounted within fixture 700, can be handled and moved from process chamber to process chamber. Therefore, a multiprocessor chamber system can be utilized to form stacks of layers, including one or more layers of LiCoO$_2$ deposited according to embodiments of the present invention.

Figure 8:
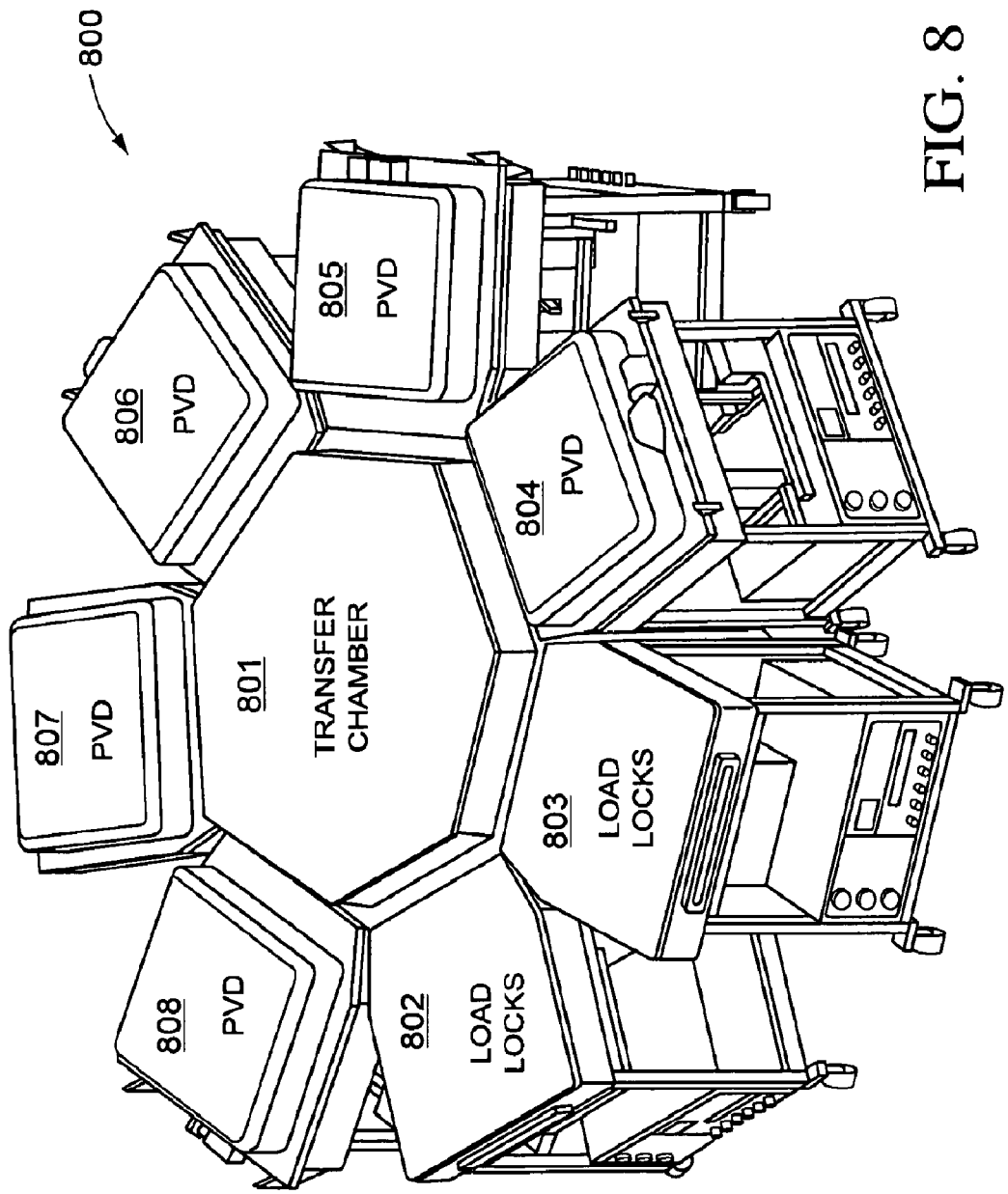
FIG. 8 illustrates a cluster tool that can be utilized to form batteries with LiCoO$_2$ layers deposited according to some embodiments of the present invention.

FIG. 8 illustrates a cluster tool 800 for processing thin film substrates. Cluster tool 800 can, for example, include load lock 802 and load lock 803, through which mounted thin film substrate 601 is loaded and a resultant device is removed from cluster tool 800. Chambers 804, 805, 806, 807, and 808 are processing chambers for depositions of materials, heat treatments, etching, or other processes. One or more of chambers 804, 805, 806, 807, and 808 can be a pulsed-DC PVD chamber such as that discussed above with respect to FIGS. 1A and 1B and within which a LiCoO$_2$ film deposited according to embodiments of the present invention may be deposited.

Processing chambers 804, 805, 806, 807, and 808 as well as load locks 802 and 803 are coupled by transfer chamber 801. Transfer chamber 801 includes substrate transfer robotics to shuttle individual wafers between processing chambers 804, 805, 806, 807, and 808 and load locks 802 and 803.

In production of a conventional thin-film battery, ceramic substrates are loaded into load lock 803. A thin metallic layer can be deposited in chamber 804, followed by a LiCoO$_2$ deposition performed in chamber 805. The substrate is then removed through load lock 803 for an in-air heat treatment external to cluster tool 800. The treated wafer is then reloaded into cluster tool 800 through load lock 802. A LiPON layer can be deposited in chamber 806. The wafer is then again removed from cluster tool 800 for deposition of the lithium anode layer, or sometimes chamber 807 can be adapted to deposition of the lithium anode layer. A second metallic layer is deposited in chamber 808 to form a charge collector and anode collector. The finished battery structure is then offloaded from cluster tool 800 in load lock 802. Wafers are shuttled from chamber to chamber by robotics in transfer chamber 801.

A battery structure produced according to the present invention could utilize thin film substrates loaded in a fixture such as fixture 700. Fixture 700 is then loaded into load lock 803. Chamber 804 may still include deposition of a conducting layer. Chamber 805 then includes deposition of a LiCoO$_2$ layer according to embodiments of the present invention. A LiPON layer can then be deposited in chamber 806. Chamber 807 may still be adapted to deposition of a lithium rich material such as lithium metal and chamber 808 can be utilized for deposition of the conducting layer of the current collector. In this process, no heat treatment is utilized to crystallize the LiCoO$_2$ layer.

Another advantage of a thin film battery process is the ability to stack battery structures. In other words, substrates loaded into cluster tool 800 may traverse process chambers 804, 805, 806, 807, and 808 multiple times in order to produce multiply stacked battery structures. FIGS. 9A and 9B illustrates such structures.

FIG. 9A illustrates a parallel coupled stacking. As shown in FIG. 9A, a substrate 601, which for example can be a plastic substrate, is loaded into load lock 803. A conducting layer 603, for example about 2 µm of aluminum, copper, iridium or other material, acts as a bottom current collector. Conducting layer 603, for example, can be deposited in chamber 804. A $LiCoO_2$ layer 602 is then deposited on conducting layer 603. $LiCoO_2$ layer 602 can be about 3-10 µm and can be deposited in chamber 805 according to embodiments of the present invention. The wafer can then be moved to chamber 806 where a LiPON layer 901 of thickness of about 0.5 to about 2 µm. In chamber 807, an anode layer 902, for example a lithium metal layer of up to about 10 µm, can then be deposited in chamber 807. A second conducting layer 903 can then be deposited over anode layer 902. A second battery stack can then be deposited over the first battery stack formed by metal layer 603, LiCoO2 layer 602, LiPON layer 901, lithium layer 902, and current collection conduction layer 903. Over current collection conducting layer 903, another lithium layer 902 is formed. Another LiPON layer 901 is formed over lithium layer 902. Another LiCoO2 layer 602 is formed over LiPON layer 901 and finally another metal layer 603 is formed over LiCoO2 layer 602. In some embodiments, further stackings can be formed. In some embodiments, metal layers 603 and 903 differ in the mask utilized in deposition so that tabs are formed for electrical coupling of layers.

As discussed above, any number of individual battery stacks can be formed such that parallel battery formations are formed. Such a parallel arrangement of battery stacking structure can be indicated as Current collector/LiCoO2/LiPON/Anode/current collector/Anode/LiPON/LiCoO2/current collector/LiCoO2 . . . /current collector. FIG. 9B illustrates an alternative stacking corresponding to the battery structure current collector/LiCoO2/LiPON/anode/current collector/LiCoO2/LiPON/anode/current collector . . . /current collector. In this case, a series arrangement battery stacking structure is formed.

To form the structures shown in FIGS. 9A and 9B, substrates are rotated again through the chambers of cluster tool 800 in order to deposit the multiple sets of batteries. In general, a stack of any number of batteries can be deposited in this fashion.

In some embodiments, stoichiometric $LiCoO_2$ can be deposited on iridium. FIGS. 10A through 10D illustrate an anneal procedure for Li—Co deposition over an iridium layer that has been deposited on a (100) Si wafer. The $LiCoO_2$ deposition was accomplished as discussed above with a target power of 2 kW, no bias power, reverse time of 1.6 µs, a pulsing frequency of 300 kHz, with 60 sccm Ar flow and 20 sccm of $O_2$ flow, with no pre-heat for 7200 sec. As a result, a layer of $LiCoO_2$ of about 1.51 µm was deposited.

FIGS. 10A through 10D show XRD analysis of both as-deposited and annealed layers of $LiCoO_2$ deposited as discussed above. The XRD analysis of the as-deposited layer demonstrates a shallow peak at $2\theta=18.85°$ denoting a (003) orientation of crystalline $LiCoO_2$, a sharper peak at about $2\theta=38.07°$ corresponding with the desired (101) crystallographic direction, and a peak at $2\theta=40.57°$ corresponding to the (111) direction of iridium. However, the position of the (101) $LiCoO_2$ peak indicates that the (101) $LiCoO_2$ peak is nonstoichiometric $LiCoO_2$. In order to be useful as a battery layer, stoichiometric $LiCoO_2$ provides for the best Li transport. One of ordinary skill in the art will notice that careful adjustment of deposition parameters can provide stoichiometric $LiCoO_2$ of desired orientation.

FIG. 10B shows an XRD analysis of the sample shown in FIG. 10A after a 300° C. anneal in air for 2 hours. As shown in FIG. 10B, the XRD peak corresponding to (003) $LiCoO_2$ grows, indicating crystallization of $LiCoO_2$ into the (003) direction. Further, the (101) peak of $LiCoO_2$ shifts slightly to $2\theta=38.53°$, indicating a more stoichiometric crystallization of the (101) $LiCoO_2$. However, the crystalline $LiCoO_2$ is still not stoichiometric after this anneal. One of ordinary skill in the art will notice that longer anneals and/or further adjustment of the deposited stoichiometry may result in usefully oriented stoichiometric $LiCoO_2$ layers with anneal temperatures at 300° C. or less. Consequently, low temperature materials such as polymers, glass, or metal may be utilized as the substrate.

FIG. 10C illustrates an XRD analysis from the sample after a subsequent 500° C. anneal in air for 2 hours. As shown in FIG. 10C, more of the $LiCoO_2$ crystallizes into the (003) layer. Further, the (101) $LiCoO_2$ peak shifts again to $2\theta=39.08°$, indicating crystallization of a (012) layer of $LiCoO_2$. In this case, the (012) $LiCoO_2$ crystal is stoichiometric and therefore allows for efficient Li transport. One of ordinary skill in the art will notice that longer anneals and/or further adjustment of the deposited stoichiometry may result in usefully oriented stoichiometric $LiCoO_2$ layers with anneal temperatures at 500° C. or less. Consequently, low temperature materials such as polymers, glass, or metal may be utilized as the substrate.

FIG. 10D illustrates an XRD analysis of the sample after a subsequent anneal of 700° C. in air for 2 hours. As shown in FIG. 10D, the (003) $LiCoO_2$ peak disappears, but the (012) $LiCoO_2$ peak remains relatively the same as that shown in the 500° anneal illustrated in FIG. 10C.

FIGS. 10A through 10D demonstrate deposition of (101) $LiCoO_2$ at low temperature over an iridium layer. Subsequent anneals to 500° C. may be desired to change the stoichiometry of the (101) $LiCoO_2$ layer, but anneals to 700° C. do not appear to be necessary. With anneal temperatures less than 500° C., depositions of a $LiCoO_2$ layer over a conducting iridium layer can be accomplished on glass, aluminum foil, plastic, or other low temperature substrate material. Anneal temperatures of less than 500° C. but greater than 300° C. or lengthening the time of lower temperature anneals may also result in desired orientations of stoichiometric crystalline $LiCoO_2$.

Figure 11A:
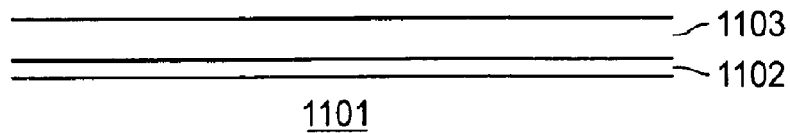
FIGS. 11A through 11D illustrate a single layer battery formed over an iridium layer according to some embodiments of the present invention.

FIGS. 11A through 11D illustrate formation of a single-layer battery according to some embodiments of the present invention. As shown in FIG. 11A, a lift-off layer 1102 can be deposited on a substrate 1101. Further, an iridium layer 1103 can be deposited over lift-off layer 1102. In some embodiments, substrate 1101 can be plastic, glass, Al foil, Si wafer, or any other material. Lift-off layer 1102 can be any lift off layer and can be a polymer layer such as polyimide, an inorganic layer such as $CaF_2$ or carbon, or an adhesive layer that loses its adhesion as a result of, for example, oxidation, heat, or light. Lift-off layers are well known. Iridium layer 1103 can be from about 500 Å or more.

Figure 11B:
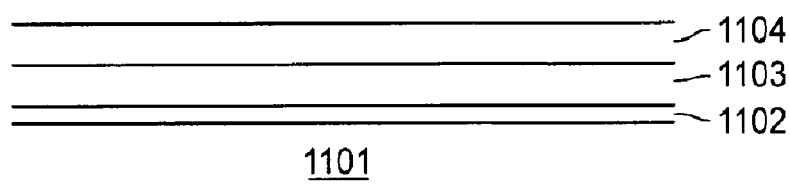

As shown in FIG. 11B, a $LiCoO_2$ layer is deposited over iridium layer 1103 as was discussed above. In some embodiments, an anneal can be performed at this step. In some embodiments, further layers of the battery may be deposited before an anneal step is performed. In some embodiments, a stoichiometric $LiCoO_2$ layer of a useful crystalline orientation may result in the as-deposited $LiCoO_2$ with no further anneals necessary.

Figure 11C:
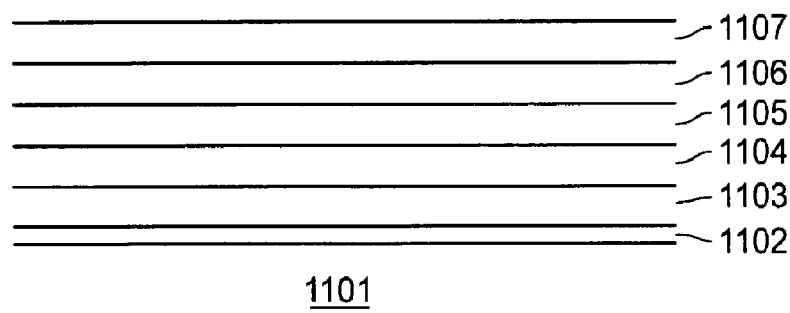

FIG. 11C illustrates deposition of a LiPON layer 1105 over the $LiCoO_2$ layer, deposition of a Li layer 1106 over LiPON layer 1105, and deposition of an electrode layer 1107 over Li layer 1106. In some embodiments, an anneal step of up to 500° C. as discussed above may be performed here.

Figure 11D:
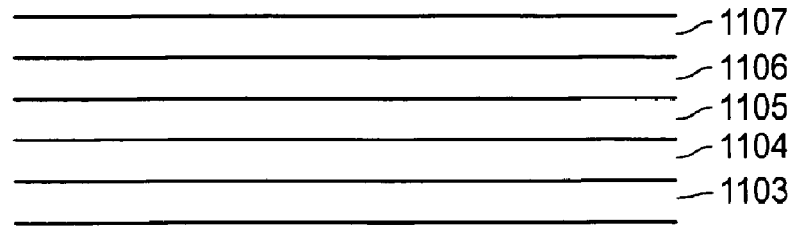

As shown in FIG. 11D, the resulting single-layer battery formed from iridium layer 1103, LiCoO$_2$ layer 1104, LiPON layer 1105, Li layer 1106, and electrode layer 1107 can be "lifted off" from substrate 1101. Such a single-layer battery can be a free-standing battery of thickness about 5 µm or greater. Such a battery, without the requirement of a substrate 1101, is well known to have the potential of energy storage of greater than about 1 kW-hr/liter.

As an alternative to a lift-off process as described in FIGS. 11A through 11D, a substrate may be removed during anneal leaving a single-layer battery. Further, in some embodiments, substrate 1101 can be removed by a solvent, etching, or a photo process. Further, single-layer batteries may be combined or stacked in any fashion to provide a device of greater energy storage at a particular voltage.

FIGS. 12A through 12L illustrate the crystallinity of as-grown and post anneal LiCoO$_2$ layers according to samples 31 and 32 illustrated in Table I. Samples 31 and 32 were formed in the same deposition, utilizing a silicon substrate and an alumina substrate, respectively.

Figure 12A:
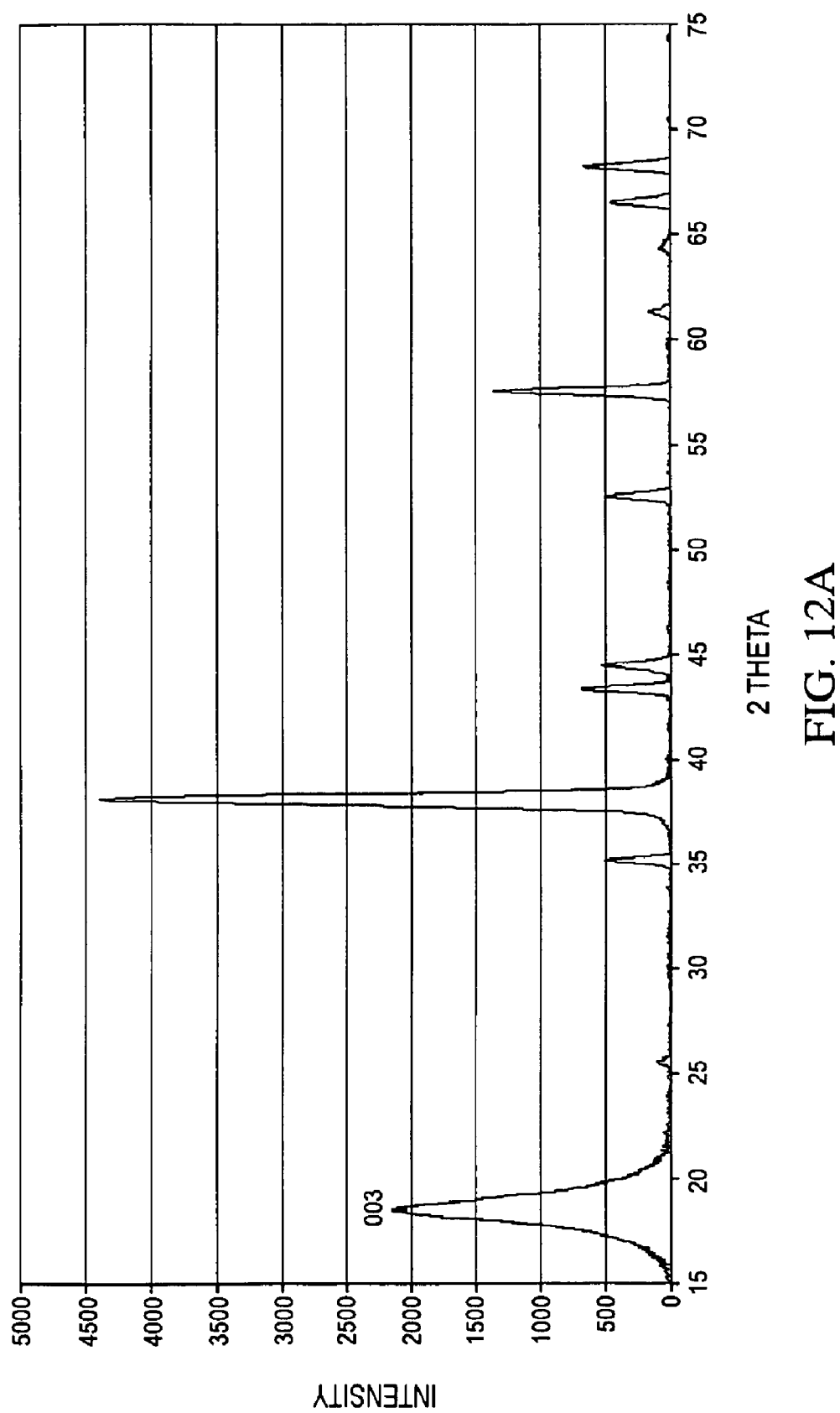

FIG. 12A illustrates an XRD analysis of the as-deposited LiCoO$_2$ film on Al$_2$O$_3$ substrate (Example 32 in Table I). A broad (003) crystalline LiCoO$_2$ peak is observed. The remaining peaks in the analysis, which are not labeled in FIG. 12A, result from the Al$_2$O$_3$ substrate. The (003) peak is characteristic of the layered structure in the as-deposited crystalline LiCoO$_2$ film according to embodiments of the present invention.

Figure 12B:
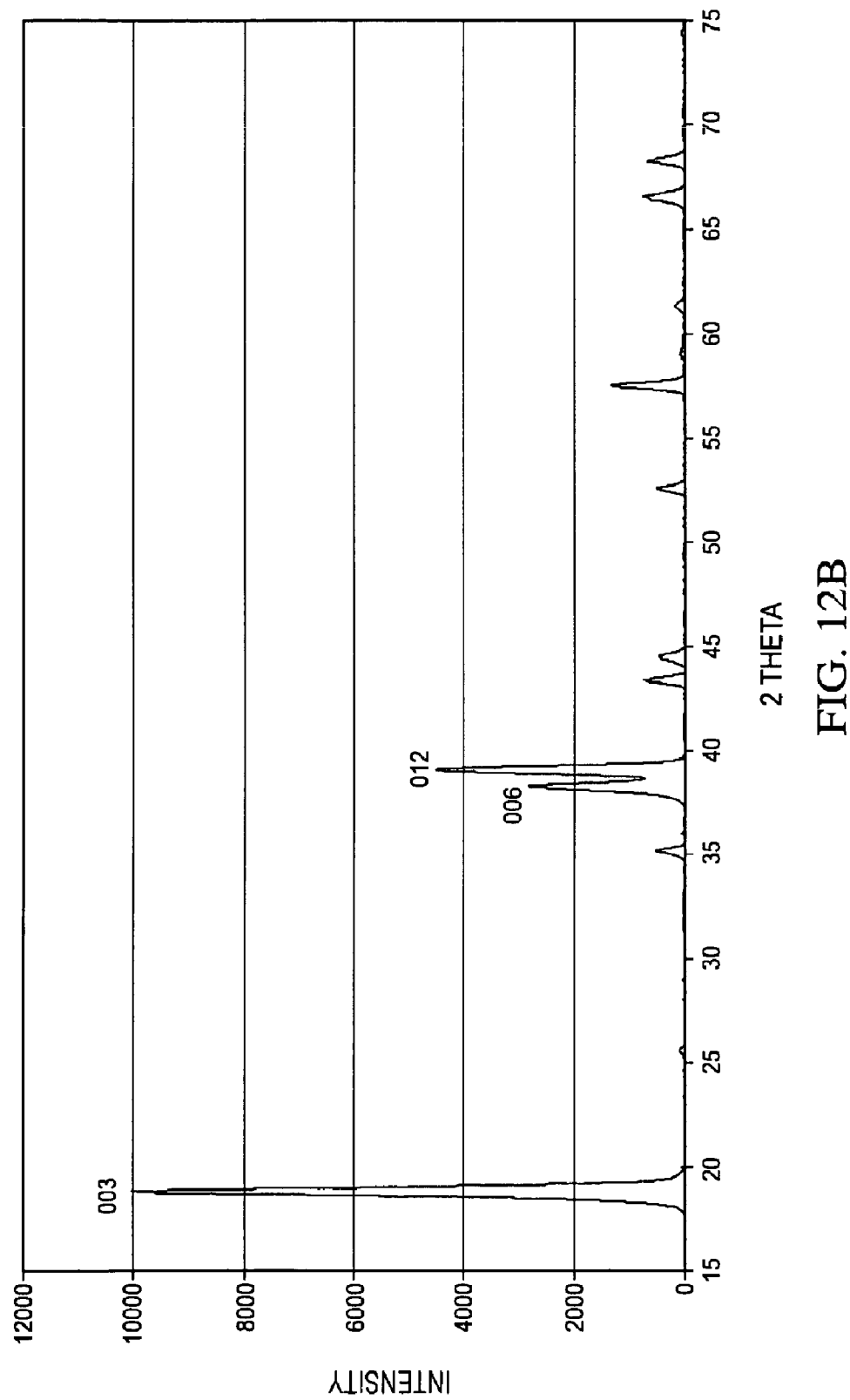
Figure 12D:
Figure 12F:
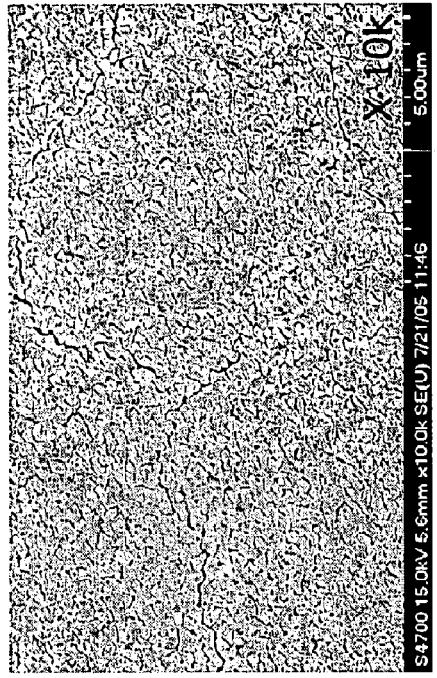
Figure 12C:
Figure 12E:
Figure 12H:
Figure 12J:
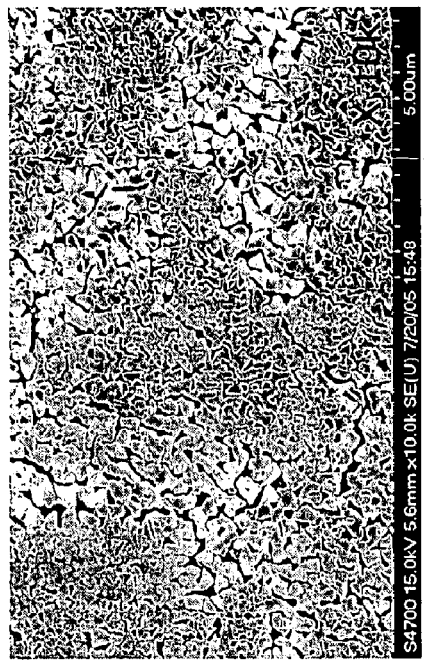
Figure 12G:
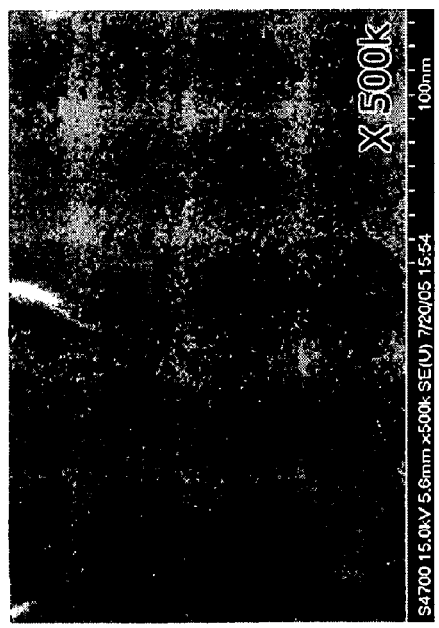
Figure 12I:

FIG. 12B illustrates the crystallinity of the LiCoO2 film shown in FIG. 12A after a 2 hr 700° C. anneal. As shown in FIG. 12B, the (003) peak becomes sharper and higher, indicating better crystallinity. As shown in FIGS. 12G through 12J, in comparison with FIGS. 12C through 12F, the columnar structure ripens with the anneal and the grain size becomes larger with anneal. FIG. 12B also shows (012) and (006) crystallinity peaks.

FIG. 12C through 12F show SEM photos of the granularity of the as-deposited film corresponding to Example 32 in Figure I. FIGS. 12G through 12J show SEM photos of the granularity of the annealed film, as illustrated in FIG. 12B. A comparison of FIGS. 12C through 12F with 12G through 12J illustrate the increased granularity resulting from the anneal process.

FIG. 12K illustrates a fracture cross-section SEM that illustrates the morphology of the as-deposited crystalline film corresponding to Example 31 in Table I. FIG. 12L illustrate a similar cross-section SEM corresponding to the film grown according to Example 32 in Table I.

Figure 13A:
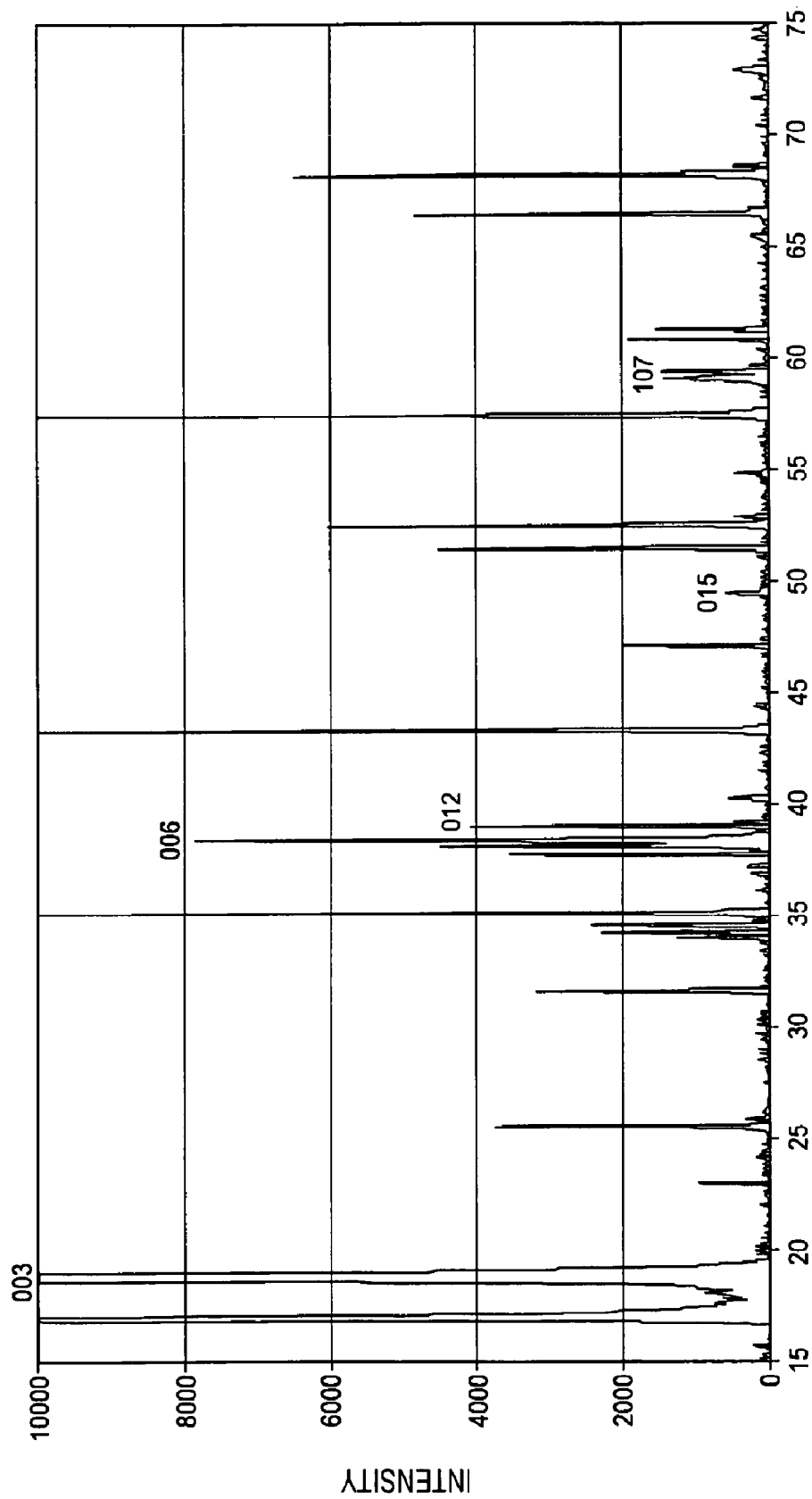
FIGS. 13A through 13F illustrate rapid thermal anneal processes for LiCoO$_2$ layers deposited according to the present invention.
Figure 13B:
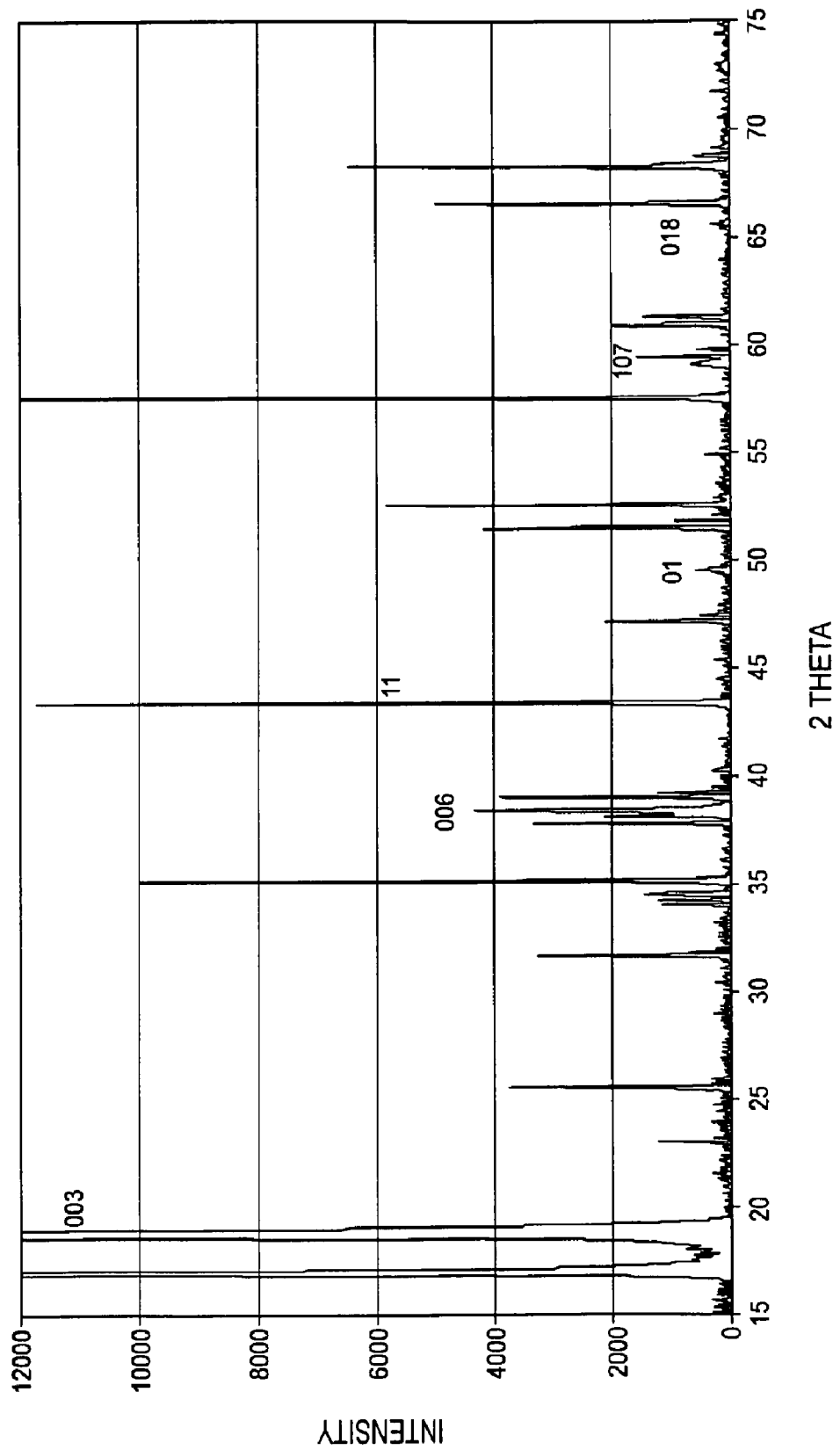

FIGS. 13A through 13J illustrate rapid thermal anneal processes applied to a LiCoO$_2$ layer as in Example 49 of Table I. In that example, LiCoO$_2$ is deposited on alumina with a 2 kW pulsed DC power with no bias. Argon flow as set to 60 sccm and oxygen flow was set to 20 sccm. The deposition parameters are nearly identical with those of Example 32 in Table I, therefore XRD data for the as-deposited films are shown in FIG. 12A. FIG. 13A shows XRD data after a 15 minute 700° C. anneal in an argon atmosphere. Ramp-up time (room temperature to 700° C.) is 45 sec and ramp-down time (700° C. to about 300° C.) occurred over 10 min. At 300° C., the sample is removed from the rapid-thermal-anneal (RTA) oven and cooled in air to room temperature. As shown in FIG. 13A, substantial crystallinity is obtained. FIG. 13B shows XRD data after a RTA as described with FIG. 13A in an argon/oxygen atmosphere. The argon/oxygen ratio was 3:1.

Figure 13C:
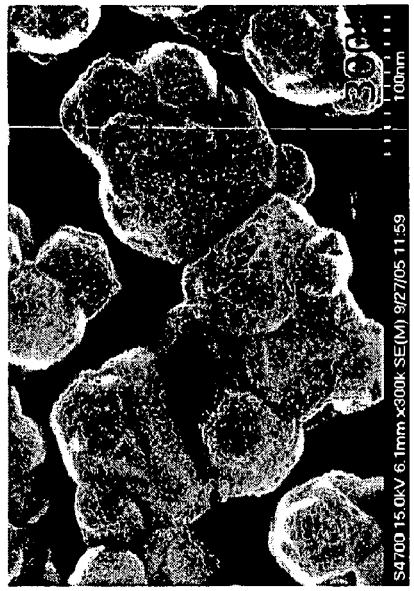
Figure 13D:
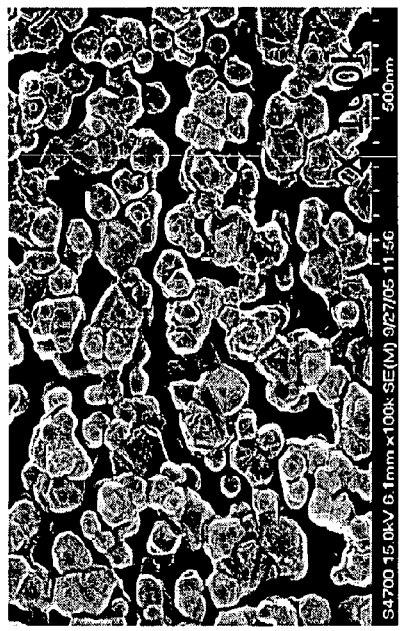
Figure 13E:
Figure 13F:
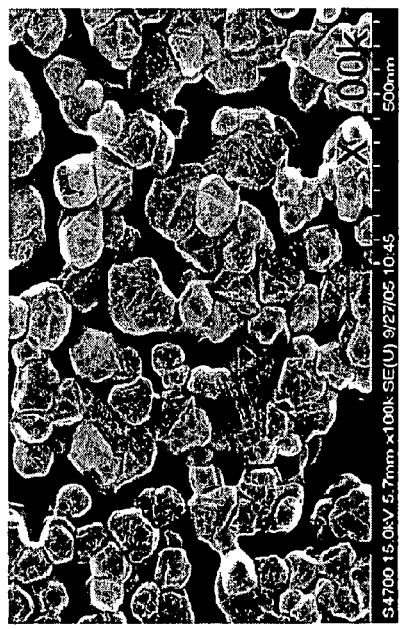

As shown in a comparison of FIGS. 13A and 13B, more crystallinity is observed in an argon only RTA than with a RTA performed in the presence of oxygen. This is further illustrated in a comparison of FIGS. 13C and 13D with FIGS. 13E and 13F. FIGS. 13C and 13D show the granularity of the LiCoO$_2$ film after the RTA illustrated in FIG. 13A. FIGS. 13E and 13F show the granularity of the LiCoO$_2$ film after the RTA illustrated in FIG. 13B. As is observed, the granularity shown in FIGS. 13C and 13D (which differ in magnification) is better than that shown in FIGS. 13E and 13F (which also differ in magnification).

FIGS. 14A through 14D illustrate several anneal processes with the Example 37 of Table I. In that example, LiCoO2 was deposited on alumina utilizing a pulsed-dc process with 2 kW of power and 100 W of bias with an argon flow of 60 sccm and an oxygen flow of 20 sccm.

Figure 14A:
FIGS. 14A through 14D illustrate several anneal processes utilized with a LiCoO$_2$ film deposited according to embodiments of the present invention.
Figure 14B:
Figure 14C:
Figure 14D:

FIG. 14A shows an SEM photo of an as-deposited LiCoO$_2$ film according to the process illustrated in Example 37 of Table I. FIG. 14B shows an SEM photo of LiCoO$_2$ film according to the process illustrated in Example 37 of Table I, annealed conventionally with a two-hour 700° C. anneal. FIGS. 14C and 14D show SEM photos of a LiCoO$_2$ film according to the process illustrated in Example 37 of Table I, annealed in an RTA process at 700° C. The ramp-up and ramp-down times in the RTA process is illustrated above. FIG. 14C shows an SEM photo of a LiCoO$_2$ film after an RTA process at 700° C. for five minutes whereas FIG. 14D shows an SEM photo of a LiCoO$_2$ film after an RTA process at 700° C. for fifteen minutes. It is clear from a comparison of FIGS. 14C and 14D with FIG. 14B, that much better granularity is achieved with the low thermal-budget RTA process rather than the conventional furnace anneal. A low thermal-budget RTA process allows for deposition of such films on low temperature substrates.

Figure 15A:
FIGS. 15A and 15B illustrate the effects of ramp-time in a rapid thermal anneal of LiCoO$_2$ films deposited according to the present invention.
Figure 15B:
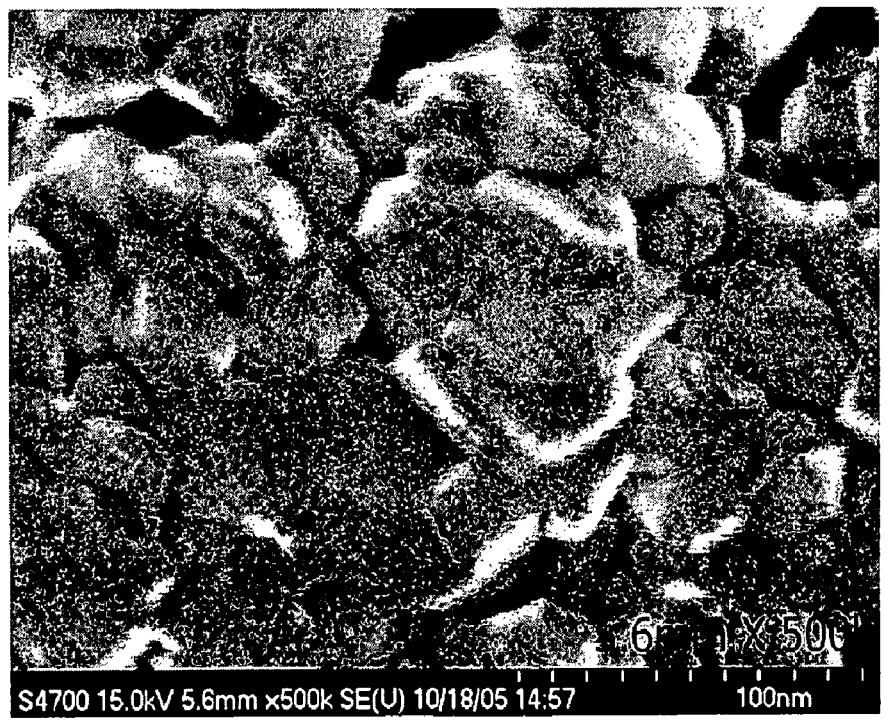

FIGS. 15A and 15B show SEM photos of a LiCoO$_2$ film that was annealed in an RTA process utilizing two different ramp-up times, illustrating the effects of the ramp time in the RTA process. A LiCoO$_2$ film was deposited on an alumina substrate according to the process described as Example 51 in Table I. The film shown in FIG. 15A was annealed with a 45 sec ramp-up time (i.e., room temperature to 700° C. in 45 sec). The film shown in FIG. 15B was annealed with a 240 sec ramp-up time. Both films were held at 700° C. for five minutes. As shown in a comparison between FIGS. 15A and 15B, it is clear that a short anneal ramp-up times yield better granularity than longer ramp-up times.

Figure 17:
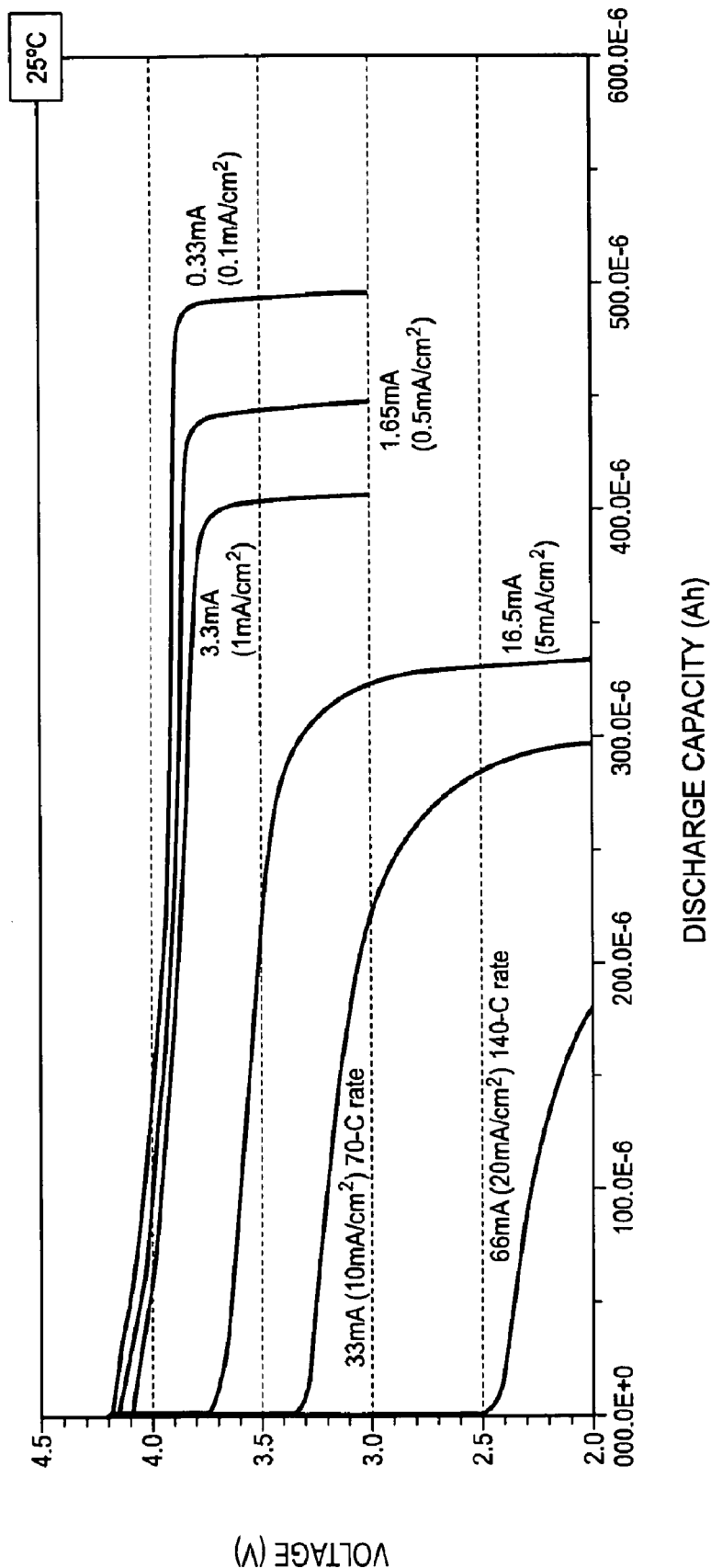
FIG. 17 illustrates battery charge and discharge profiles of a battery formed utilizing a LiCoO$_2$ film according to some embodiments of the present invention.

FIG. 17 illustrates battery charge and discharge profiles of a battery structure formed utilizing LiCoO$_2$ films according to embodiments of the present invention. The LiCoO$_2$ film in the battery profiled in FIG. 17 was deposited according to Example 54 in Table I. The LiCoO$_2$ film was deposited on an alumina substrate with a gold current collector. The LiCoO$_2$ film was annealed utilizing a fast-ramp (45 sec) RTA process as was described above. A 1.5 µm LiPON layer was then deposited with a standard RF deposition process without bias in a modified AKT reactor. A lithium anode and a nickel current collector were then deposited. Data was taken at 0.33 mA, 1.65 mA, 3.3 mA, 16.5 mA, 33 mA, and 66 mA. As observed, the battery was capable of storing an exceptional 25 mA/cm$^2$ at voltages greater than 2.0 V.

One skilled in the art will recognize variations and modifications of the examples specifically discussed in this disclosure. These variations and modifications are intended to be within the scope and spirit of this disclosure. As such, the scope is limited only by the following claims.

TABLE I

| Example # | Target Power (kW) | Bias Power (W) | Reverse Time (μs) | Frequency (kHz) | Ar (sccm) | O₂ (sccm) | Initial Substrate Temperature (temperature during deposit) (° C.) | Deposition Time (sec) | Film Thickness (μm) |
|---|---|---|---|---|---|---|---|---|---|
| 1 | 2 | 0 | 1.6 | 250 | 80 | 0 | 30 | 10000 | 3.9 |
| 2 | 2 | 0 | | 250 | 72 | 8 | 30 | 7200 | 1.7 |
| 3 | 2 | 100 | | 250 | 72 | 8 | 30 | 7200 | 1.34 |
| 4 | 2 | 100 | | 250 | 76 | 4 | 30 | 7200 | 1.57 |
| 5 | 2 | 100 | | 250 | 76 | 4 | 200 | 7200 | 1.3 |
| 6 | 2 | 100 | | 250 | 74 | 6 | 200 | 7200 | 1.3 |
| 7 | 2 | 0 | | 300 | 72 | 8 | 30 | 7200 | 1.58 |
| 8 | 2 | 0 | | 300 | 74 | 6 | 30 | 7200 | |
| 9 | 2 | 100 | | 300 | 74 | 6 | 30 | 7200 | |
| 10 | 2 | 100 | | 300 | 72 | 8 | 30 | 7200 | |
| 11 | 2 | 100 | | 300 | 70 | 10 | 30 | 7200 | |
| 12 | 2 | 0 | | 300 | 70 | 10 | 30 | 7200 | |
| 13 | 2 | 0 | | 300 | 72 | 8 | 30 | 7200 | 1.58 |
| 14 | 2 | 0 | | 300 | 74 | 6 | 30 | 7200 | |
| 15 | 2 | 0 | | 300 | 60 | 20 | 30 | 7200 | |
| 16 | 2 | 0 | | 300 | 50 | 30 | 30 | 7200 | |
| 17 | 2 | 200 | | 300 | 60 | 20 | 30 | 7200 | |
| 18 | 2 | 50 | | 300 | 60 | 20 | 30 | 7200 | |
| 19 | 2 | 0 | | 300 | 70 | 10 | 30 | 7200 | |
| 20 | 2 | 0 | | 300 | 65 | 15 | 30 | 7200 | |
| 21 | 3 | 0 | | 300 | 65 | 15 | 30 | 7200 | |
| 22 | 2 | 0 | 1.6 | 250 | 60 | 20 | 30 | 7200 | |
| 23 | 3 | 0 | 1.6 | 250 | 60 | 20 | 30 | 7200 | |
| 24 | 2 | 0 | 1.6 | 250 | 60 | 20 | 30 (NPH) | 7200 | |
| 25 | 2 | 0 | 1.6 | 250 | 60 | 20 | 10 min heat 30 min coc | 7200 | |
| 26 | 2 | 0 | 1.6 | 250 | 60 | 20 | no preheat | 9000 | |
| 27 | 2 | 0 | | 300 | 60 | 20 | no preheat | 7200 | |
| 28 | 2 | 0 | | 300 | 60 | 20 | 15 min heat, 10 min | 7200 | |
| 29 | 2 | 0 | | 250 | 60 | 20 | no preheat | | |
| 30 | 2 | 0 | | 250 | 60 | 20 | 10 min, 10 min | | |
| 31 | 2 | 0 | 1.3 | 300 | 60 | 20 | 30 (220) | 7200 | 4.81 |
| 32 | 2 | 0 | 1.3 | 300 | 60 | 20 | 30 (220) | 7200 | 4.74 |
| 33 | 2 | 0 | 1.3 | 300 | 22.5 | 7.5 | 30 (220) | 7200 | 3.99 |
| 34 | 2 | 0 | 1.3 | 300 | 22.5 | 7.5 | 30 (220) | 7200 | 3.93 |
| 35 | 2 | 0 | 1.3 | 300 | 37.5 | 12.5 | 30 (220) | 7200 | 3.64 |
| 36 | 2 | 0 | 1.3 | 300 | 37.5 | 12.5 | 30 (220) | 7200 | 3.54 |
| 37 | 2 | 100 | 1.3 | 300 | 60 | 20 | 30 (220) | 7200 | 4.54 |
| 38 | 2 | 200 | 1.3 | 300 | 60 | 20 | 30 (220) | 7200 | 4.84 |
| 39 | 2 | 100 | 1.3 | 300 | 37.5 | 12.5 | 30 (220) | 7200 | 4.30 |
| 40 | 2 | 100 | 1.3 | 300 | 22.5 | 7.5 | 30 (220) | 7200 | 3.77 |
| 41 | 2 | 200 | 1.3 | 300 | 37.5 | 12.5 | 30 (220) | 7200 | 3.92 |
| 42 | 2 | 200 | 1.3 | 300 | 60 | 20 | 400 | 7200 | 3.77 |
| 43 | 2 | 0 | 1.3 | 300 | 22.5 | 7.5 | 30 (220) | 7200 | 3.24 |
| 44 | 2 | 0 | 1.3 | 300 | 60 | 20 | 30 (220) | 7200 | 3.88 |
| 45 | 2 | 0 | 1.3 | 300 | 60 | 20 | 30 (220) | 3600 | 1.78 |
| 46 | 2 | 200 | 1.3 | 300 | 60 | 20 | 30 (220) | 3600 | 1.87 |
| 47 | 2 | 200 | 1.3 | 300 | 22.5 | 7.5 | 30 (220) | 3600 | 1.52 |
| 48 | 2 | 0 | 1.3 | 300 | 60 | 20 | 30 (220) | 6000 | 1.12 |
| 49 | 2 | 0 | 1.3 | 300 | 60 | 20 | 30 (220) | 10800 | 1.89 |
| 50 | 2 | 0 | 1.3 | 300 | 60 | 20 | 30 (220) | 14400 | 2.52 |
| 51 | 2 | 100 | 1.3 | 300 | 60 | 20 | 30 (220) | 10000 | 1.57 |
| 52 | 2 | 100 | 1.3 | 300 | 60 | 20 | 30 (220) | 10000 | 2.11 |
| 53 | 2 | 100 | 1.3 | 300 | 60 | 20 | 30 (220) | 6000 | 2.70 |
| 54 | 2 | 100 | 1.3 | 300 | 60 | 20 | 30 (220) | 6000 | 2.70 |

TABLE II

| Example # | Phase | Lattice | Texture | $d_{101}$ [Å] | 2θ [°] | crystallite size [Å] |
|---|---|---|---|---|---|---|
| 15 | LiCoO$_2$ | rhombohedral | strong (101) | 2.376(1) | 37.83 | ~1300 |
| 16 | LiCoO$_2$ | Rhombohedral | strong (101) | 2.375(1) | 37.85 | ~750 |
| 17 | Co | cubic | random | — | — | <50 |
| 18 | Co | cubic | random | — | — | <50 |
| 19 | LiCoO$_2$ | rhombohedral | strong (101) | 2.370(1) | 37.93 | ~1400 |
| 20 | LiCoO$_2$ | rhombohedral | strong (101) | 2.372(1) | 37.90 | ~1500 |
| 21 | LiCoO$_2$ | rhombohedral | strong (101) | 2.370(1) | 37.92 | ~1700 |
| PDF | LiCoO$_2$ | Rhombohedral | random | 2.408(1) | 37.31 | — |

What is claimed is:

1. A method of depositing a LiCoO$_2$ layer, comprising:
   placing a substrate in a reactor;
   flowing at least an inert gas through the reactor;
   applying pulsed DC power to a sputter target comprising LiCoO$_2$;
   positioning said target opposite said substrate;
   forming a layer of LiCoO$_2$ over said substrate; and
   applying rapid thermal annealing to said substrate and LiCoO$_2$ layer to a temperature of less than about 700° C. for a period of time of less than about 10 minutes.

2. The method of claim 1, wherein said rapid thermal annealing step is performed at a sufficiently low temperature in conjunction with a sufficiently short period of time thus providing a sufficiently low thermal budget, which is applied to low temperature substrate material without melting it.

3. The method of claim 1, wherein said substrate comprises, at least in part, a material selected from the group of silicon, polymers, glasses, ceramics, stainless steel, and metals.

4. The method of claim 1, further comprising depositing a platinum layer on said substrate.

5. The method of claim 1, further comprising depositing an electrically conducting layer on the substrate.

6. The method of claim 1, further comprising applying a RF bias to said substrate while applying pulsed DC power to said sputter target.

7. The method of claim 1, wherein said LiCoO$_2$ layer comprises, at least in part, a crystalline structure.

8. The method of claim 1, wherein said LiCoO$_2$ layer comprises, at least in part, a crystalline structure and a preferred crystallographic orientation in the (101) plane.

9. The method of claim 1, wherein said LiCoO$_2$ layer comprises, at least in part, a crystalline structure and a preferred crystallographic orientation in the (003) plane.

10. The method of claim 1, wherein said LiCoO$_2$ layer comprises a grain size of between about 500 Å and about 3000 Å.

11. The method of claim 1, further comprising preheating said substrate to a temperature of up to about 200° C. prior to depositing said LiCoO$_2$ layer.

12. The method of claim 1, further comprising preheating said substrate prior to depositing said LiCoO$_2$ layer; said depositing of LiCoO$_2$ occurring without applying active substrate heating.

13. The method of claim 1, further comprising depositing an oxide layer on said substrate.

14. The method of claim 13, wherein said oxide layer comprises a silicon dioxide layer.

15. The method of claim 1, further comprising depositing said LiCoO$_2$ layer at a rate greater than about 1 µm per hour.

16. The method of claim 1 wherein said sputter target comprises a ceramic LiCoO$_2$ sputter target with a resistance measured across about 4 cm of its surface of less than about 500 kΩ.

17. A method of depositing a lithium metal oxide layer, comprising:
   placing a substrate in a reactor;
   flowing at least an inert gas through the reactor;
   applying pulsed DC power to a sputter target comprising lithium metal oxide;
   positioning said target opposite said substrate;
   forming a layer of said lithium metal oxide over said substrate; and
   applying rapid thermal annealing to said substrate and lithium metal oxide layer to a temperature of less than about 700° C. for a period of time of less than about 10 minutes.

18. The method of claim 17, wherein said rapid thermal annealing step is performed at a sufficiently low temperature in conjunction with a sufficiently short period of time thus providing a sufficiently low thermal budget, which is applied to low temperature substrate material without melting it.

19. The method of claim 17, wherein said substrate comprises, at least in part, a material selected from the group of silicon, polymers, glasses, ceramics, stainless steel, and metals.

20. The method of claim 17, further comprising depositing a platinum layer on said substrate.

21. The method of claim 17, further comprising depositing an electrically-conducting layer on the substrate.

22. The method of claim 17, further comprising applying a RF bias to said substrate while applying pulsed DC power to said sputter target.

23. The method of claim 17, wherein said lithium metal oxide layer comprises, at least in part, a crystalline structure.

24. The method of claim 17, wherein said lithium metal oxide layer comprises, at least in part, a crystalline structure and a preferred crystallographic orientation in the (101) plane.

25. The method of claim 17, wherein said lithium metal oxide layer comprises, at least in part, a crystalline structure and a preferred crystallographic orientation in the (003) plane.

26. The method of claim 17, wherein said lithium metal oxide layer comprises a grain size of between about 500 Å and about 3000 Å.

27. The method of claim 17, further comprising preheating said substrate to a temperature of up to about 200° C. prior to depositing said lithium metal oxide layer.

28. The method of claim 17, further comprising preheating said substrate prior to depositing said lithium metal oxide layer; said depositing of lithium metal oxide occurring without applying active substrate heating.

29. The method of claim 17, further comprising depositing an oxide layer on said substrate.

30. The method of claim 29, wherein said oxide layer comprises a silicon dioxide layer.

31. The method of claim 17, further comprising depositing said lithium metal oxide layer at a rate greater than about 1 µm per hour.

32. The method of claim 17, wherein said sputter target comprises a ceramic lithium metal oxide sputter target with a resistance measured across about 4 cm of its surface of less than about 500 kΩ.

* * * * *